United States Patent
Seong et al.

(10) Patent No.: US 9,659,772 B2
(45) Date of Patent: May 23, 2017

(54) SEMICONDUCTOR DEVICES AND METHODS OF MANUFACTURING THE SAME

(71) Applicants: Ho-jun Seong, Suwon-si (KR); Jee-hoon Han, Hwaseong-si (KR)

(72) Inventors: Ho-jun Seong, Suwon-si (KR); Jee-hoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/974,119

(22) Filed: Dec. 18, 2015

(65) Prior Publication Data

US 2016/0196974 A1    Jul. 7, 2016

(30) Foreign Application Priority Data

Jan. 5, 2015    (KR) .................... 10-2015-0000864

(51) Int. Cl.
| H01L 27/00 | (2006.01) |
| H01L 21/033 | (2006.01) |
| H01L 21/308 | (2006.01) |
| H01L 21/311 | (2006.01) |
| H01L 21/3213 | (2006.01) |
| H01L 27/11524 | (2017.01) |
| H01L 27/11548 | (2017.01) |
| H01L 27/1157 | (2017.01) |
| H01L 27/11575 | (2017.01) |

(52) U.S. Cl.
CPC ...... *H01L 21/0338* (2013.01); *H01L 21/0337* (2013.01); *H01L 21/3086* (2013.01); *H01L 21/31144* (2013.01); *H01L 21/32139* (2013.01); *H01L 27/11524* (2013.01); *H01L 27/11548* (2013.01); *H01L 27/1157* (2013.01); *H01L 27/11575* (2013.01)

(58) Field of Classification Search
CPC ............. H01L 21/0337; H01L 21/0338; H01L 21/3081; H01L 21/3114; H01L 21/3219; H01L 21/76802; H01L 23/528; H01L 27/11521

See application file for complete search history.

(56) References Cited

U.S. PATENT DOCUMENTS

| 7,803,709 B2 | 9/2010 | Yune |
| 8,110,340 B2 | 2/2012 | Jung |
| 8,216,949 B2 | 7/2012 | Abatchev et al. |
| 8,227,354 B2 | 7/2012 | Kim et al. |
| 8,541,306 B2 | 9/2013 | Yang et al. |
| 8,541,316 B2 | 9/2013 | Sukekawa |

(Continued)

FOREIGN PATENT DOCUMENTS

KR    1020130096540    8/2013

*Primary Examiner* — Daniel Shook
(74) *Attorney, Agent, or Firm* — Myers Bigel, P.A.

(57) ABSTRACT

Semiconductor devices and methods of manufacturing the semiconductor devices are provided. The semiconductor devices may include a first line pattern that includes a first main line having a first width and a first subline having a second width, and a second line pattern that includes a second main line having the first width and a second subline having a third width. The first line pattern may include a first width changer whose width increases from the first width to the second width. The second line pattern may include a second width changer whose width increases from the first width to the third width.

20 Claims, 122 Drawing Sheets

(56) References Cited

U.S. PATENT DOCUMENTS

| | | |
|---|---|---|
| 8,598,632 B2 | 12/2013 | Tran et al. |
| 8,785,325 B2 | 7/2014 | Sudo |
| 8,884,377 B2 | 11/2014 | Lee et al. |
| 2011/0062595 A1* | 3/2011 | Sim .................... H01L 21/0337 257/775 |
| 2014/0017889 A1 | 1/2014 | Lee et al. |
| 2015/0061132 A1 | 3/2015 | Lee et al. |

* cited by examiner

SEMICONDUCTOR DEVICES AND METHODS OF MANUFACTURING THE SAME

CROSS-REFERENCE TO RELATED APPLICATION

This application claims priority under 35 U.S.C. §119 to Korean Patent Application No. 10-2015-0000864, filed on Jan. 5, 2015, in the Korean Intellectual Property Office, the disclosure of which is incorporated herein by reference in its entirety.

BACKGROUND

The inventive concept relates to a semiconductor device and a method of manufacturing the same, and more particularly, to a semiconductor device including a plurality of line patterns having relatively small widths and relatively tight pitches and a method of manufacturing the semiconductor device.

In order to manufacture a highly integrated semiconductor device, a pattern may have to be miniaturized. In order to integrate many devices into a small area, each device may have to be as small as possible. To this end, pitches that are obtained by adding widths of patterns to be formed to gaps between the patterns may have to be reduced. As design rules for a semiconductor device have greatly decreased, there may be a limitation in forming a pattern having a fine pitch due to a resolution limit of photolithography. Accordingly, there may be a demand for a technology of forming a fine pattern within a resolution limit of photolithography. Also, there may be a demand for a semiconductor device having a new arrangement structure using the technology.

SUMMARY

The inventive concept provides semiconductors device having an arrangement in which high-density patterns having relatively small widths and relatively tight pitches may be formed to have various widths by using patterns having sizes within a resolution limit of photolithography.

The inventive concept also provides methods of manufacturing a semiconductor device which may form high-density patterns having relatively small widths and relatively tight pitches to have various widths by using patterns having sizes within a resolution limit of photolithography and may secure a sufficient process margin when the high-density patterns are formed.

According to some embodiments of the inventive concept, semiconductor devices may include a first line pattern including a first main line that extends in a first direction and has a first width and a first subline that extends in a second direction from one end of the first main line and has a second width that is greater than the first width. The semiconductor devices may also include a second line pattern including a second main line that is parallel to the first main line and has the first width and a second subline that extends parallel to the first subline from one end of the second main line and has a third width that is greater than the first width. The first line pattern may include a first width changer that is disposed between the first main line and the first subline and whose width increases from the first width to the second width, and the second line pattern may include a second width changer that is included in the second main line and whose width increases from the first width to the third width in a longitudinal direction of the second main line.

According to some embodiments of the inventive concept, semiconductor devices may include a plurality of line patterns that are spaced apart from one another. Each of the plurality of line patterns may include a main line that extends in a first direction and a subline that extends in a second direction from one end of the main line. The plurality of line patterns may include a plurality of sets of line patterns, each of which includes four line patterns that are disposed directly adjacent one another. At least one set of the plurality of sets of line patterns may include a first line pattern including a first main line that extends in the first direction and has a first width and a first subline that extends in the second direction from one end of the first main line and has a second width that is greater than the first width and a second line pattern including a second main line that is parallel to the first main line and has the first width and a second subline that is parallel to the first subline and has a third width that is greater than the first width. The first line pattern may include a first width changer that is disposed between the first main line and the first subline and whose width increases from the first width to the second width, and the second line pattern may include a second width changer that is included in the second main line and whose width increases from the first width to the third width in a longitudinal direction of the second main line.

According to some embodiments of the inventive concept, methods of manufacturing a semiconductor device may include forming a feature layer on a substrate that includes a first area and a second area and forming a plurality of structures on the feature layer. The plurality of structures may extend parallel to one another from the first area to the second area and are spaced apart from one another so that a first distance between two adjacent ones of the plurality of structures in the first area is greater than a second distance between the two adjacent ones of the plurality of structures in the second area. The methods may also include forming a plurality of single spacers including first portions of spacers on a plurality of first inner sidewalls of the plurality of structures that face a space between the plurality of structures in the first area and concurrently forming a plurality of double spacers on a plurality of first outer sidewalls of the plurality of structures that face a space having a width greater than the first gap in the first area and on a plurality of second inner sidewalls and a plurality of second outer sidewalls of the plurality of structures that face a space having a width greater than the first distance in the second area. The plurality of double spacers may include second portions of the spacers and additional spacers that cover the second portions of the spacers. The methods may further include removing the plurality of structures and etching the feature layer by using the plurality of single spacers and the plurality of double spacers as etching masks in the first area and the second area.

According to some embodiments of the inventive concept, methods of manufacturing a semiconductor device may include forming a feature layer on a substrate that includes a first area and a second area, forming a hardmask layer on the feature layer and forming a reference structure on the hardmask layer. The reference structure may extend from the first area to the second area so that a first structural portion of the reference structure that is formed on the first area has a first width and a second structural portion of the reference structure that is formed on the second area has a second width that is greater than the first width. The methods may also include forming a first spacer that covers a sidewall of the reference structure, removing the reference structure to expose both sidewalls of the first spacer and a top surface of the hardmask layer, forming a hardmask pattern by etching the hardmask layer by using the first spacer as an etching mask, forming a single spacer including a first portion of a second spacer in one pair of first inner sidewalls of the hardmask pattern that face each other and spaced apart from each other by the first width on the first area, concurrently forming a plurality of double spacers including a second portion of the second spacer and an additional spacer that covers the second portion on a first outer sidewall of the hardmask pattern that faces a space having a width greater than the first width in the first area and on a second inner sidewall and a second outer sidewall of the hardmask pattern that faces a space having a width greater than the first width in the second area, removing the hardmask pattern and etching the feature layer by using the single spacer and the plurality of double spacers as etching masks in the first area and the second area.

According to some embodiments of the inventive concept, methods of manufacturing a semiconductor device may include forming a feature layer on a substrate that includes a first area and a second area, forming a hardmask layer on the feature layer and forming a plurality of reference structures on the hardmask layer. The plurality of reference structures may extend parallel to one another from the first area to the second area and are spaced apart from one another so that a first structural portion of ones of the plurality of reference structures that is formed on the first area has a first width and a second structural portion of the ones of the plurality of reference structures that is formed on the second area has a second width that is greater than the first width. The methods may also include forming a plurality of first spacers that cover sidewalls of the plurality of reference structures in the first area and the second area, removing the plurality of reference structures to expose both sidewalls of the plurality of first spacers and a top surface of the hardmask layer on the first area and the second area, forming a plurality of hardmask patterns by etching the hardmask layer by using the plurality of first spacers as etching masks, forming a plurality of single spacers including first portions of second spacers on one pair of inner sidewalls of the plurality of first spacers that face each other and are spaced apart from each other by the first width in the first area, concurrently forming a plurality of double spacers including second portions of the second spacers and additional spacers that cover the second portions on first outer sidewalls of the plurality of first spacers that face a space having a width greater than the first width in the first area and on second inner sidewalls and second outer sidewalls of the plurality of first spacers that face a space having a width greater than the first width in the second area, removing the plurality of hardmask patterns and etching the feature layer by using the plurality of single spacers and the plurality of double spacers as etching masks in the first area and the second area.

According to some embodiments of the inventive concept, semiconductor devices may include a first line pattern including a first portion extending in a first direction and a second portion extending in a second direction that is different from the first direction. The first portion may have a first width and the second portion may have a second width that is greater than the first width. The semiconductor devices may also include a second line pattern including a third portion extending in the first direction with the first width, a fourth portion extending in the second direction with a third width that is greater than the first width and a fifth portion between the third portion and the fourth portion. The fifth portion may have a change in width from the first width to the third width and an interface between the third portion and the fifth portion may be at a location where the first line pattern terminates in the first direction.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1A:
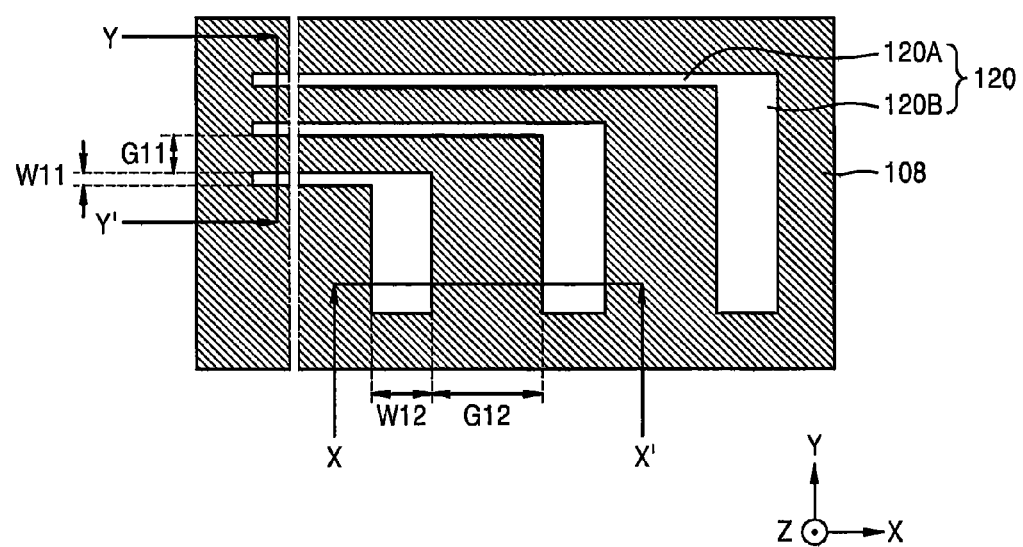
FIGS. 1A, 2A, 3A, 4A, 5A, 6A, 7A, 8A and 9A are plan views illustrating a method of manufacturing a semiconductor device according to some embodiments of the inventive concept.

As used herein, the term "and/or" includes any and all combinations of one or more of the associated listed items. Expressions such as "at least one of" when preceding a list of elements, modify the entire list of elements and do not modify the individual elements of the list.

The inventive concept will now be described more fully with reference to the accompanying drawings, in which example embodiments of the inventive concept are shown. In the drawings, the same elements are denoted by the same reference numerals and a repeated explanation thereof will not be given.

The inventive concept may, however, be embodied in many different forms and should not be construed as being limited to the embodiments set forth herein; rather these embodiments are provided so that this disclosure will be thorough and complete and will fully convey the concept of the inventive concept to one of ordinary skill in the art.

It will be understood that, although the terms first, second, third etc. may be used herein to describe various members, regions, layers, portions, and/or elements, these members, regions, layers, portions, and/or elements should not be limited by these terms. These terms are only used to distinguish one member, region, layer, portion, or element from another member, region, layer, portion, or element. Thus, a first member, region, layer, portion, or element discussed below could be termed a second member, region, layer, portion, or element without departing from the teachings of example embodiments. For example, a first element may be referred to as a second element, and likewise, a second element may be referred to as a first element without departing from the scope of the inventive concept.

It will be understood that when an element is referred to as being "coupled," "connected," or "adjacent" or "on" another element, it can be directly coupled, connected, adjacent or on the other element, or intervening elements may also be present. In contrast, when an element is referred to as being "directly coupled," "directly connected," "directly adjacent" or "directly on" another element, there are no intervening elements present.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein.

It will be understood that "side wall" and "sidewall" may be used interchangeably to refer to the same portion.

An order of processes may be different in different embodiments. For example, two processes which are described as being continuously performed may be simultaneously or concurrently performed or may be performed in a reverse order. It will be understood that "forming concurrently" refers to forming in a same process step, at approximately (but not necessarily exactly) the same time.

As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Figure 7A:
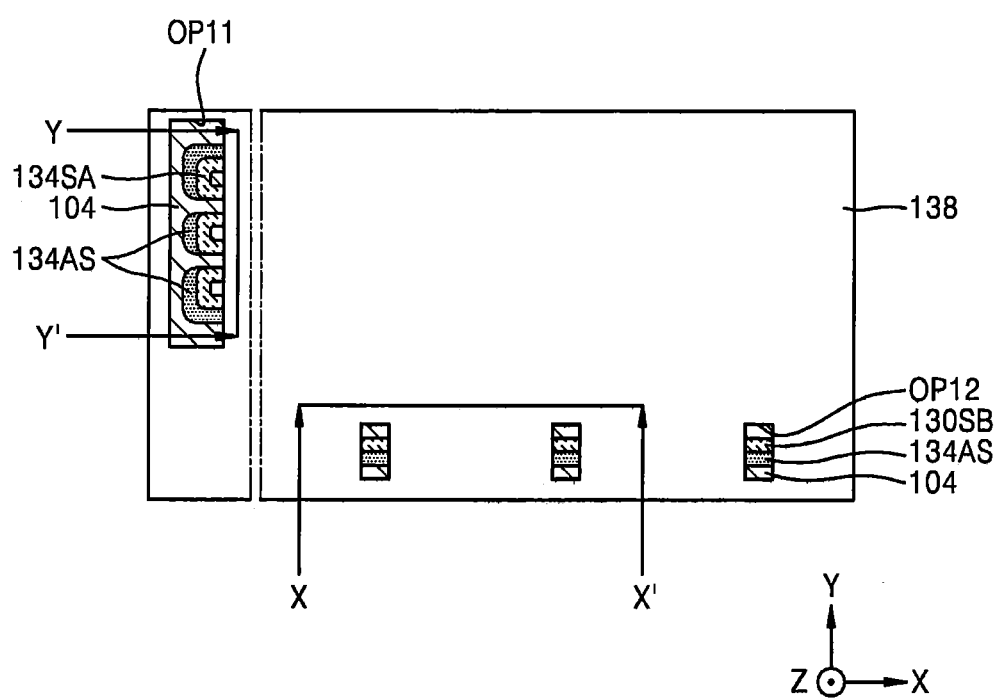
Figure 7B:
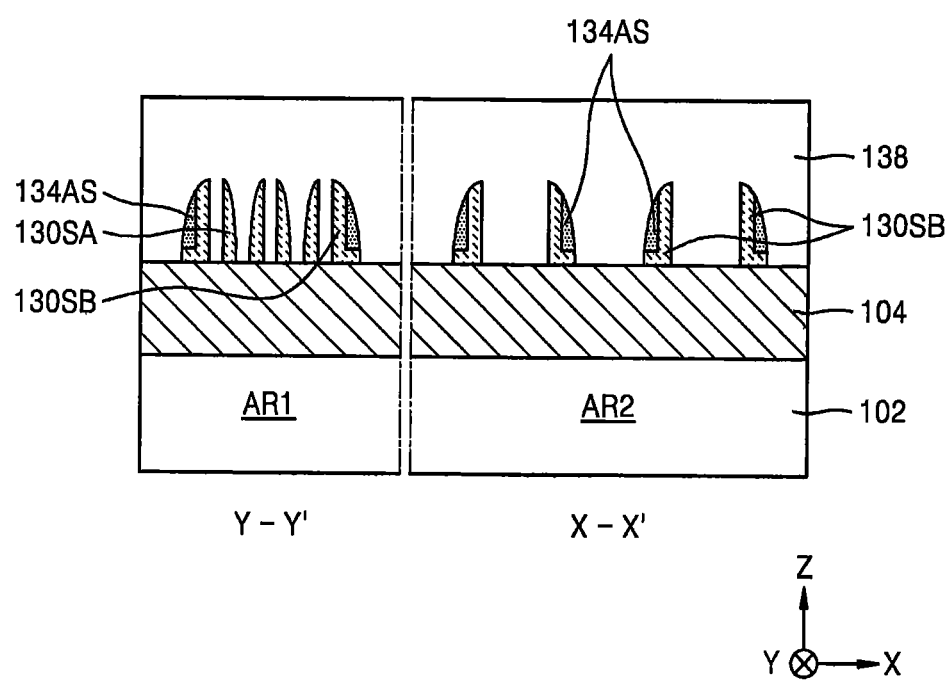
Figure 8A:
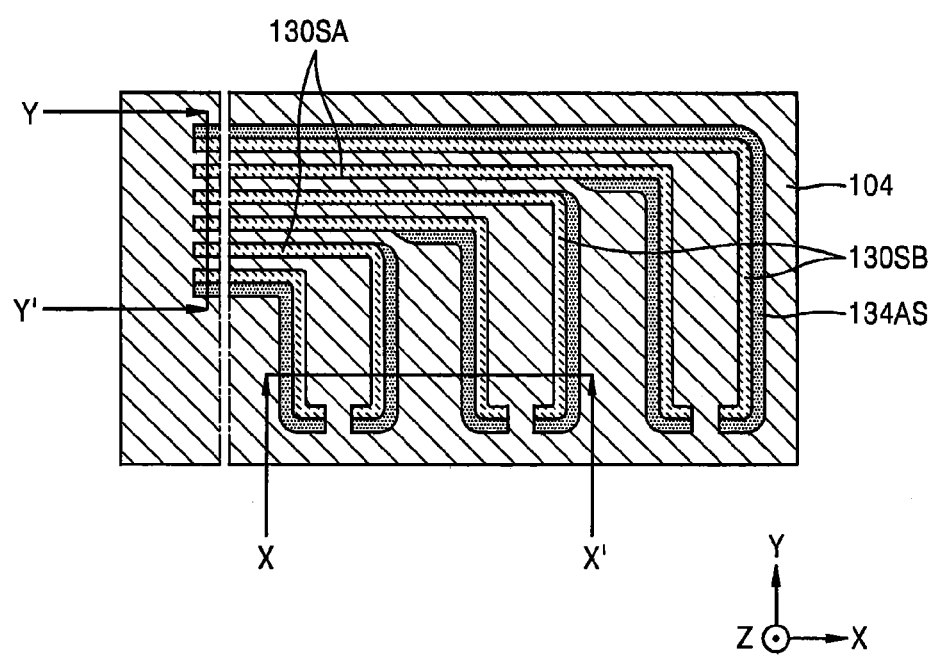
Figure 8B:
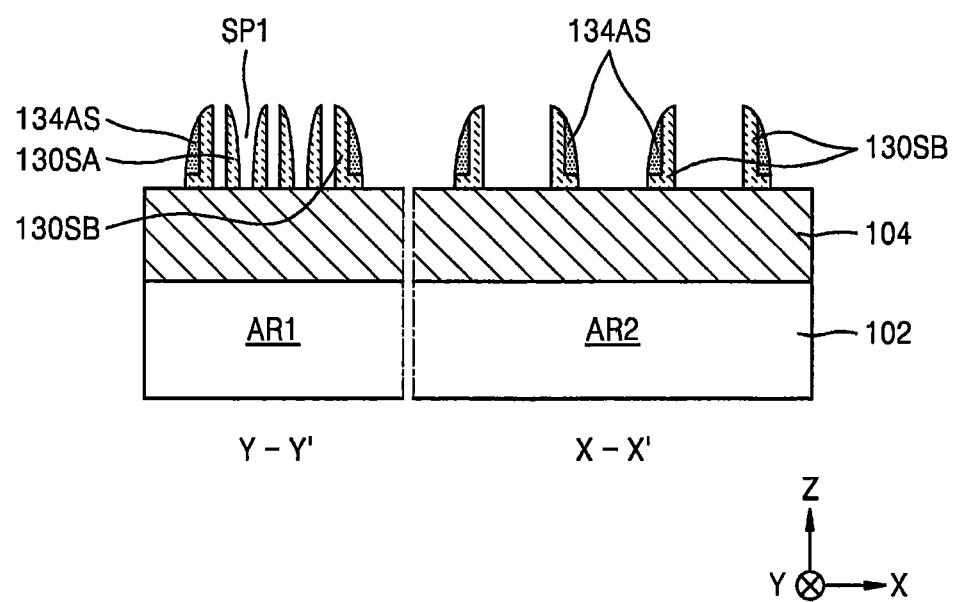
Figure 9A:
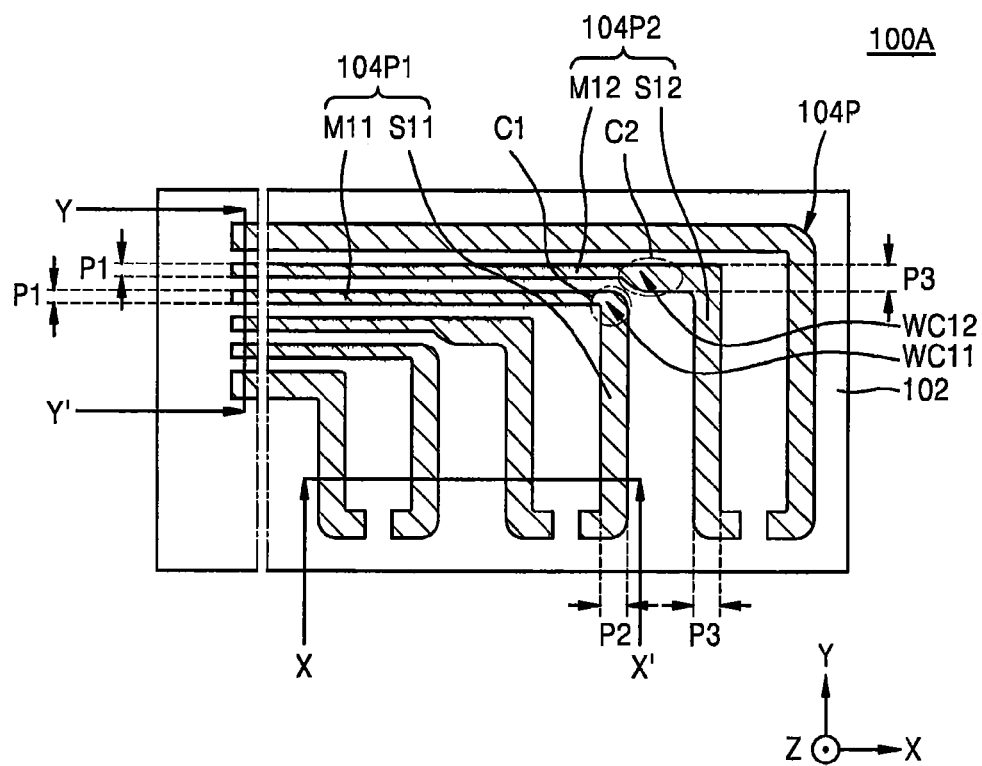
Figure 9B:
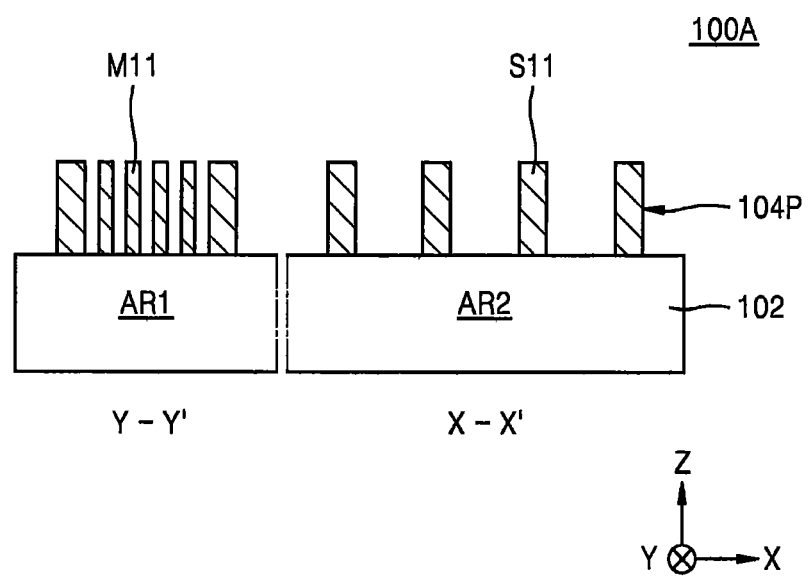

FIGS. 1A, 2A, 3A, 4A, 5A, 6A, 7A, 8A and 9A are plan views illustrating a method of manufacturing a semiconductor device 100A in FIGS. 9A and 9B according to some embodiments of the inventive concept, and FIGS. 1B, 2B, 3B, 4B, 5B, 6B, 7B, 8B and 9B are cross-sectional views taken along the lines X-X' and Y-Y' of FIGS. 1A, 2A, 3A, 4A, 5A, 6A, 7A, 8A and 9A.

Figure 1B:
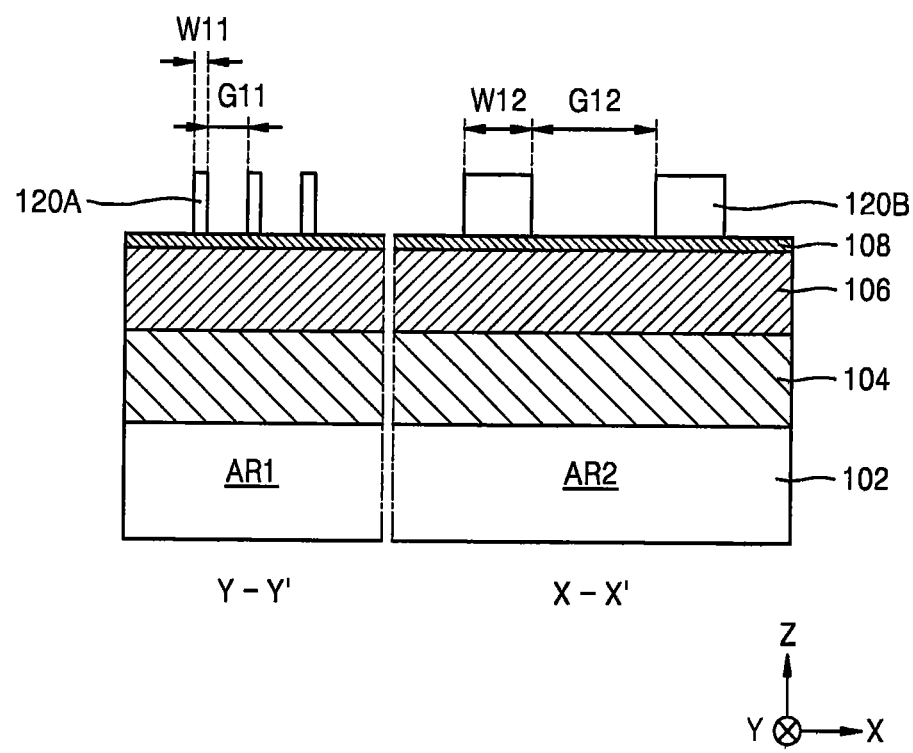
FIGS. 1B, 2B, 3B, 4B, 5B, 6B, 7B, 8B and 9B are cross-sectional views taken along the lines X-X' and Y-Y' of FIGS. 1A, 2A, 3A, 4A, 5A, 6A, 7A, 8A and 9A.

Referring to FIGS. 1A and 1B, a feature layer 104, a first hardmask layer 106, and a second hardmask layer 108 are sequentially formed on a substrate 102, and a plurality of mask patterns 120 are formed on the second hardmask layer 108.

The substrate 102 may be a semiconductor substrate. In some embodiments, the substrate 102 may be formed of a semiconductor material such as silicon (Si) or germanium (Ge). In some embodiments, the substrate 102 may include a compound semiconductor such as SiGe, SiC, GaAs, InAs, or InP. In some embodiments, the substrate 102 may have a silicon-on-insulator (SOI) structure. The substrate 102 may include a conductive region, for example, a well doped with impurities or a structure doped with impurities. Also, the substrate 102 may include device isolation structures such as a shallow trench isolation (STI) structure.

The substrate 102 includes a first area AR1 in which patterns are formed at a relatively high density and a second area AR2 in which patterns are formed at a relatively low density.

The feature layer 104 may be formed of various materials. The feature layer 104 may constitute an active region or another region of the substrate 102, for example, a semiconductor substrate. Alternatively, the feature layer 104 may be a conductive film or an insulating film that is formed on the substrate 102, and may be formed of, for example, a metal, a semiconductor, or an insulating material. The feature layer 104 may constitute a mask layer that is used to define a pattern on the substrate 102 or a material layer (not shown). In some embodiments, the feature layer 104 may be formed of a silicon oxide film, a silicon nitride film, or a combination thereof. In some embodiments, the feature layer 104 may be formed of, but is not limited to, a metal, an alloy, a metal carbide, a metal nitride, a metal oxynitride, a metal oxycarbide, a semiconductor material, polysilicon, oxide, nitride, oxynitride, a hydrocarbon compound, or a combination thereof.

The first hardmask layer 106 may be formed of a material having an etch selectivity with respect to the feature layer 104 and a spacer layer 130 that will be described below with reference to FIGS. 3A and 3B in a subsequent process. In some embodiments, the first hardmask layer 106 may be formed of, but is not limited to, a carbon-containing film, a silicon nitride film, a silicon oxide film, or a polysilicon film. For example, the first hardmask layer 106 may be formed of a spin-on hardmask (SOH) material. In some embodiments, the SOH material may be formed of a hydrocarbon compound having a relatively high carbon content ranging from about 85 weight % to about 99 weight % based on a total weight of the SOH material or a derivative of the hydrocarbon compound. However, according to the inventive concept, a material of the first hardmask layer 106 is not limited thereto.

Figure 3A:
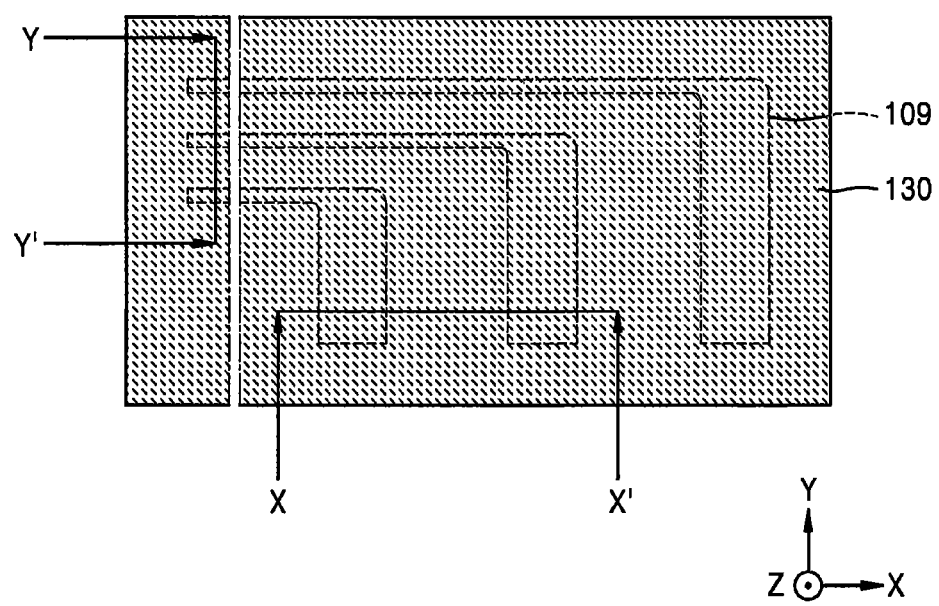
Figure 3B:
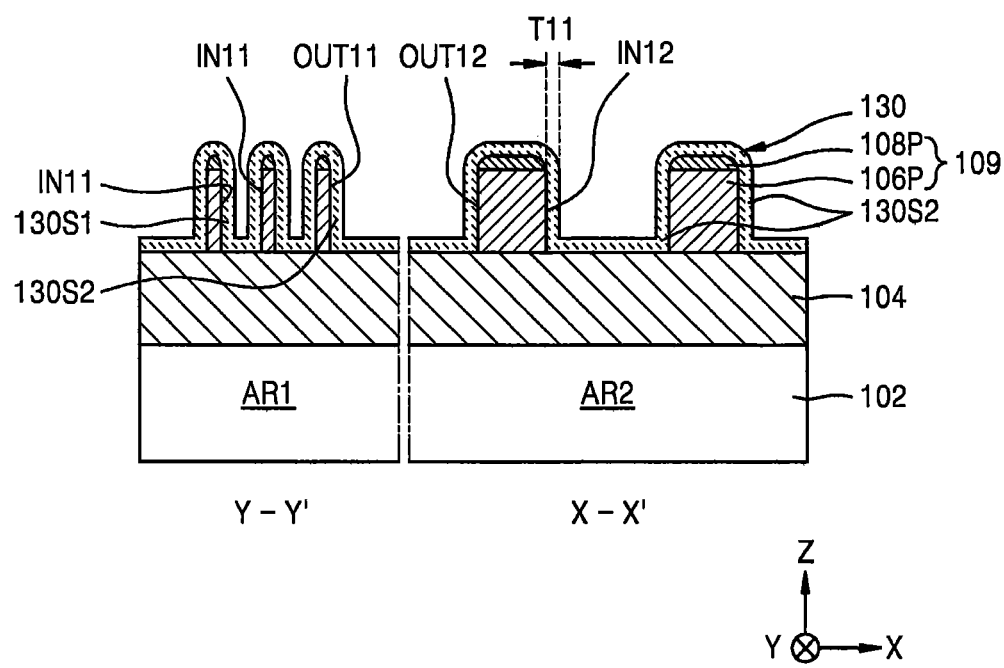

The second hardmask layer 108 may be formed of a material having an etch selectivity with respect to the feature layer 104, the first hardmask layer 106 and the spacer layer 130 of FIGS. 3A and 3B in a subsequent process. In some embodiments, when the first hardmask layer 106 is formed of an SOH material, the second hardmask layer 108 may be formed of silicon oxynitride.

The plurality of mask patterns 120 may be photoresist patterns.

Each of the plurality of mask patterns 120 continuously extends from the first area AR1 to the second area AR2 of the substrate 102. The plurality of mask patterns 120 extend parallel to one another and are spaced apart from one another. A distance between the plurality of mask patterns 120 may be a first gap G11 in the first area AR1 and may be a second gap G12, which is greater than the first gap G11, in the second area AR2.

Each of the plurality of mask patterns 120 may include a first line portion 120A that extends in a first direction (X direction) in the first area AR1, and a second line portion 120B that extends in a second direction (Y direction) from one end of the first line portion 120A and is disposed in the second area AR2. The first line portion 120A may be formed to have a first width W11 along a longitudinal direction of the first line portion 120A. The second line portion 120B may be formed to have a second width W12 that is greater than the first width W11.

In some embodiments, the first width W11 may be 1 F that is a minimum feature size of a semiconductor device 100A of FIGS. 9A and 9B, and the second width W12 may be greater than 1 F. For example, the second width W12 may be 3 F. In some embodiments, the first width W11 may range from several nanometers (nm) to tens of nm.

The first gap G11 between the plurality of first line portions 120A and the second gap G12 between the plurality of second line portions 120B may be greater than the first width W11 of the first line portion 120A. For example, the first gap G11 may be, but is not limited to, 3 F and the second gap G12 may be, but is not limited to, at least 5 F.

Figure 2A:
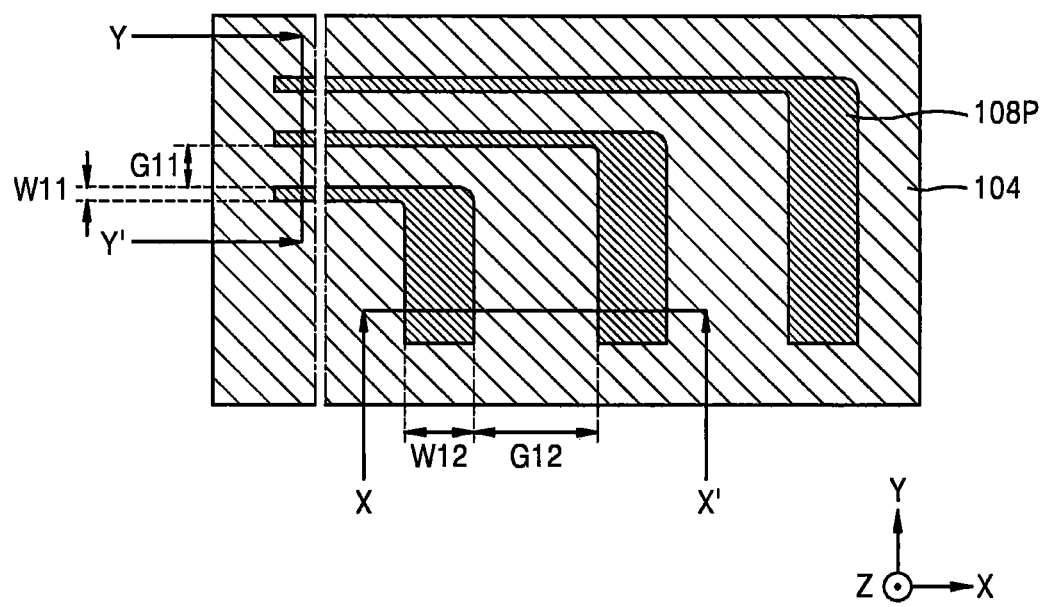
Figure 2B:
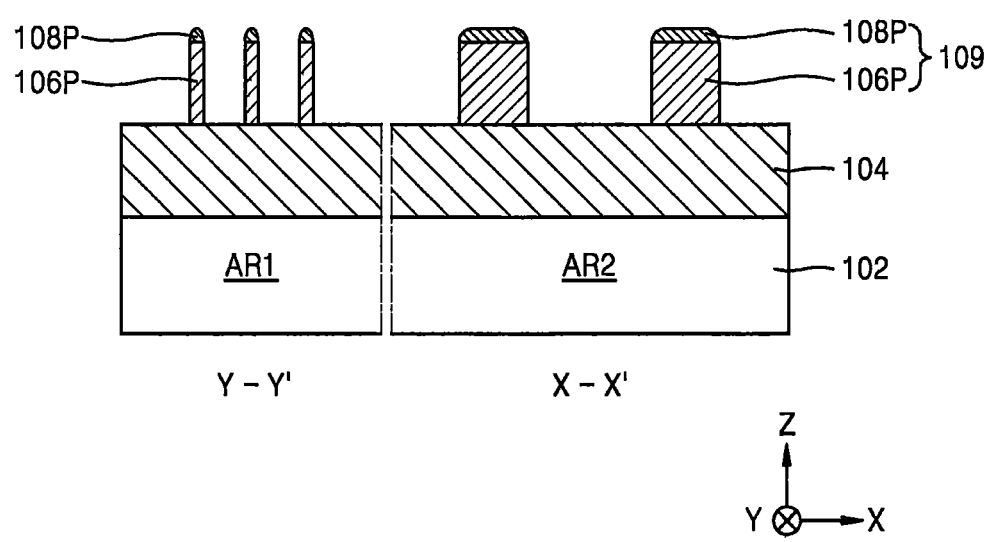

Referring to FIGS. 2A and 2B, a plurality of first hardmask patterns 106P and a plurality of second hardmask patterns 108P are formed by sequentially etching the second hardmask layer 108 and the first hardmask layer 106 by using the plurality of mask patterns 120 as etching masks.

Each of the plurality of first hardmask patterns 106P and the plurality of second hardmask patterns 108P continuously extends from the first area AR1 to the second area AR2. The plurality of first hardmask patterns 106P and the plurality of second hardmask patterns 108P may constitute a plurality of structures 109 that extend parallel to one another and are spaced apart from one another. The plurality of structures 109 including the first hardmask patterns 106P and the second hardmask patterns 108P may have the first width W11 in the first area AR1 and may have the second width W12 in the second area AR2. A distance between the plurality of structures 109 may be the first gap G11 in the first area AR1 and may be the second gap G12, which is greater than the first gap G11, in the second area AR2.

Referring to FIGS. 3A and 3B, the spacer layer 130 that covers side walls and top surfaces of the plurality of structures 109 is formed on a resultant structure including the plurality of structures 109 that include the first hardmask patterns 106P and the second hardmask patterns 108P.

The spacer layer 130 may cover the side walls of the plurality of structures 109 and a top surface of the feature layer 104 with a uniform thickness.

The spacer layer 130 includes a first portion 130S1 that covers side walls of the plurality of structures 109 that face a relatively narrow space, for example, a space having a gap that is equal or similar to the first gap G11, and a second portion 130S2 that covers side walls of the plurality of structures 109 that face a relatively wide space, for example, a space having a gap greater than the first gap G11.

A plurality of first inner side walls IN11 of the plurality of structures 109 that face a space between the plurality of structures 109 in the first area AR1 may be covered by the first portion 130S1 of the spacer layer 130. A first outer side wall OUT11 that is a outer sidewall of an outermost structure 109 among the plurality of structures 109 in the first area AR1 and a plurality of second inner side walls IN12 and a plurality of second outer side walls OUT12 of the plurality of structures 109 that face a space having a width greater than the first gap G11 in the second area AR2 may be covered by the second portion 130S2 of the spacer layer 130.

In some embodiments, the spacer layer 130 may be formed to have a thickness T11 that is substantially the same as the first width W11 (see FIGS. 1A and 2A). In same embodiments, the spacer layer 130 may be formed of a silicon oxide film by using an atomic layer deposition (ALD) process.

Figure 4A:
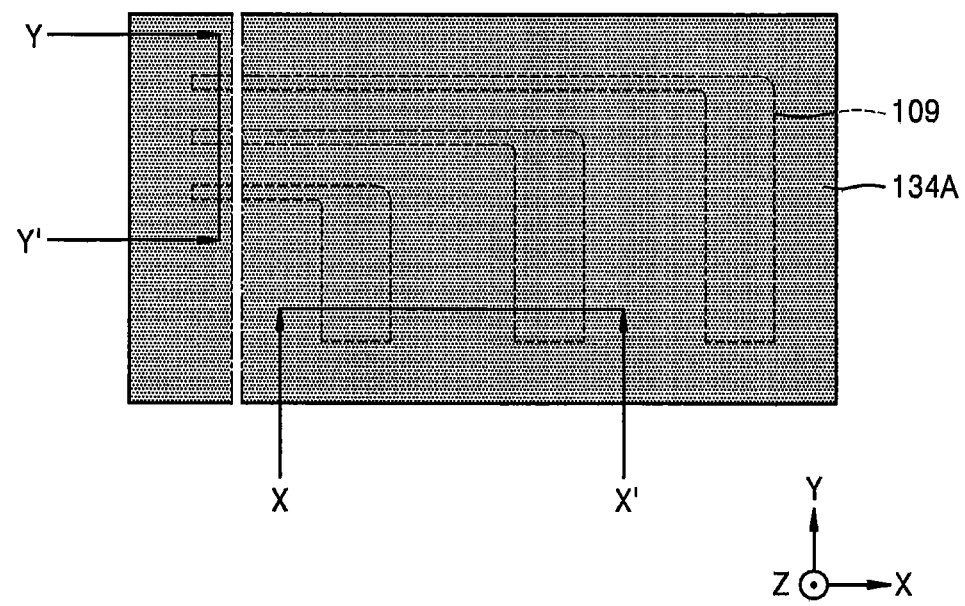
Figure 4B:
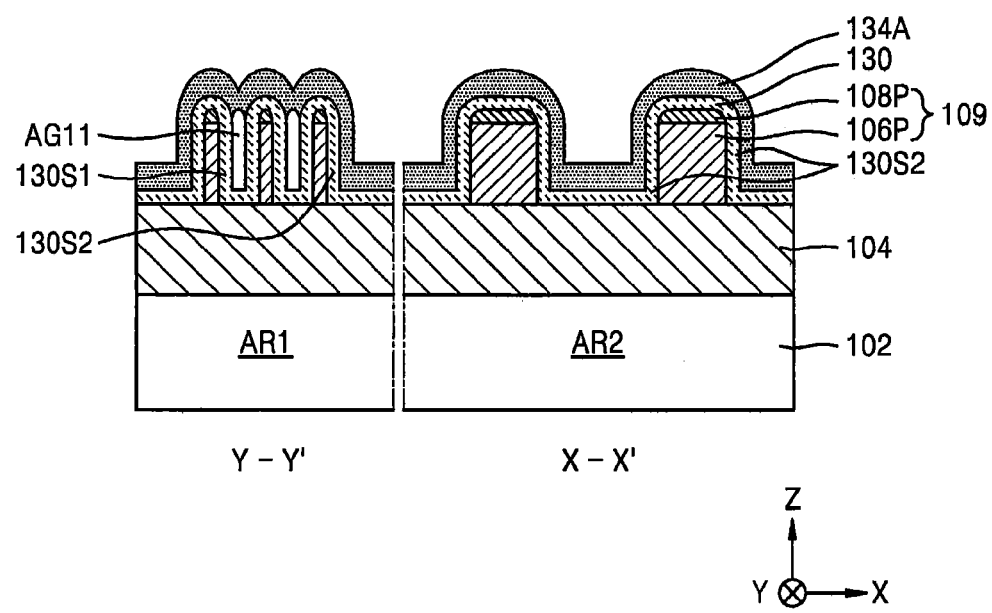

Referring to FIGS. 4A and 4B, an additional spacer layer 134A is formed on the spacer layer 130 in the first area AR1 and the second area AR2.

The additional spacer layer 134A may be formed to have a non-uniform thickness.

In some embodiments, in order to form the additional spacer layer 134A, a process condition having a relatively low step coverage may be used during a process of depositing the additional spacer layer 134A. In some embodiments, the additional spacer layer 134A may be formed by using a chemical vapor deposition (CVD) process. In some embodiments, the additional spacer layer 134A may be formed of a high-density plasma (HDP) oxide film or a tetraethylorthosilicate (TEOS) oxide film.

After the additional spacer layer 134A is formed, a plurality of air gaps AG11 that are defined by the first portion 130S1 of the spacer layer 130 and the additional spacer layer 134A may be formed in the first area AR1. Since the additional spacer layer 134A that is formed on the second portion 130S2 of the spacer layer 130 in the first area AR1 and the second area AR2 is formed to contact the second portion 130S2, no air gap may be formed between the additional spacer layer 134A and the second portion 130S2.

Figure 5A:
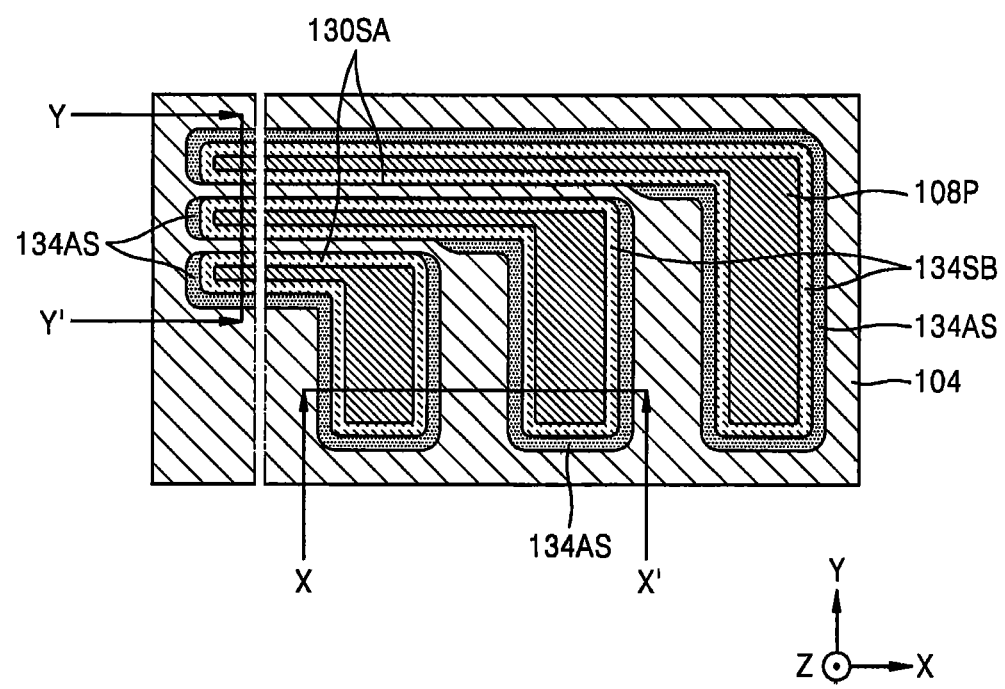
Figure 5B:
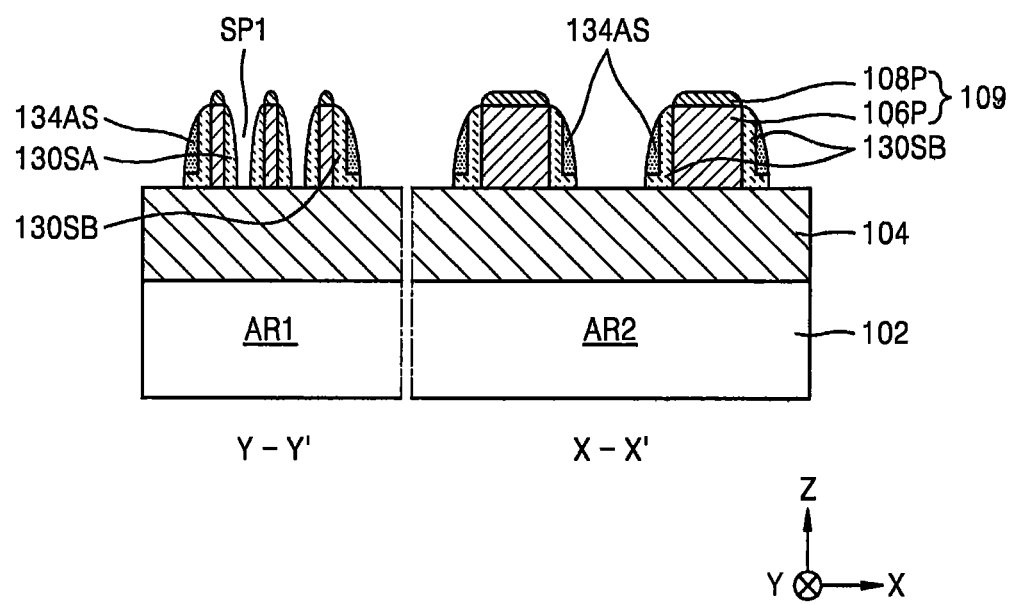

Referring to FIGS. 5A and 5B, an etch-back process may be performed on the additional spacer layer 134A and the spacer layer 130 of a resultant structure of FIGS. 4A and 4B. As a result, a single spacer formed of a single film of a spacer 130SA that is obtained from the first portion 130S1 (see FIG. 4B) of the spacer layer 130 is formed on each of the plurality of first inner side walls IN11 (see FIG. 3B) of the plurality of structures 109 that face a space SP1 between the plurality of structures 109 in the first area AR1. A double spacer having a double-layer structure including a spacer 130SB that is obtained from the second portion 130S2 (see FIG. 4B) of the spacer layer 130 and an additional spacer 134AS that covers the spacer 130SB is formed on each of the plurality of first outer side walls OUT11 (see FIG. 3B) in the first area AR1, and the plurality of second inner side walls IN12 and the plurality of second outer side walls OUT12 (see FIG.

3B) in the second area AR2 of the plurality of structures 109. The single spacer and the double spacer may be concurrently formed.

Figure 6A:
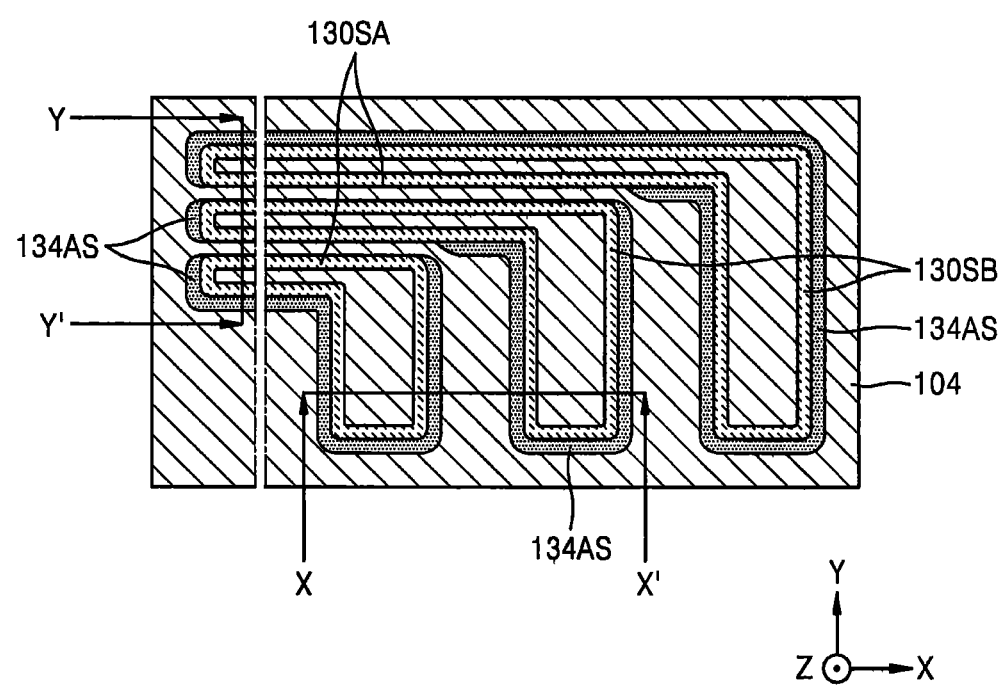
Figure 6B:
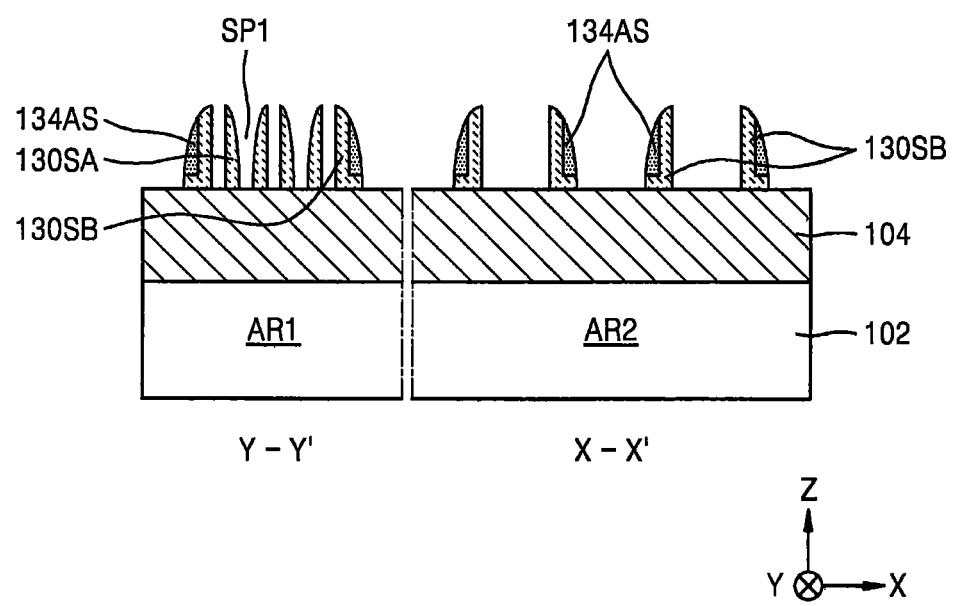

Referring to FIGS. 6A and 6B, portions of the top surface of the feature layer 104 that are covered by the plurality of structures 109 are exposed by removing the plurality of structures 109 from a resultant structure of FIGS. 5A and 5B.

Referring to FIGS. 7A and 7B, a trimming mask pattern 138 having at least one first opening OP11 that is formed in the first area AR1 and at least one second opening OP12 that is formed in the second area AR2 is formed on the feature layer 104.

A part of the spacer 130SA, a part of the additional spacer 134AS, and a part of the feature layer 104 in the first area AR1 may be exposed through the at least one first opening OP11. A part of the spacer 130SB, a part of the additional spacer 134AS, and a part of the feature layer 104 in the second area AR2 may be exposed through the at least one second opening OP12.

In some embodiments, the trimming mask pattern 138 may be formed of a photoresist.

Referring to FIGS. 8A and 8B, after a trimming process for removing a part of the spacer 130SA and a part of the additional spacer 134AS that are exposed through the at least one first opening OP11 and a part of the spacer 130SB and a part of the additional spacer 134AS that are exposed through the at least one second opening OP12 from a resultant structure of FIGS. 7A and 7B is performed, the trimming mask pattern 138 is removed.

As a result, each of the plurality of spacers 130SA and 130SB having closed-loop shapes may be divided into two parts.

Referring to FIGS. 9A and 9B, a plurality of line patterns 104P that are spaced apart from one another are formed by etching the feature layer 104 by using the single spacer formed of the single film of the spacer 130SA of FIGS. 8A and 8B and the double spacer including the spacer 130SB and the additional spacer 134AS of FIGS. 8A and 8B as etching masks in the first area AR1 and the second area AR2 on the first substrate 102.

The plurality of line patterns 104P includes a first line pattern 104P1 including a first main line M11 that extends in the first direction (X direction) and has a first width P1, and a first subline S11 that extends in the second direction (Y direction) from one end of the first main line M11 and has a second width P2 that is greater than the first width P1.

Also, the plurality of line patterns 104P includes a second line pattern 104P2 including a second main line M12 that is parallel to the first main line M11 and has the first width P1, and a second subline S12 that extends from one end of the second main line M12 to be parallel to the first subline S11 and has a third width P3 that is greater than the first width P1. The first line pattern 104P1 and the second line pattern 104P2 are disposed directly adjacent each other.

In some embodiments, the second width P2 and the third width P3 may be substantially the same. In some embodiments, the second width P2 and the third width P3 may be different.

The first line pattern 104P1 may include a first width changer WC11 that is disposed between the first main line M11 and the first subline S11 and whose width increases from the first width P1 to the second width P2, as marked by a dashed circle C1 of FIG. 9A. It will be understood that the term "width changer" refers to a portion that has a change in width. In some embodiments, the width of the first width changer WC11 may gradually increase from the first width P1 to the second width P2 as illustrated in FIG. 9A.

The second line pattern 104P2 may include a second width changer WC12 that is included in the second main line M12 and whose width gradually increases from the first width P1 to the third width P3 along a longitudinal direction of the second main line M12, as marked by a dashed circle C2 of FIG. 9A. As illustrated in FIG. 9A, the second width changer WC12 begins at a location where the first line pattern 104P1 terminates in the first direction, X direction.

According to the method of manufacturing the semiconductor device 100A illustrated in FIGS. 1A through 9B, the plurality of line patterns 104P having widths that vary according to positions may be formed in the first area AR1 in which a width of the line patterns 104P is relatively small and in the second area AR2 in which a width of the line patterns 104P is relatively large. Accordingly, when a plurality of fine patterns that are repeatedly formed at fine pitches beyond a resolution limit of photolithography and have fine widths are to be formed, a plurality of fine patterns having widths that vary according to positions may be easily manufactured.

FIGS. 10A, 11A, 12A, and 13A are plan views illustrating a method of manufacturing the semiconductor device 100A in FIGS. 9A and 9B according to some embodiments of the inventive concept, and FIGS. 10B, 11B, 12B, and 13B are cross-sectional views taken along the lines X-X' and Y-Y' of FIGS. 10A, 11A, 12A, and 13A.

Figure 10A:
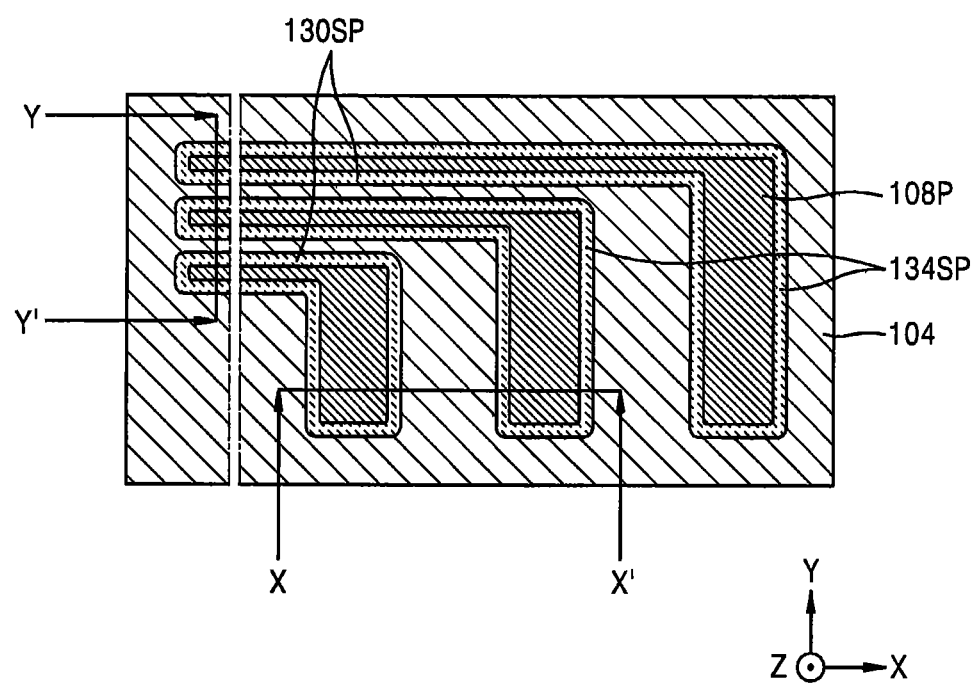
FIGS. 10A, 11A, 12A, and 13A are plan views illustrating a method of manufacturing a semiconductor device according to some embodiments of the inventive concept.
Figure 10B:
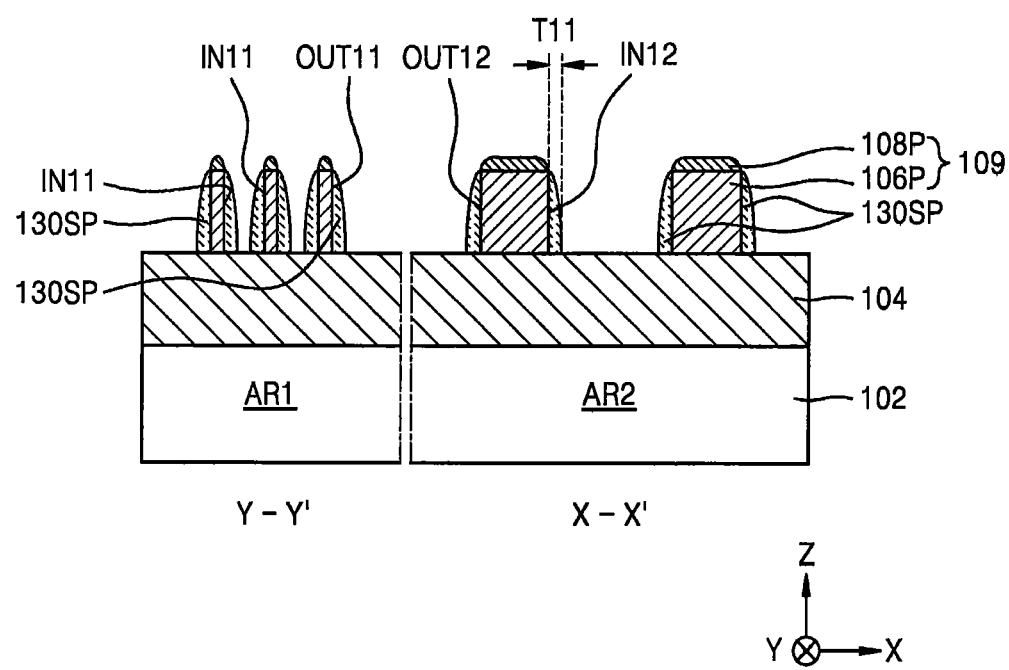
FIGS. 10B, 11B, 12B, and 13B are cross-sectional views taken along the lines X-X' and Y-Y' of FIGS. 10A, 11A, 12A, and 13A.

Referring to FIGS. 10A and 10B, after the spacer layer 130 that covers the plurality of structures 109 including the first hardmask patterns 106P and the second hardmask patterns 108P is formed by using substantially the same process as illustrated in FIGS. 1A through 3B, a plurality of spacers 130SP that cover side walls of the plurality of structures 109 are formed by performing an etch-back process on the spacer layer 130.

The plurality of spacers 130SP may be formed to cover the first inner side walls IN11, the first outer side walls OUT11, the second inner side walls IN12, and the second outer side walls OUT12 of the plurality of structures 109 in the first area AR1 and the second area AR2 with a uniform thickness.

In some embodiments, the plurality of spacers 130SP may have a thickness T11 that is substantially the same as the first width W11.

Figure 11A:
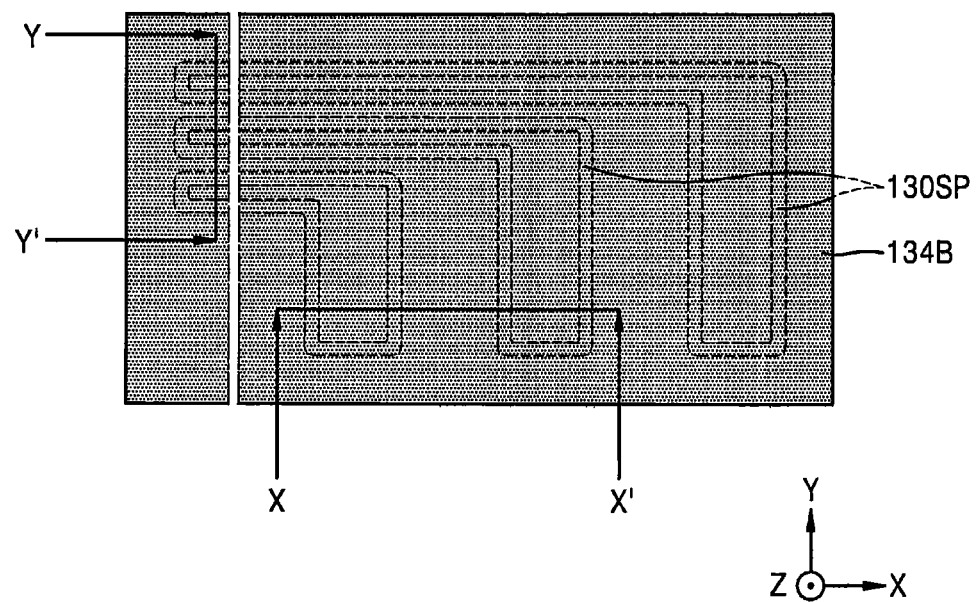
Figure 11B:
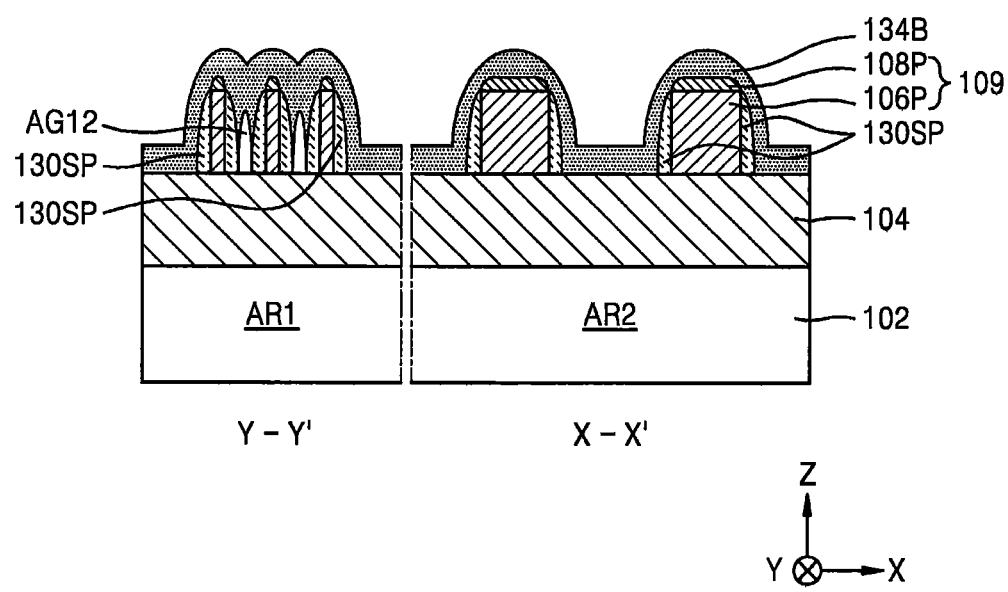

Referring to FIGS. 11A and 11B, an additional spacer layer 134B is formed on the plurality of structures 109 and the plurality of spacers 130SP in the first area AR1 and the second area AR2.

The additional spacer layer 134B may be formed to have a non-uniform thickness.

A process of forming the additional spacer layer 134A that is substantially the same as the additional spacer layer 134B has already been explained with reference to FIGS. 4A and 4B, and thus a detailed explanation of the additional spacer layer 134B will not be given.

After the additional spacer layer 134B is formed, a plurality of air gaps AG12 that are defined by the spacers 130SP and the additional spacer layer 134B may be formed in the first area AR1. In the first area AR1 and the second area AR2, since portions of the spacer 130SP that face a relatively wide space may contact the additional spacer layer 134B, no air gap may be formed between the additional pacer layer 134B and the spacers 130SP.

Figure 12A:
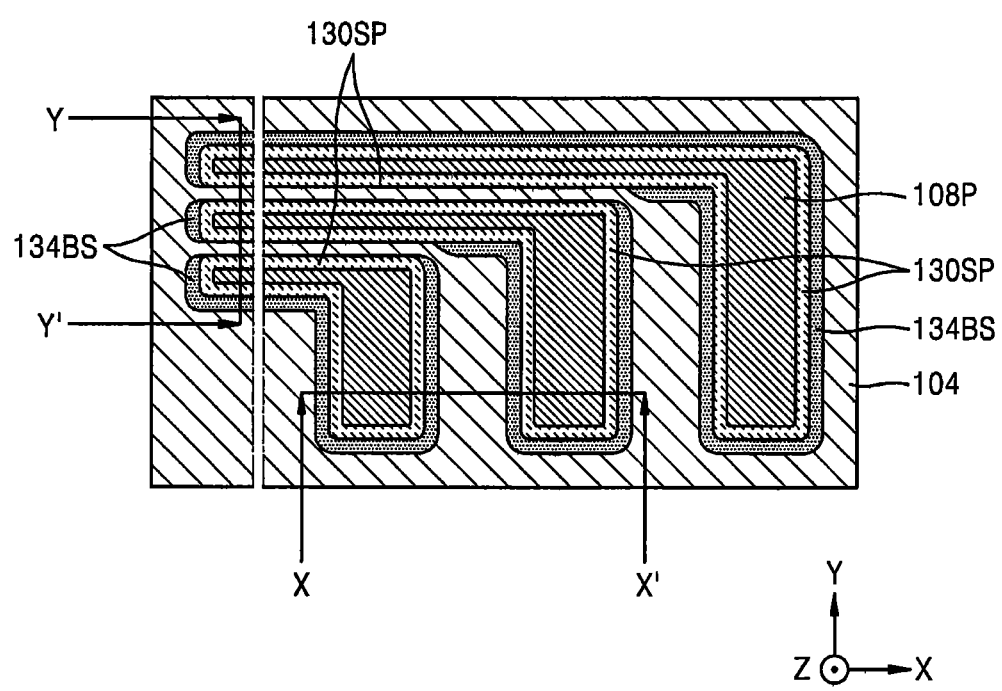
Figure 12B:
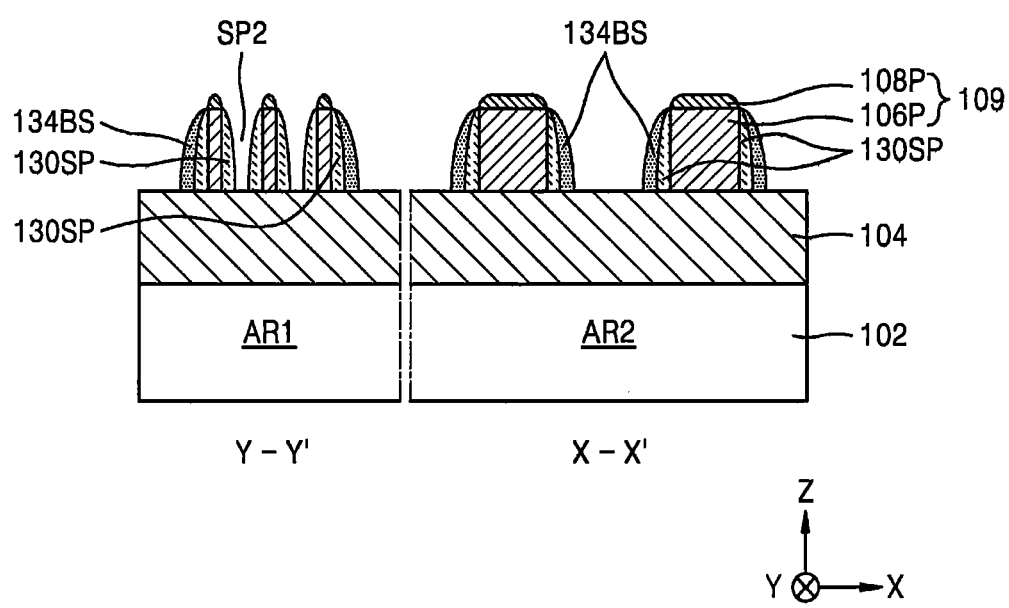

Referring to FIGS. 12A and 12B, an etch-back process is performed on the additional spacer layer 134B. As a result, a single spacer formed of a single film of each of the spacers 130SP is formed on each of the plurality of first inner side walls IN11 (see FIG. 10B) of the plurality of structures 109 that face a space SP2 between the plurality of structures 109 in the first area AR1. In contrast, a double spacer having a double-layer structure including the spacer 130SP and an additional spacer 134BS that covers the spacer 130SP is formed on each of the plurality of first outer side walls OUT11 (see FIG. 3B) of the plurality of structures 109 in the first area AR1 and on the plurality of second inner side walls IN12 and the plurality of second outer side walls OUT12 (see FIG. 3B) of the plurality of structures 109 in the second area AR2.

Figure 13A:
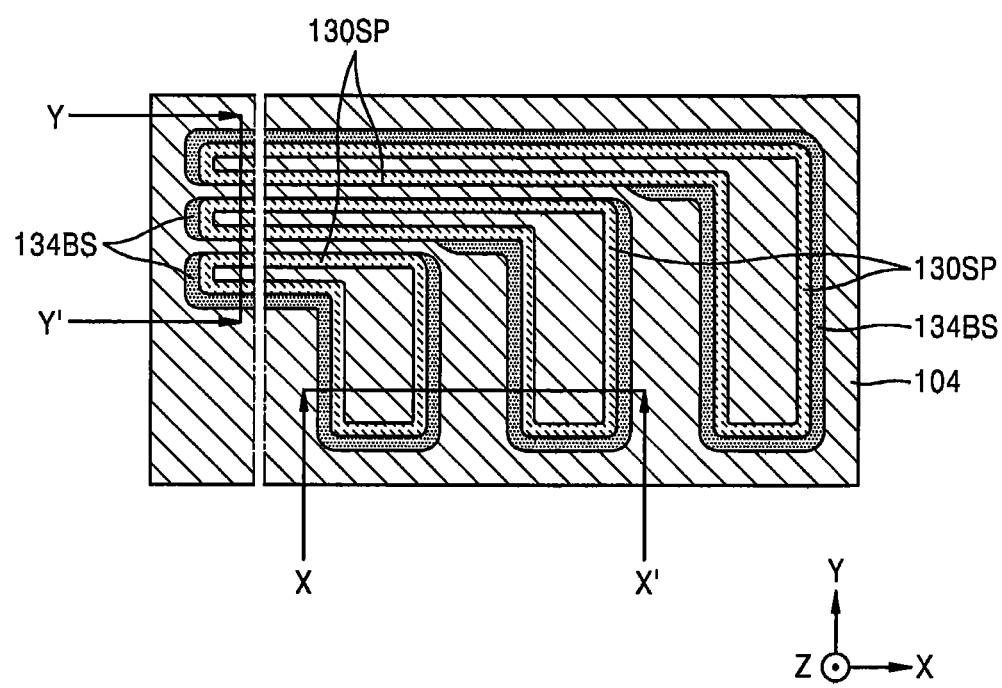
Figure 13B:
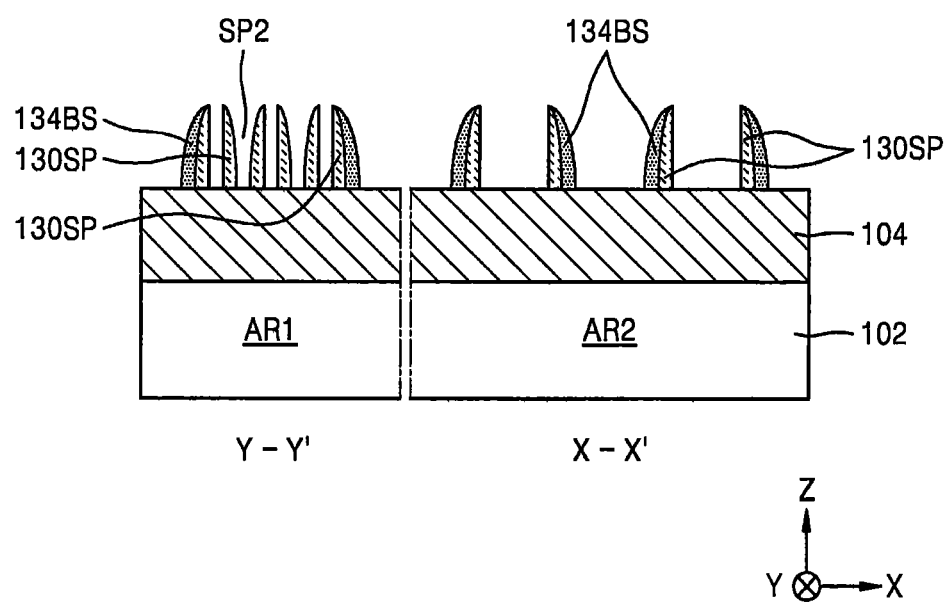

Referring to FIGS. 13A and 13B, portions of a top surface of the feature layer 104 that are covered by the plurality of structures 109 are exposed by removing the plurality of structures 109 from a resultant structure of FIGS. 12A and 12B.

A trimming process may be performed on the plurality of spacers 130SP and the plurality of additional spacers 134BS by using substantially the same process as that described with reference to FIGS. 7A through 8B. Next, the plurality of line patterns 104P that are spaced apart from one another as shown in FIGS. 9A and 9B may be formed by etching the feature layer 104 by using the trimmed plurality of spacers 130SP and the trimmed plurality of additional spacers 134BS as etching masks, by using substantially the same process as that described with reference to FIGS. 9A and 9B.

Figure 17A:
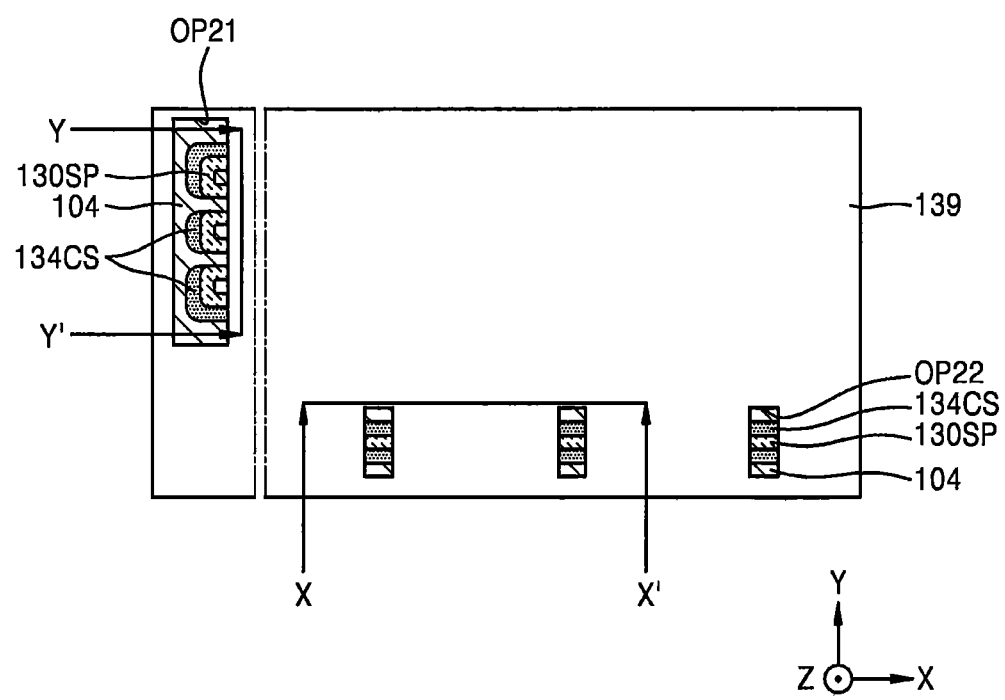
Figure 17B:
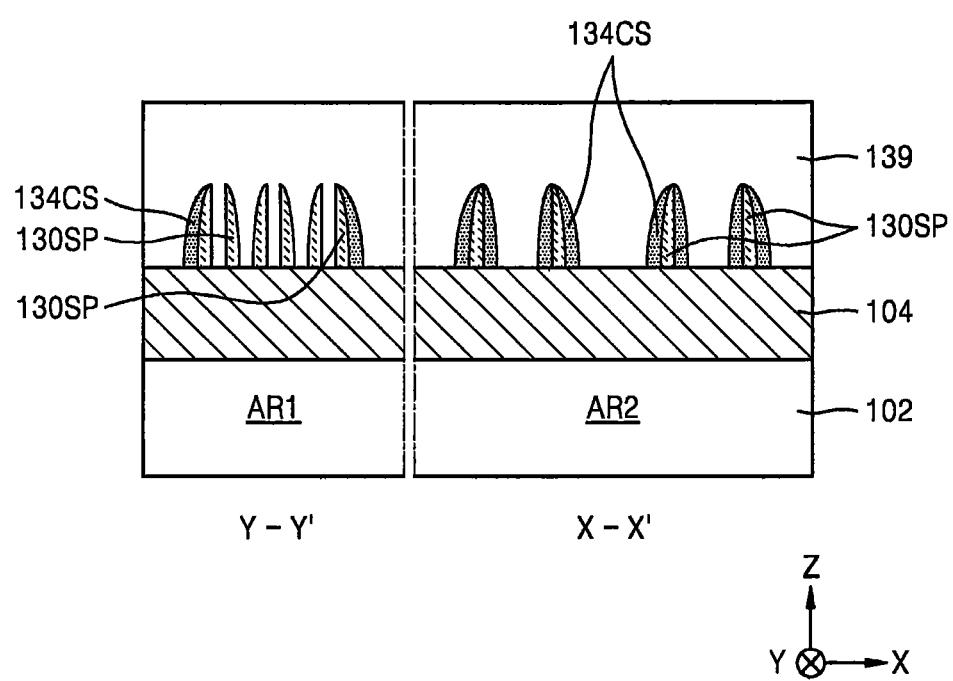
Figure 18A:
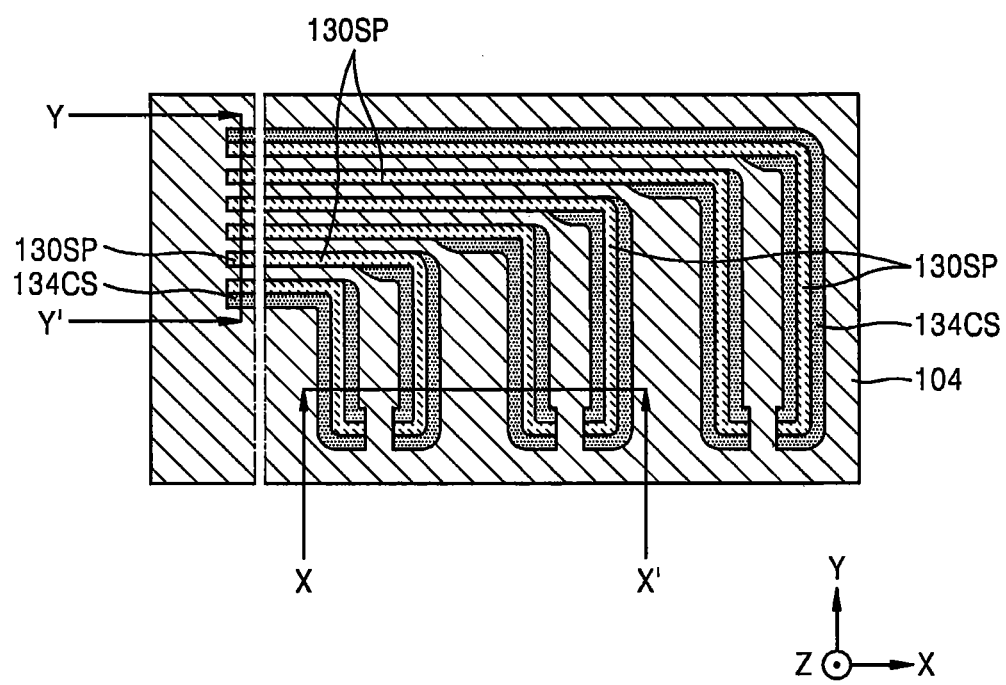
Figure 18B:
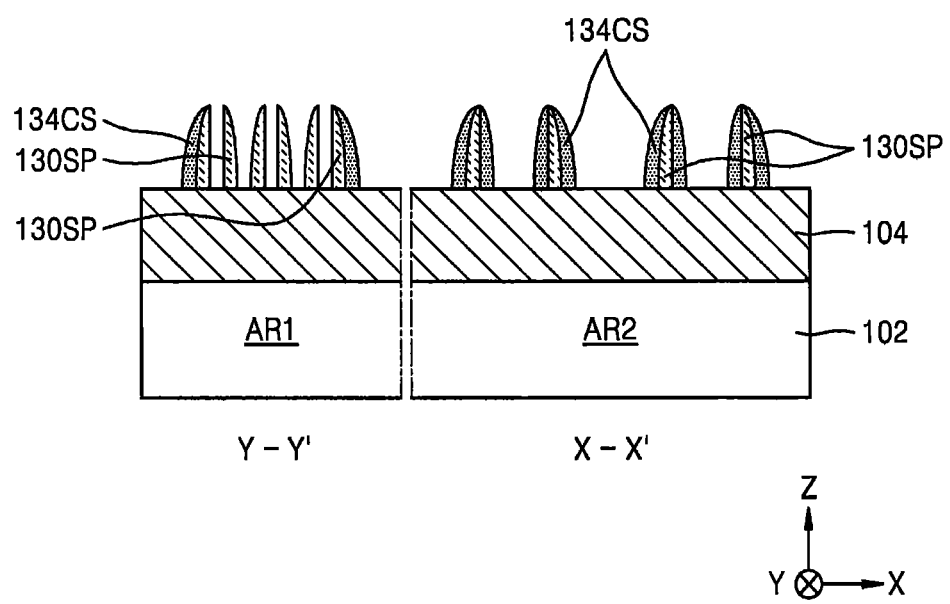
Figure 19A:
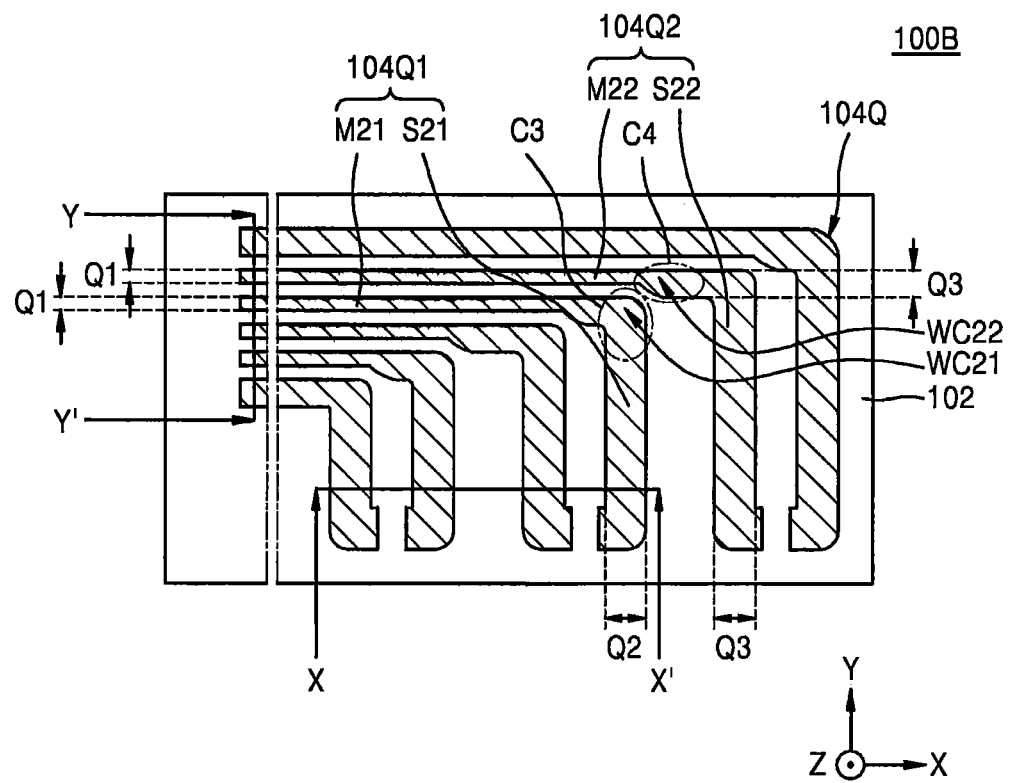
Figure 19B:
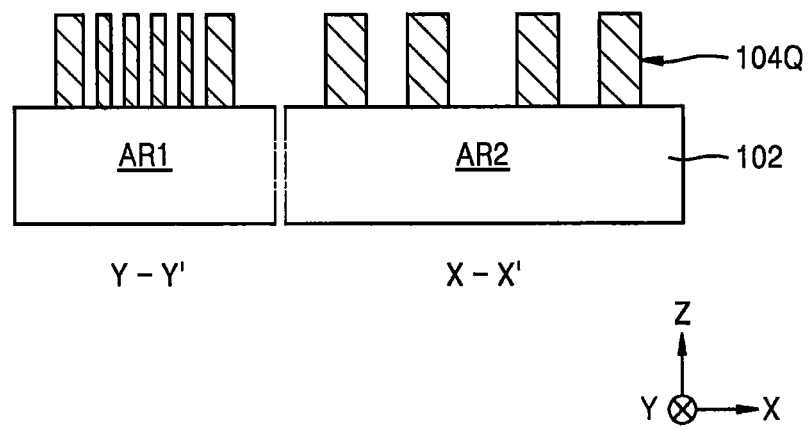

FIGS. 14A, 15A, 16A, 17A, 18A and 19A are plan views illustrating a method of manufacturing a semiconductor device 100B in FIGS. 19A and 19B according to some embodiments of the inventive concept, and FIGS. 14B, 15B, 16B, 17B, 18B and 19B are cross-sectional views taken along the lines X-X' and Y-Y' of FIGS. 14A, 15A, 16A, 17A, 18A and 19A.

Figure 14A:
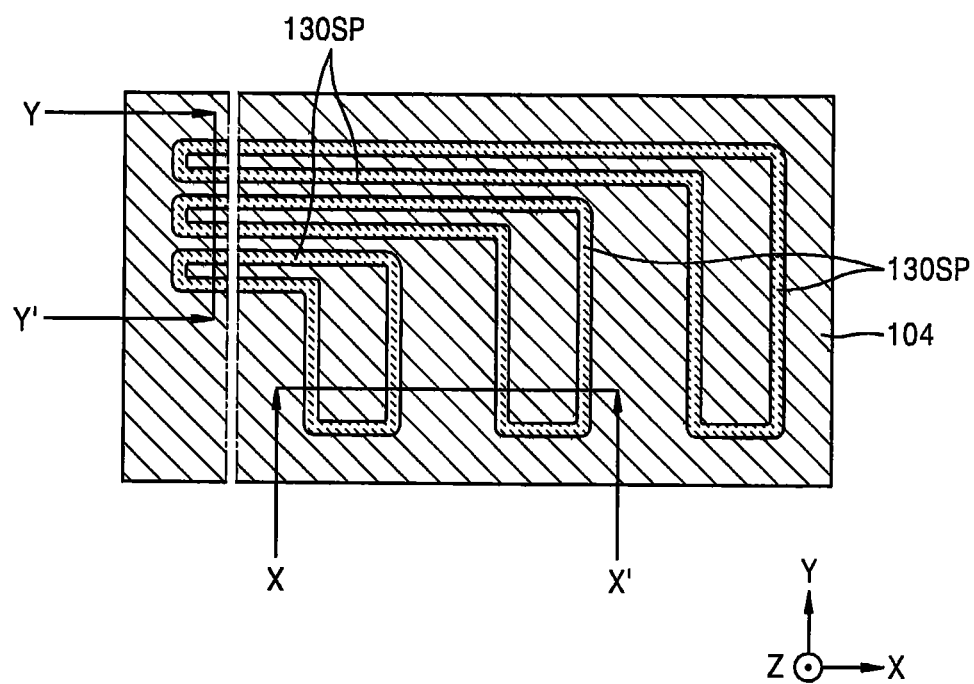
FIGS. 14A, 15A, 16A, 17A, 18A and 19A are plan views illustrating a method of manufacturing a semiconductor device according to some embodiments of the inventive concept.
Figure 14B:
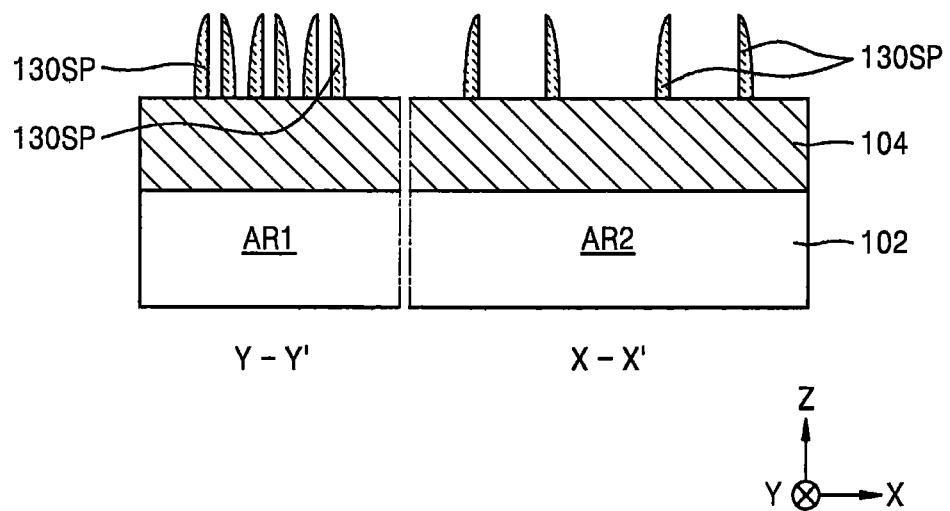
FIGS. 14B, 15B, 16B, 17B, 18B and 19B are cross-sectional views taken along the lines X-X' and Y-Y' of FIGS. 14A, 15A, 16A, 17A, 18A and 19A.

Referring to FIGS. 14A and 14B, the plurality of spacers 130P that cover side walls of the plurality of structures 109 are formed on a resultant structure including the plurality of structures 109 that include the first hardmask patterns 106P and the second hardmask patterns 108P, by using substantially the same process as that described with reference to FIG. 10B. Next, portions of a top surface of the feature layer 104 that are covered by the plurality of structures 109 are exposed by removing the plurality of structures 109.

Figure 15A:
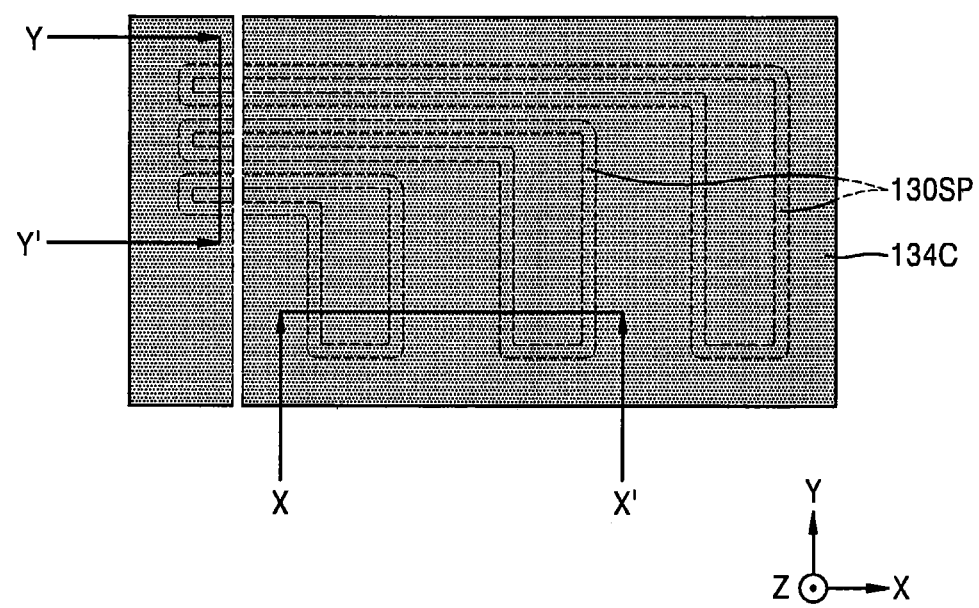
Figure 15B:
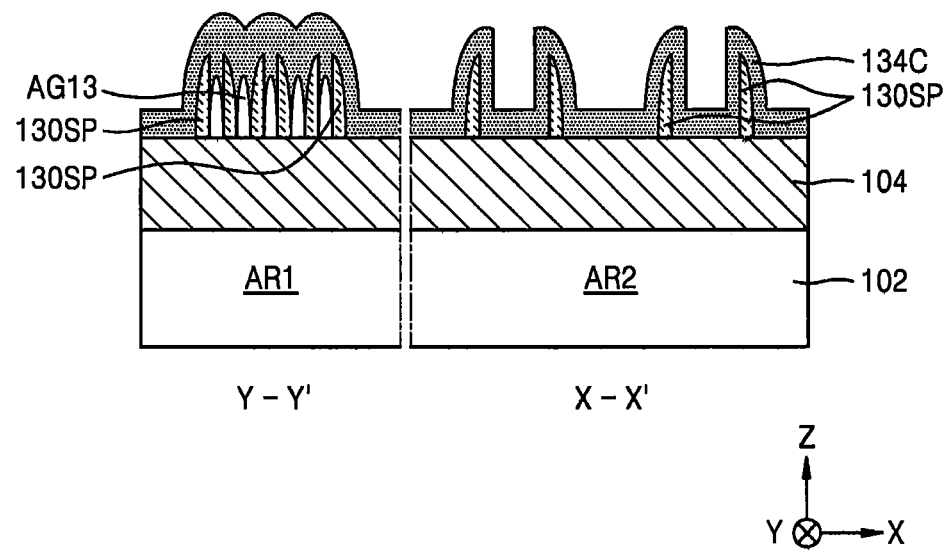

Referring to FIGS. 15A and 15B, an additional spacer layer 134C is formed on the spacers 130SP in the first area AR1 and the second area AR2.

The additional spacer layer 134C may be formed to have a non-uniform thickness.

A process of forming the additional spacer layer 134A that is substantially the same as the additional spacer layer 134C has already been explained with reference to FIGS. 4A and 4B, and thus a detailed explanation of the additional spacer layer 134C will not be given.

After the additional spacer layer 134C is formed, a plurality of air gaps AG13 that are defined by the plurality of spacers 130SP and the additional spacer layer 134C may be formed in the first area AR1. In the first area AR1, the plurality of air gaps AG13 may be formed so that two air gaps AG13 are disposed on both sides of one spacer 130SP. Next, in the first area AR1 and the second area AR2, side walls of the spacers 130SP that face a relatively wide space may be covered by the additional spacer layer 134C.

Figure 16A:
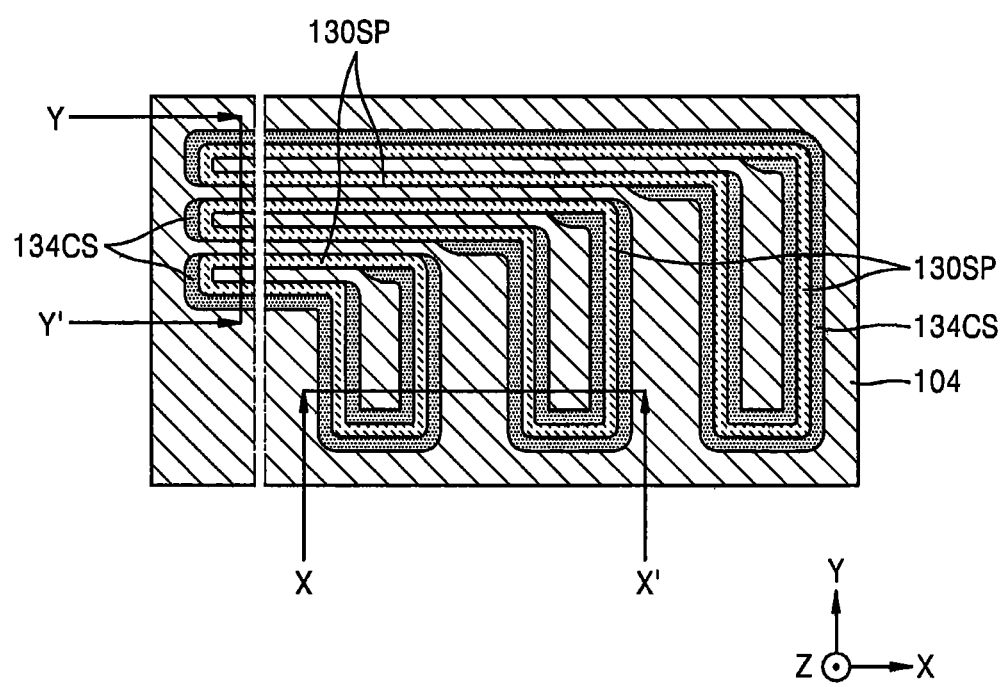
Figure 16B:
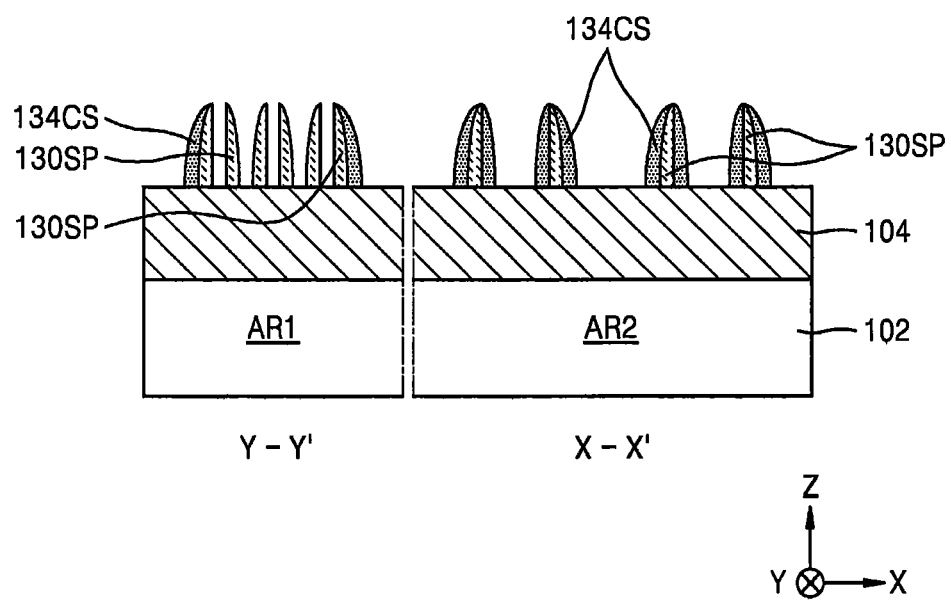

Referring to FIGS. 16A and 16B, a plurality of additional spacers 134CS are formed by performing an etch-back process on the additional spacer layer 134C.

As a result, a single spacer formed of a single film of each of the spacers 130SP and a double spacer having a double-layer structure including the spacer 130SP and the additional spacer 134CS that covers only one side wall of the spacer 130SP remain in the first area AR1. A triple spacer having a three-layer structure including the spacer 130SP and the additional spacer 134CS that covers both side walls of the spacer 130SP remains in the second area AR2.

Referring to FIGS. 17A and 17B, a trimming mask pattern 139 including at least one first opening OP21 that is formed in the first area AR1 and at least one second opening OP22 that is formed in the second area AR2 is formed on the feature layer 104.

A part of the spacer 130SP, a part of the additional spacer 134CS, and a part of the feature layer 104 in the first area AR1 may be exposed through the at least one first opening OP21. A part of the spacer 130SP, a part of the additional spacer 134CS, and a part of the feature layer 104 in the second area AR2 may be exposed through the at least one second opening OP22.

In some embodiments, the trimming mask pattern 139 may be formed of a photoresist.

Referring to FIGS. 18A and 18B, after a trimming process for removing a part of the spacer 130SP and a part of the additional spacer 134CS that are exposed through the at least one first opening OP21 and a apart of the spacer 130SP and a part of the additional spacer 134CS that are exposed through the at least one second opening OP22 from a resultant structure of FIGS. 17A and 17B is performed, the trimming mask pattern 139 is removed. As a result, each of the plurality of spacers 130SP having closed-loop shapes may be divided into two parts.

Referring to FIGS. 19A and 19B, a plurality of line patterns 104Q that are spaced apart from one another are formed by etching the feature layer 104 by using the single spacer formed of the single film of the spacer 130SP, the double spacer including the spacer 130SP and the additional spacer 134CS that covers one side wall of the spacer 130SP, and the triple spacer including the spacer 130SP and the additional spacer 134CS that covers both side walls of the spacer 130SP as etching masks in the first area AR1 and the second area AR2 on the substrate 102.

The plurality of line patterns 104Q include a first line pattern 104Q1 including a first main line M21 that extends in the first direction (X direction) and has a first width Q1, and a first subline S21 that extends in the second direction (Y direction) from one end of the first main line M21 and has a second width Q2 that is greater than the first width Q1.

Also, the plurality of line patterns 104Q includes a second line pattern 104Q2 including a second main line M22 that is parallel to the first main line M21 and has the first width Q1, and a second subline S22 that extends from one end of the second main line M22 to be parallel to the first subline S21 and has a third width Q3 that is greater than the first width Q1.

The first line pattern 104Q1 may include a first width changer WC21 that is disposed between the first main line M21 and the first subline S21 and whose width gradually increases, as marked by a dashed circle C3 of FIG. 19A.

The second line pattern 104Q2 may include a second width changer WC22 that is included in the second main line M22 and whose width gradually increases along a longitudinal direction of the second main line M22, as marked by a dashed circle C4 of FIG. 19A.

Figure 20:
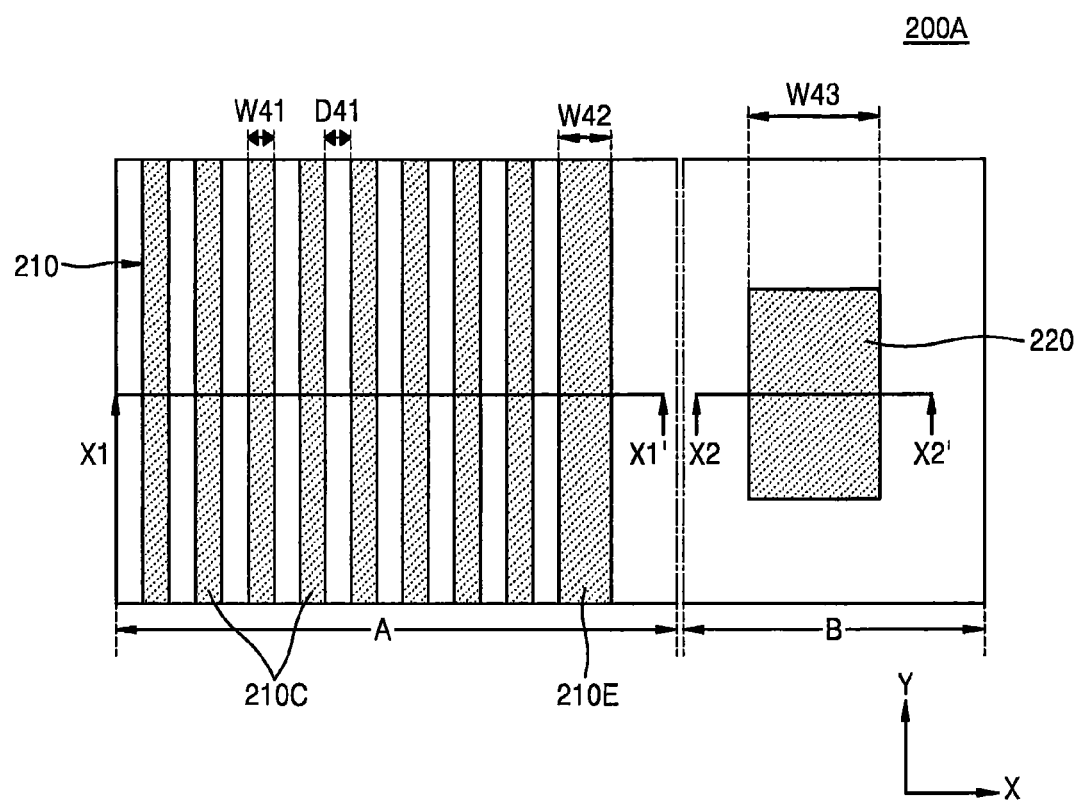
FIG. 20 is a layout of a semiconductor device according to some embodiments of the inventive concept.

FIG. 20 is a layout of a semiconductor device 200A according to some embodiments of the inventive concept.

Referring to FIG. 20, the semiconductor device 200A includes a high-density area A and a low-density area B. The high-density area A may be a cell array region in which unit memory devices are formed. For example, a memory cell array of the semiconductor device 200A may be formed in the high-density area A. The low-density area B may be a peripheral circuit region or a core region in which peripheral circuits for deriving the unit memory devices that are formed in the high-density area A are formed. Alternatively, the low-density area B may be a part of the cell array region in which a pattern having a relatively large width is formed.

In FIG. 20, the high-density area A includes a plurality of line patterns 210 that extend parallel to one another.

The plurality of line patterns 210 include an edge line pattern 210E that is an outermost line pattern among the plurality of line patterns 210 and has a side wall that faces outside of the high-density area A, and a plurality of inner line patterns 210C that are formed inner than the edge line pattern 210E.

In the high-density area A, a distance between the plurality of line patterns 210 may be a first gap D41 that is relatively small. Each of the plurality of inner line patterns 210C has a first width W41 that is relatively small, and the edge line pattern 210E has a second width W42 that is greater than the first width W41. In the high-density area A, the first width W41, the second width W42, and the first gap D41 may be arbitrarily designed according to types and desired characteristics of unit devices to be formed. For example, the first width W41 and the first gap D41 may be substantially the same. Alternatively, the first width W41 may be greater or less than the first gap D41. In some embodiments, the second width W42 may be about two or three times the first width W41.

A wide width pattern 220 having a third width W43 that is relatively large may be formed in the low density area B.

In some embodiments, the plurality of line patterns 210 may constitute a plurality of active regions that are formed in the cell array region, and the wide width pattern 220 may constitute an active region that is formed in the peripheral circuit region. In some embodiments, the plurality of line patterns 210 may be a plurality of conductive patterns that are formed in the cell array region, and the wide width pattern 220 may be a conductive pattern having a relatively large width that is formed in the peripheral circuit region or the cell array region. Alternatively, the wide width pattern 220 may constitute an align key.

Figure 21A:
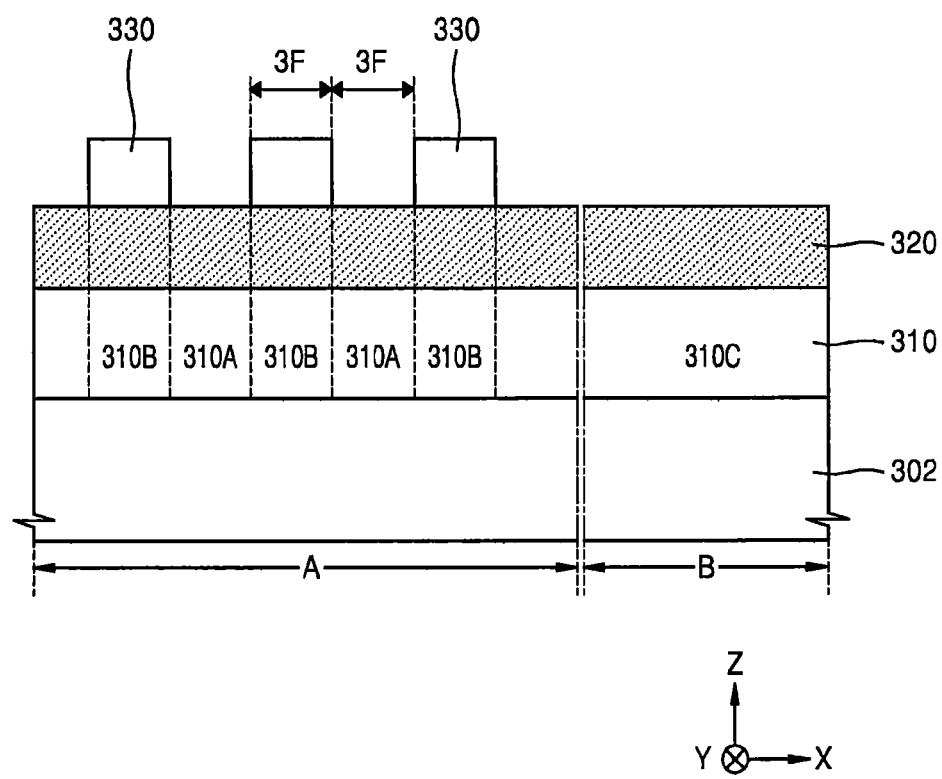
FIGS. 21A through 21O are cross-sectional views illustrating a method of manufacturing a semiconductor device according to some embodiments of the inventive concept.

FIGS. 21A through 21O are cross-sectional views illustrating a method of manufacturing a semiconductor device according to some embodiments of the inventive concept.

A method of manufacturing the semiconductor device 200A in FIG. 20 according to some embodiments will now be explained with reference to FIGS. 21A through 21O. In FIGS. 21A through 21O, a cross-sectional view taken along the line X1-X1' of FIG. 20 illustrates the high-density area A, and a cross-sectional view taken along the line X2-X2' of FIG. 20 illustrates the low-density area B.

Referring to FIG. 21A, a feature layer 310 and a first mask layer 320 are sequentially formed on a substrate 302 in the high-density area A and the low-density area B, and then a plurality of reference structures 330 are formed on the first mask layer 320.

The substrate 302 and the feature layer 310 may be substantially the same as the substrate 102 and the feature layer 104 of FIGS. 1A and 1B.

In the high-density area A, the feature layer 310 may include first regions 310A and second regions 310B each having, for example, a width of 3 F that is at least three times greater than 1 F that is a minimum feature size of the semiconductor device 200A. In some embodiments, each of the first regions 310A and the second regions 310B of the feature layer 310 has a width of 3 F. In the low-density area B, the feature layer 310 includes a third region 310C that is spaced apart from the first regions 310A and the second regions 310B that are disposed in the high-density area A.

The first mask layer 320 may be formed of a material having an etch selectivity with respect to the feature layer 310. For example, the first mask layer 320 may be formed of polysilicon.

The plurality of reference structures 330 may be formed on the first mask layer 320 only in the high-density area A, and may not be formed in the low-density area B. The plurality of reference structures 330 may be formed on the second regions 310B of the feature layer 310 to have substantially the same width (e.g., a width of 3 F) as a width of each of the second regions 310B and to cover the first mask layer 320. Spaces may be formed between the plurality of reference structures 330 to have substantially the same width (e.g., a width of 3 F) as a width of each of the first regions 310A, and may be disposed to correspond to the first regions 310A of the feature layer 310. Portions of the first mask layer 320 that are exposed through the plurality of spaces between the plurality of reference structures 330 each have a width of 3 F.

The plurality of reference structures 330 may be formed of a material having an etch selectivity with respect to the first mask layer 320. For example, the plurality of reference structures 330 may be formed of an amorphous carbon layer (ACL), or a film (hereinafter, referred to as an "SOH" film) formed of a hydrocarbon compound having a relatively high carbon content ranging from about 85 weight % to about 99 weight % based on a total weight or a derivative of the hydrocarbon compound.

An example process of forming the plurality of reference structures 330 made of an SOH film will be explained. First, an organic compound layer having a thickness ranging from about 1000 Å to about 5000 Å is formed on the first mask layer 320. In this case, a spin coating process or another deposition process may be used, if necessary. An organic compound may be formed of a hydrocarbon compound including an aromatic ring such as phenyl, benzene, or naphthalene or a derivative of the hydrocarbon compound. The organic compound may be formed of a material having a relatively high carbon content ranging from about 85 weight % to about 99 weight % based on a total weight thereof. A carbon-containing film may be formed by first baking the organic compound layer at a temperature ranging from about 150° C. to about 350° C. The first baking may be performed for about 60 seconds. Next, the carbon-containing film is second baked at a temperature ranging from about 300° C. to about 550° C. and is hardened. The second baking may be performed for about 30 seconds to about 300 seconds. As such, since the carbon-containing film is hardened by the second baking, even when a deposition process is performed at a relatively high temperature of about 400° C. or more in order to form another film on the carbon-containing film, the deposition process does not adversely affect the carbon-containing film. The plurality of reference structures 330 may be formed by patterning the hardened carbon-containing film by using photolithography.

Figure 21B:
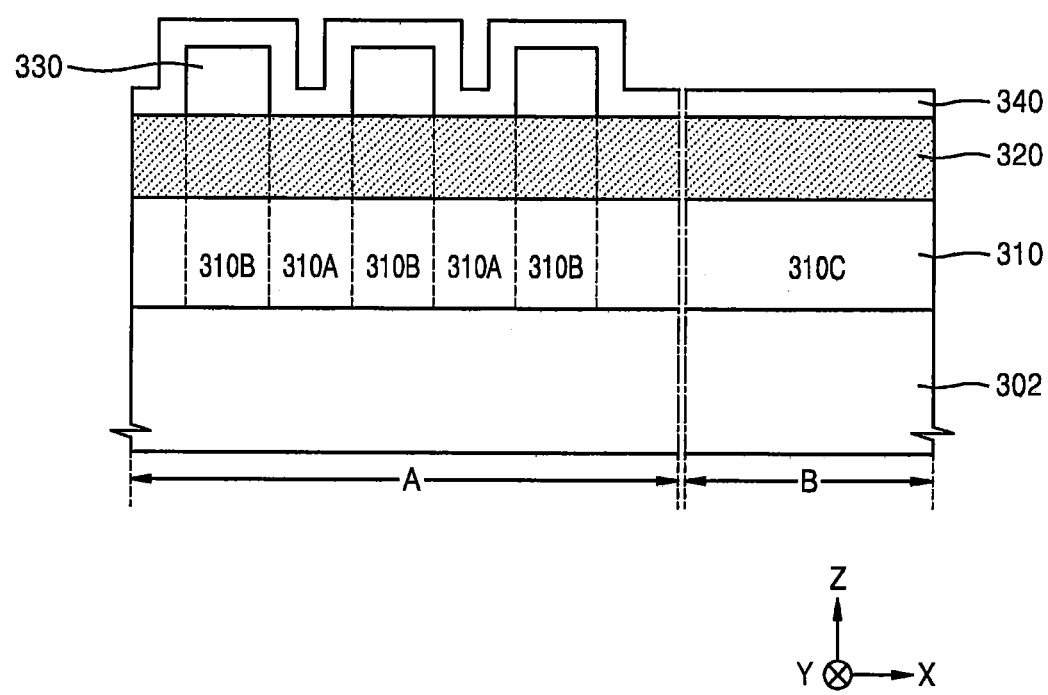

Referring to FIG. 21B, a spacer layer 340 that covers exposed surfaces of the plurality of reference structures 330 and an exposed surface of the first mask layer 320 is formed in the high-density area A and the low-density area B. The spacer layer 340 may have a uniform thickness in the high-density area A and the low-density area B.

The spacer layer 340 may have a thickness of 1 F. Also, the spacer layer 340 may be formed of a material having an etch selectivity with respect to the plurality of reference structures 330 and the first mask layer 320. For example, the spacer layer 340 may be formed of an oxide film.

An ALD process may be used in order to form the spacer layer 340 having a uniform thickness on the substrate 302.

Figure 21C:
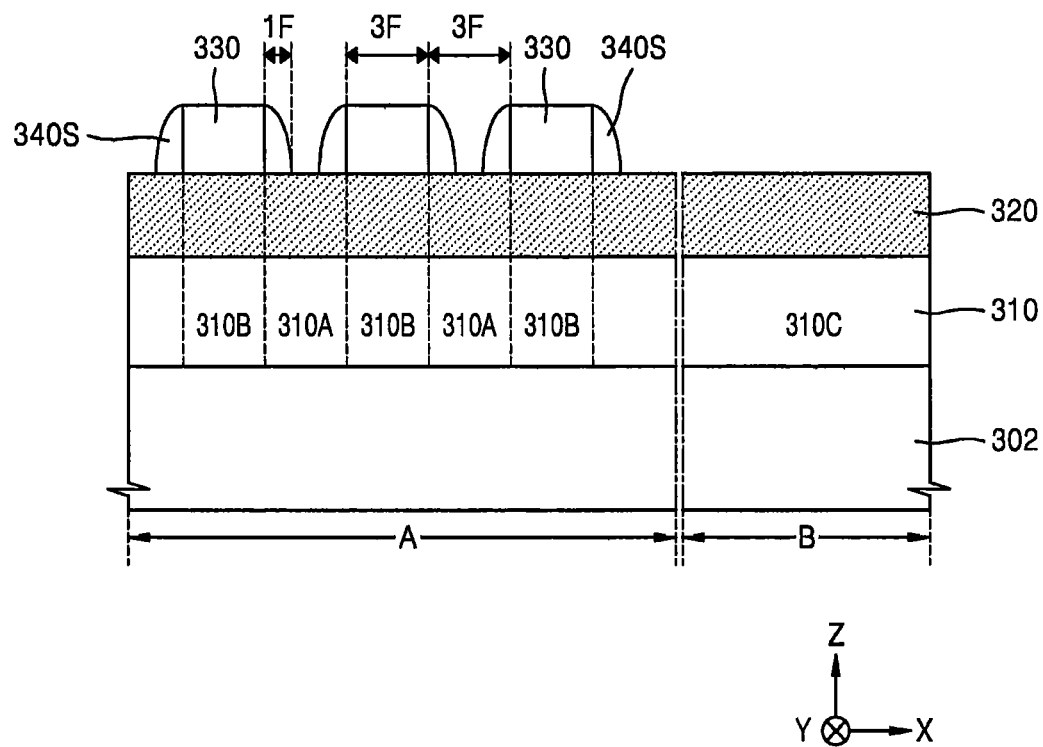

Referring to FIG. 21C, a plurality of spacers 340S that cover both side walls of the plurality of reference structures 330 are formed in the high-density area A by performing an etch-back process on the spacer layer 340 until a top surface of the first mask layer 320 is exposed.

Each of the plurality of spacers 340S may be formed to cover the top surface of the first mask layer 320 with a width of 1 F.

Figure 21D:
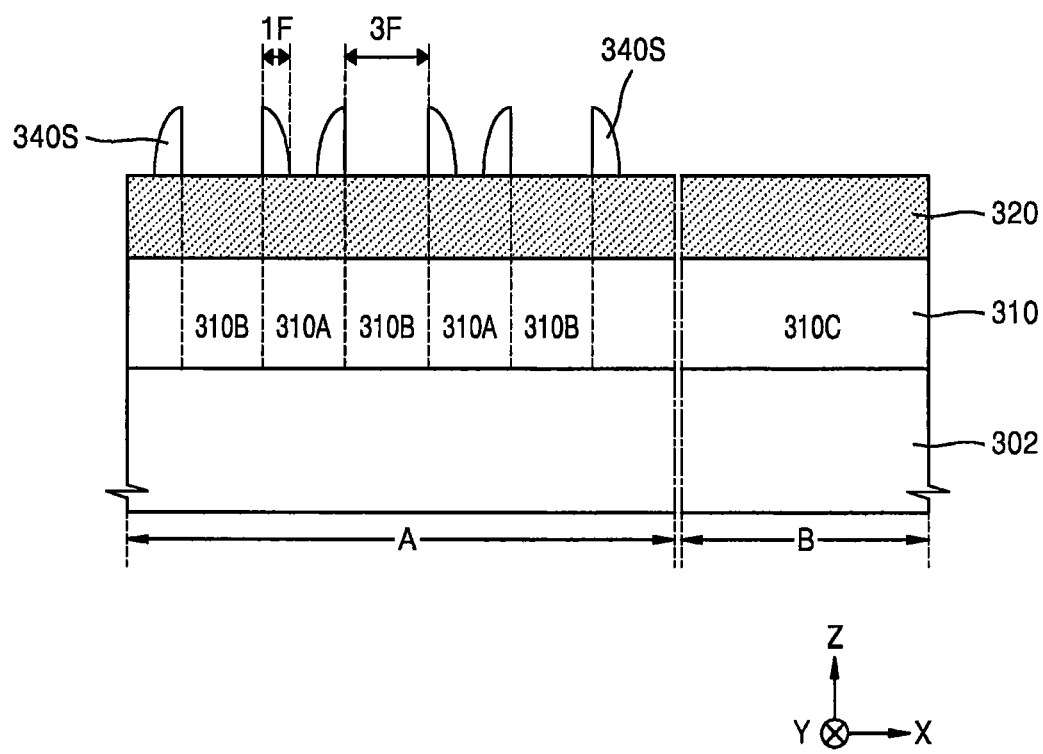

Referring to FIG. 21D, portions of the top surface of the first mask layer 320 that are covered by the plurality of reference structures 330 are exposed by removing the plurality of reference structures 330.

A process of removing the plurality of reference structures 330 may not remove the plurality of spacers 340S and the first mask layer 320 in the high-density area A.

When the plurality of reference structures 330 are formed of an SOH film, ashing or stripping may be used in order to remove the plurality of reference structures 330. Alternatively, the plurality of reference structures 330 may be removed by using dry or wet etching process according to materials of the plurality of reference structures 330.

Figure 21E:
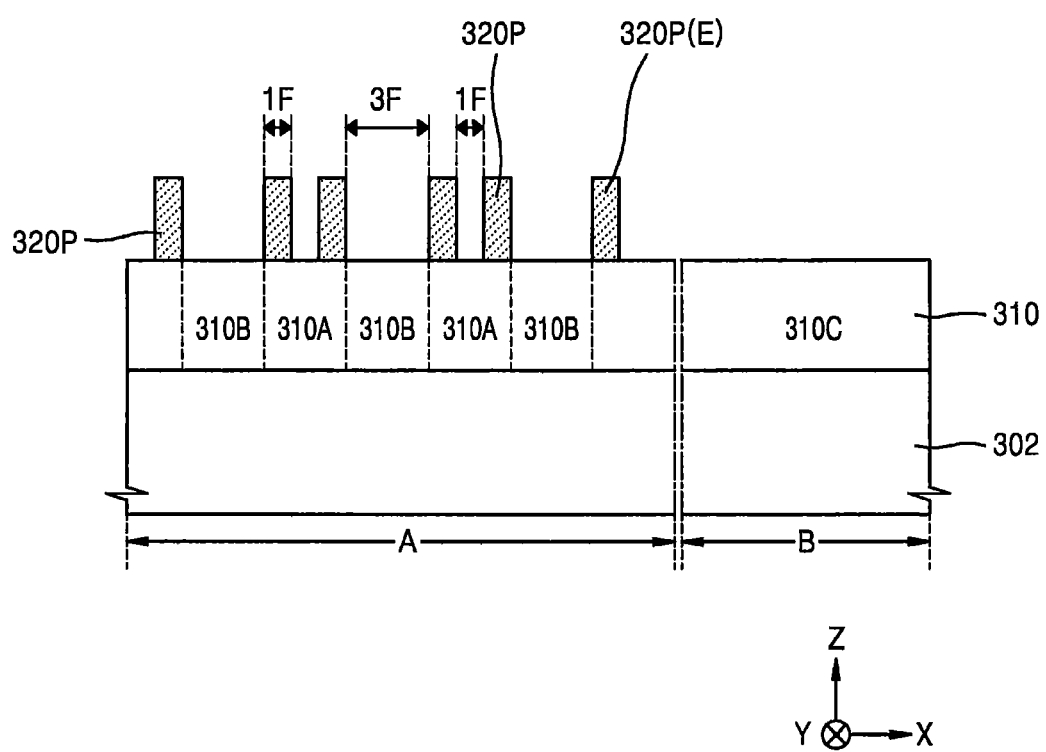

Referring to FIG. 21E, a plurality of first mask patterns 320P are formed in the high-density area A by etching the first mask layer 320 in the high-density area A and the low-density area B by using the plurality of spacers 340S as etching masks.

In FIG. 21E, the plurality of first mask patterns 320P that are formed in the high-density area A include an outermost first mask pattern 320P(E).

Each of the plurality of first mask patterns 320P may have a width of 1 F. The first regions 310A and the second regions 310B of the feature layer 310 are alternately exposed through a plurality of spaces between the plurality of first mask patterns 320P. In some embodiments, a space having a width of 1 F and a space having a width of 3 F are alternately disposed between the plurality of first mask patterns 320P as illustrated in FIG. 21E.

After the plurality of first mask patterns 320P are formed, the top surface of the feature layer 310 in the low-density area B is completely exposed.

Figure 21F:
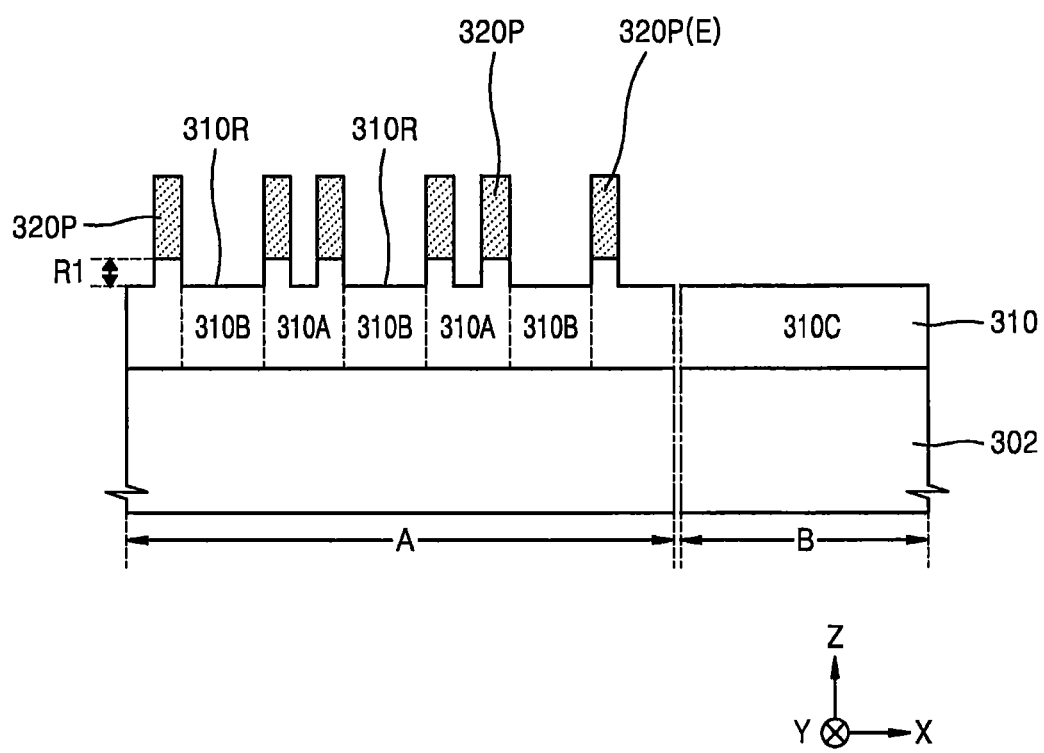

Referring to FIG. 21F, a low surface portion 310R is formed on the top surface of the feature layer 310 by removing the feature layer 310 that is exposed through the plurality of spaces between the plurality of first mask patterns 320P in the high-density area A and the feature layer 310 that is exposed in the low-density area B. The lower surface portion 310R may have a first depth R1 from the top surface of the feature layer 310.

A dry etching process may be performed in order to form the low surface portion 310R on the top surface of the feature layer 310. For example, during a dry etching process on the first mask layer 320 of FIG. 21E, the low surface portion 310R may be formed by performing over etching on the exposed feature layer 310 after the first mask patterns 320P are formed. Alternatively, a separate dry etching process for forming the low surface portion 310R may be additionally performed.

The low surface portion 310R may have the first depth R1 of 1 F.

In some embodiments, a process of forming the low surface portion 310R may be omitted.

Figure 21G:
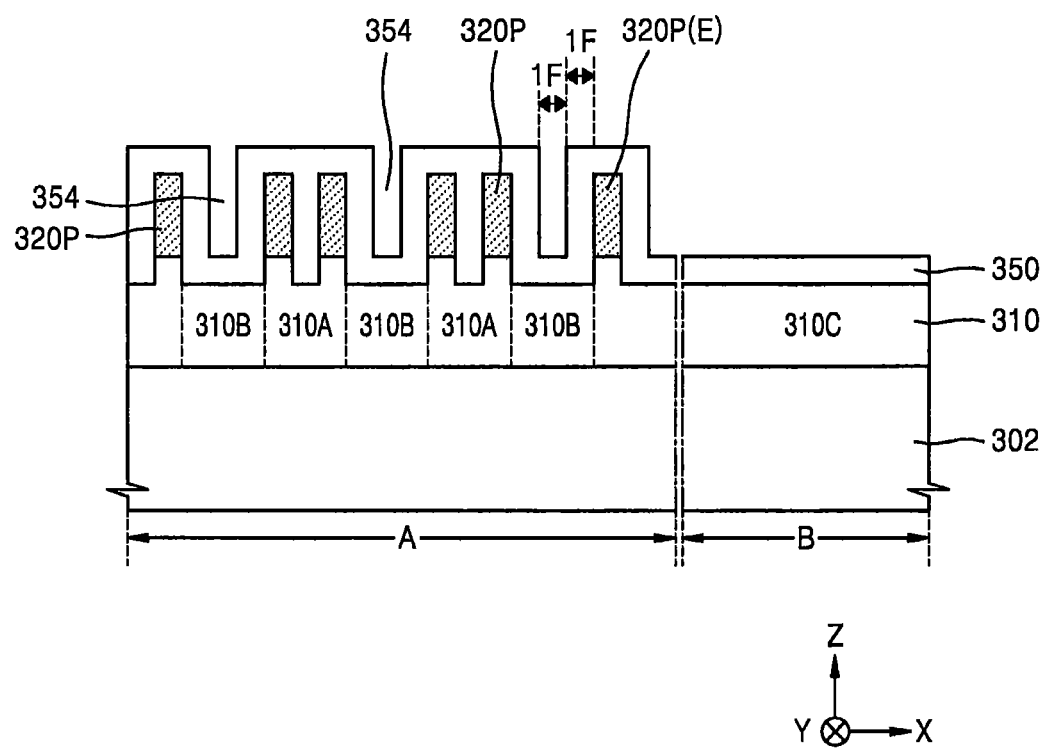

Referring to FIG. 21G, a buffer layer 350 that covers top surfaces and side walls of the plurality of first mask patterns 320P and the low surface portion 310R is formed on the feature layer 310 in the high-density area A and the low-density area B on the substrate 302.

The buffer layer 350 may be formed to cover the top surfaces and the side walls of the plurality of first mask patterns 320P and the low surface portion 310R with a uniform thickness. An ALD process may be used in order to form the buffer layer 350 having a uniform thickness.

The buffer layer 350 may be formed of substantially the same material as a material of the feature layer 310. For example, the buffer layer 350 may be formed of a silicon oxide film.

When the buffer layer 350 is formed to have a width of 1 F as shown in FIG. 21G, a space between two adjacent first mask patterns 320P, which has a width of 1 F, on each of the first regions 310A of the feature layer 310 from among the plurality of first mask patterns 320P is completely filled with the buffer layer 350. Also, only a space between two adjacent first mask patterns 320P, which has a width of 3 F, on each of the second regions 310B of the feature layer 310 is partially filled with the buffer layer 350. Accordingly, a plurality of recesses 354 are formed so that one recess 354 is disposed between two groups each of which includes two adjacent first mask patterns 320P on the second region 310B of the feature layer 310. When the buffer layer 350 is formed to have a width of 1 F, each of the plurality of recesses 354 may have a width of 1 F.

Figure 21H:
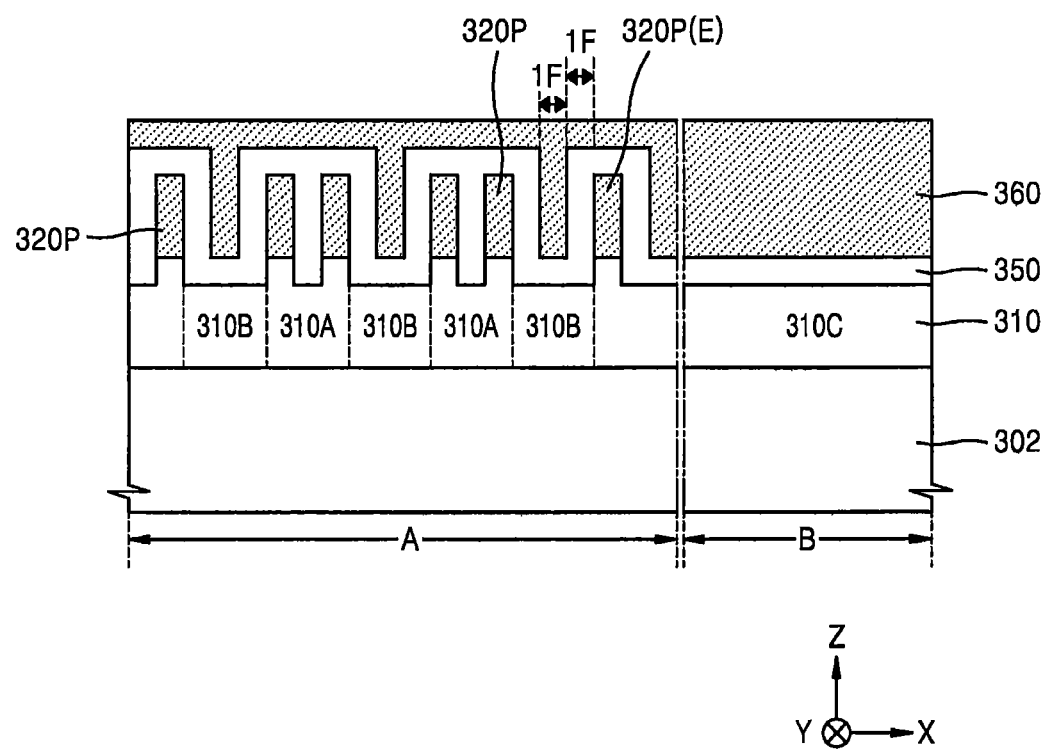

Referring to FIG. 21H, a second mask layer 360 is formed on the buffer layer 350 in the high-density area A and the low-density area B.

The second mask layer 360 may be formed on the second regions 310B of the feature layer 310 to completely fill the plurality of recesses 354 in FIG. 21G on the buffer layer 350.

The second mask layer 360 may be formed of a material having an etch selectivity with respect to the buffer layer 350. For example, the second mask layer 360 may be formed of polysilicon.

Figure 21I:
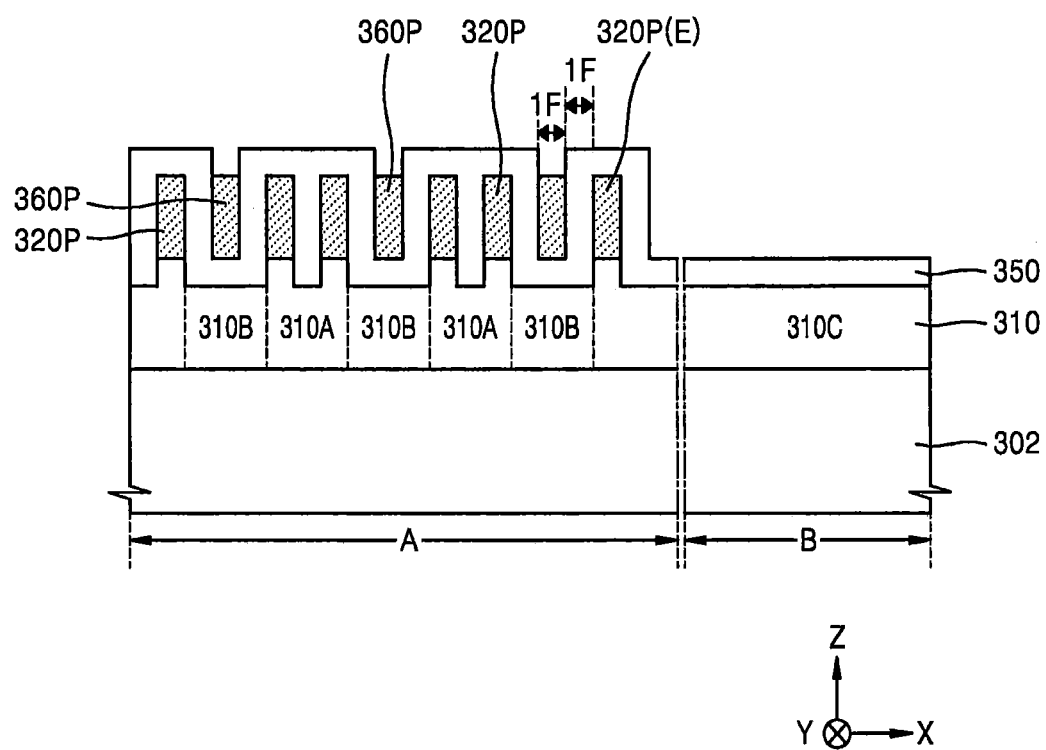

Referring to FIG. 21I, a plurality of second mask patterns 360P are formed in the plurality of recesses 354 in FIG. 21G by performing an etch-back process on the second mask layer 360 (see FIG. 21H) to expose a top surface of the buffer layer 350 in the high-density area A.

While the etch-back process is performed on the second mask layer 360, the amount of the second mask layer 360 that is removed may be adjusted so that top surfaces of the plurality of second mask patterns 360P that are obtained as a result are on substantially the same level as top surfaces of the plurality of first mask patterns 320P.

After the plurality of second mask patterns 360P are formed, a trimming process may be performed on the plurality of first mask patterns 320P and the plurality of second mask patterns 360P. Although not shown in FIG. 21I, portions of the plurality of first mask patterns 320P and the plurality of second mask patterns 360P may be removed during the trimming process.

Figure 21J:
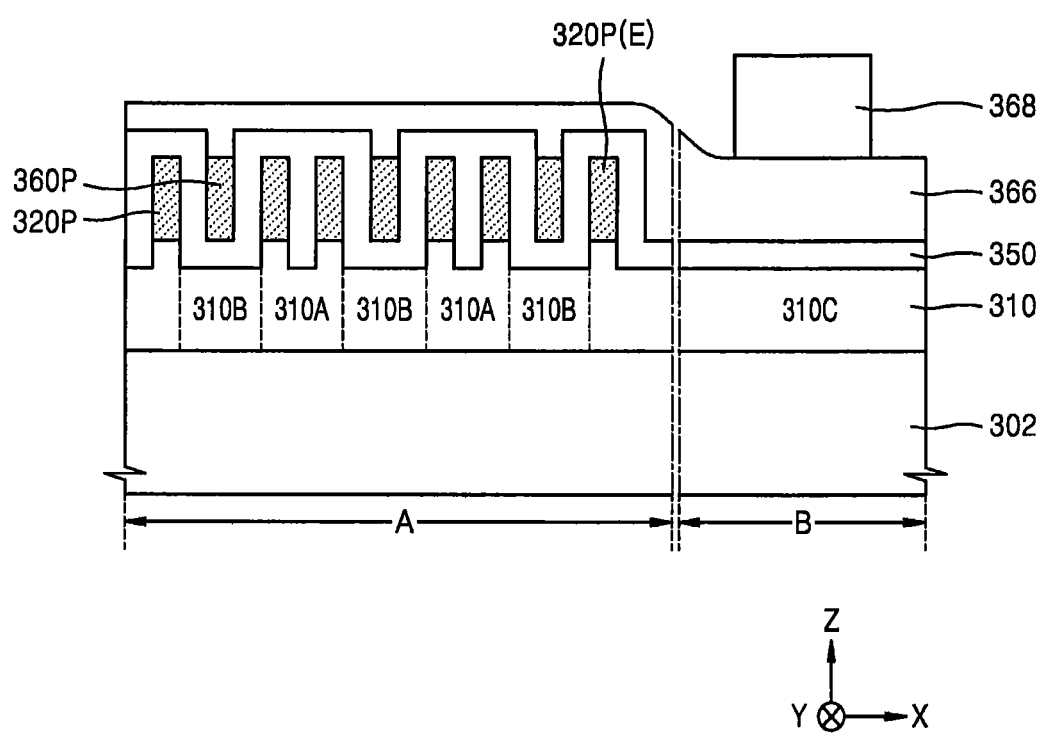

Referring to FIG. 21J, a third mask layer 366 that covers the buffer layer 350 is formed in the high-density area A and the low-density area B, and a fourth mask pattern 368 is formed on the third mask layer 366 on the third region 310C of the feature layer 310 in the low-density area B.

The third mask layer 366 may be formed of a material having an etch selectivity with respect to the buffer layer 350 and the feature layer 310. For example, the third mask layer 366 may be formed of an SOH film. The fourth mask pattern 368 may be formed of a material having an etch selectivity with respect to the third mask layer 366. For example, the fourth mask pattern 368 may be a photoresist pattern. The fourth mask pattern 368 may have a width that is greater than 1 F.

Figure 21K:
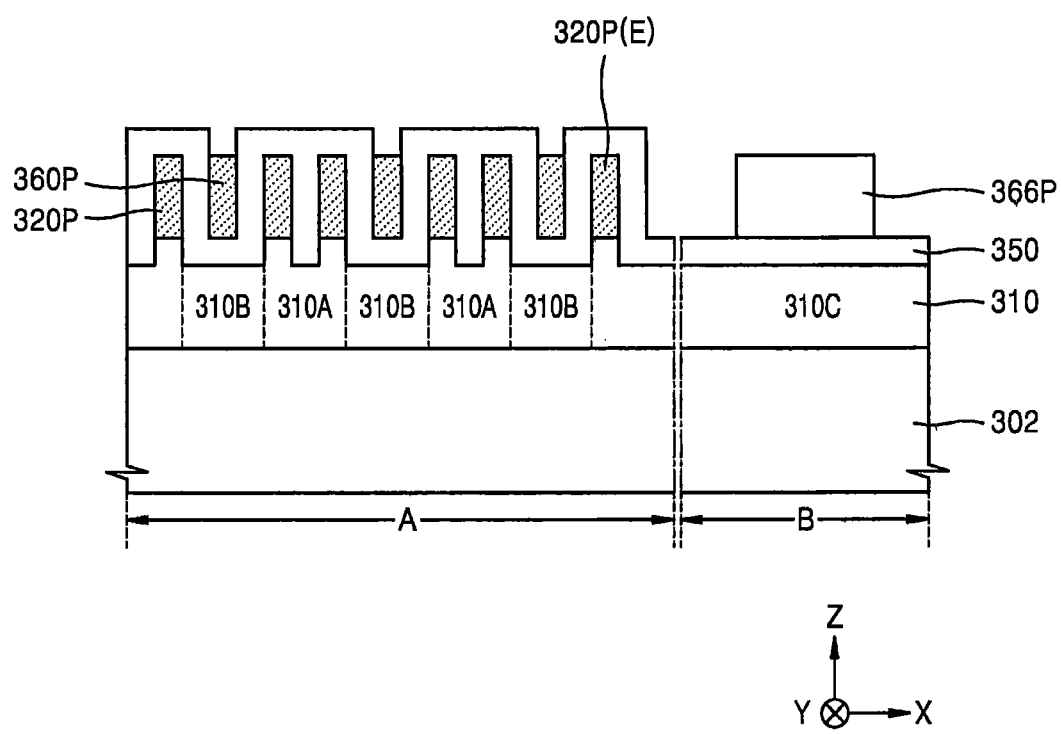

Referring to FIG. 21K, a third mask pattern 366P that covers the buffer layer 350 on the third region 310C of the feature layer 310 is formed by performing anisotropic etching on the third mask layer 366 by using the fourth mask pattern 368 as an etching mask.

The third mask pattern 366P may have a width that is greater than 1 F.

Figure 21L:
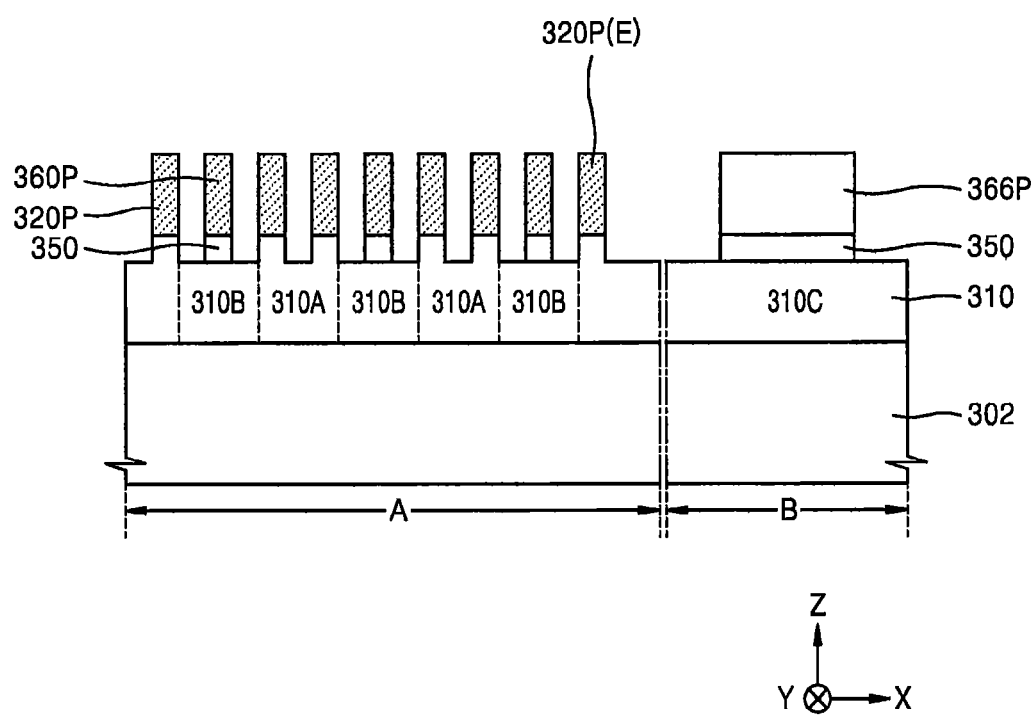

Referring to FIG. 21L, top surfaces and both side walls of the plurality of first mask patterns 320P and the plurality of second mask patterns 360P and a top surface of the feature layer 310 are exposed by etching the buffer layer 350 by using the plurality of first mask patterns 320P, the plurality of second mask patterns 360P, and the third mask pattern 366P as etching masks.

Figure 21M:
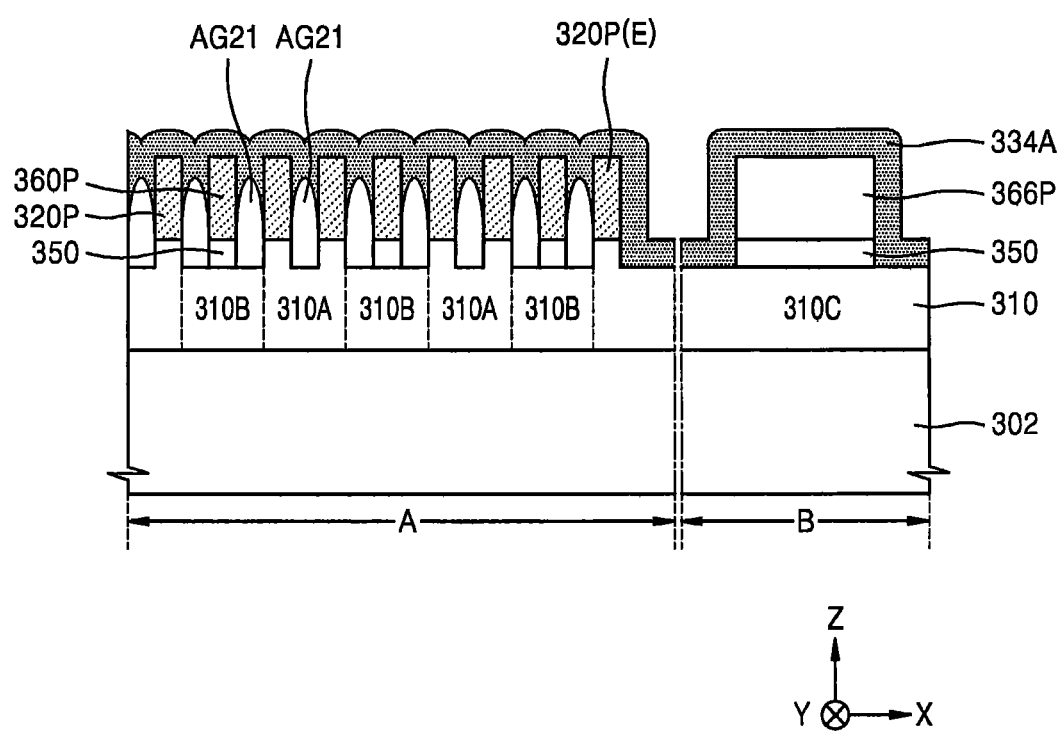

Referring to FIG. 21M, by using a process that is similar to a process of forming the additional spacer layer 134A of FIGS. 4A and 4B, an additional spacer layer 334A that covers the plurality of first mask patterns 320P, the plurality of second mask patterns 360P, and the third mask pattern 366P in the high-density area A and the low-density area B is formed.

The additional spacer layer 334A may be formed to have a non-uniform thickness.

The additional spacer layer 134A that is substantially the same as the additional spacer layer 334A has already been explained with reference to FIGS. 4A and 4B, and thus a detailed explanation of the additional spacer layer 334A will not be given.

After the additional spacer layer 334A is formed, a plurality of air gaps AG21 that are defined by the plurality of first mask patterns 320P, the plurality of second mask patterns 360P, and the additional spacer layer 334A may be formed in the high-density area A.

In the high-density area A, the plurality of air gaps AG21 may be formed so that two adjacent air gaps AG21 are disposed on both sides of one first mask pattern 320P or one second mask pattern 360P. In the high-density area A, side walls of the plurality of first mask patterns 320P and the plurality of second mask patterns 360P that face a relatively wide space may be covered by the additional spacer layer 334A. In the low-density area B, there may be no relatively narrow space between patterns that are covered by the additional spacer layer 334A, unlike in the high-density area A. Accordingly, no air gap may be formed between the additional spacer layer 334A and pattern structures that are covered by the additional spacer layer 334A in the low-density area B.

Figure 21N:
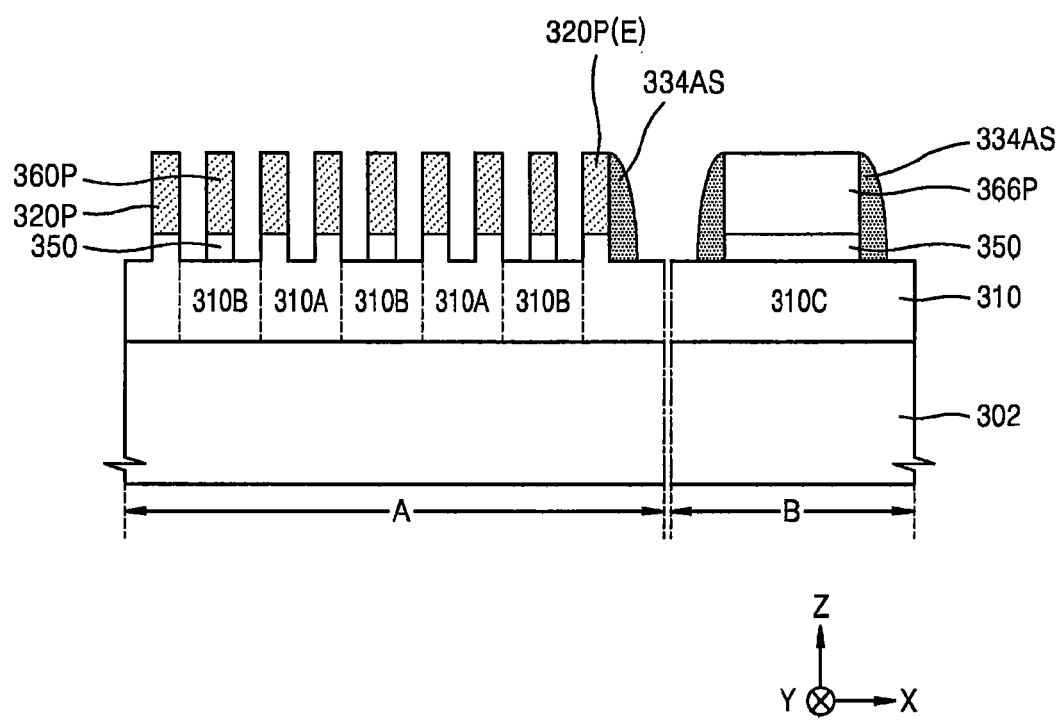
Figure 210:
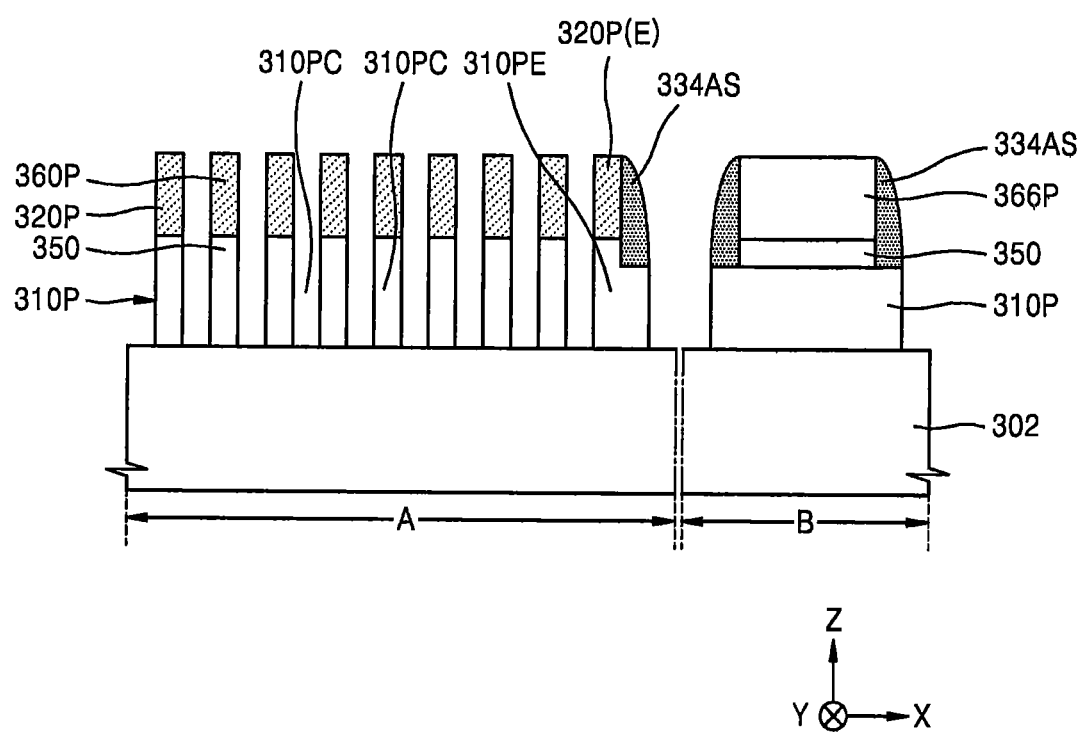

Referring to FIG. 21N, when an additional spacer 334AS is formed on an outer side wall that faces a relatively wide space, for example, an outer side wall of the outermost first mask pattern 320P(E) in FIG. 21N among the plurality of first mask patterns 320P and the plurality of second mask patterns 360P in the high-density area A, by performing an etch-back process on the additional spacer layer 334A, the additional spacer 334AS is formed on exposed side walls of the third mask pattern 366P in the low-density area B.

Referring to FIG. 21O, a plurality of feature patterns 310P are formed in the low-density area B and the high-density area A by etching the feature layer 310 by using the plurality of first mask patterns 320P, the plurality of second mask patterns 360P, the third mask pattern 366P, and the additional spacers 334AS that are formed on some side walls of the plurality of first mask patterns 320P, the plurality of second mask patterns 360P, and the third mask pattern 366P as etching masks, in the low-density area B and the high-density area A.

In the high-density area A, the plurality of feature patterns 310P include an edge feature pattern 310P(E) that is an outermost feature pattern among the plurality of feature patterns 310P and has a side wall that faces outside of the high-density area A, and a plurality of inner feature patterns 310PC that are formed inner than the edge feature pattern 310P(E).

In the high-density area A, the plurality of inner feature patterns 310PC may be formed to have a width of 1 F with a gap of 1 F therebetween.

In the low-density area B, the plurality of feature patterns 310P may be formed to have a width that is greater than 1 F.

The plurality of feature patterns 310P may constitute the plurality of line patterns 210 and the wide width pattern 220 of the semiconductor device 200A of FIG. 20.

In FIG. 21O, although the buffer layer 350, the plurality of first mask patterns 320P, the plurality of second mask patterns 360P, the third mask pattern 366P, and the plurality of additional spacers 334AS remain on the plurality of feature patterns 310P, the plurality of first mask patterns 320P, the plurality of second mask patterns 360P, the third mask pattern 366P, and the plurality of additional spacers 334AS may be partially or entirely removed during or after a process of etching the feature layer 310.

FIGS. 22A through 22G are cross-sectional views illustrating a method of manufacturing a semiconductor device 200B according to some embodiments of the inventive concept. In FIGS. 22A through 22G, cross-sectional views of the high-density area A and the low-density area B are illustrated, in a similar manner that of FIGS. 21A through 21O.

Figure 22A:
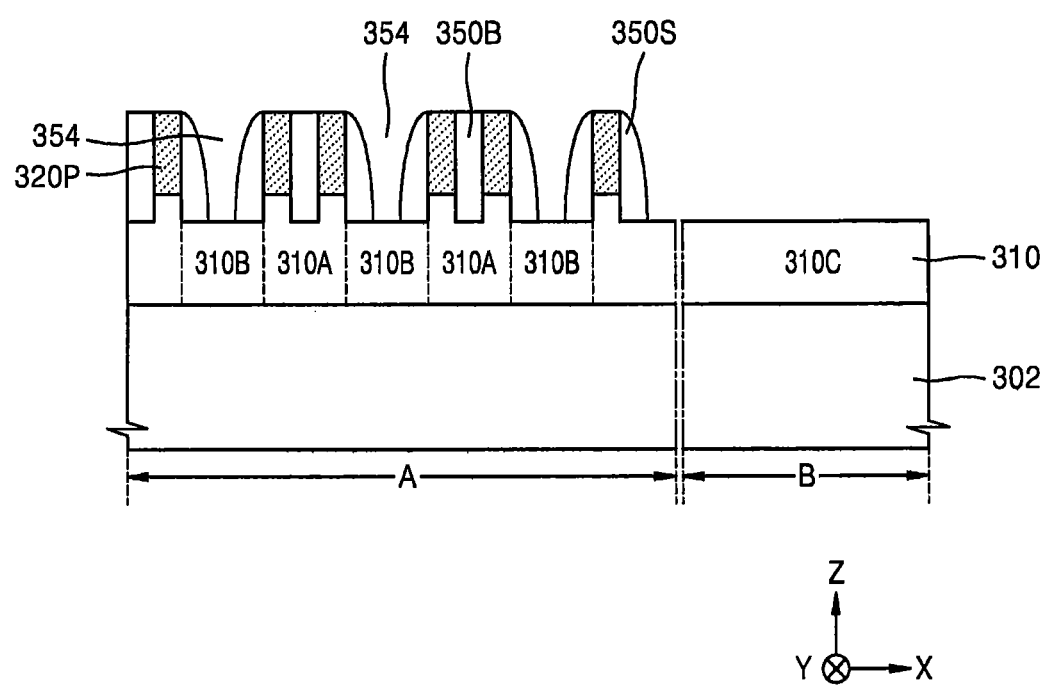
FIGS. 22A through 22G are cross-sectional views illustrating a method of manufacturing a semiconductor device according to some embodiments of the inventive concept.

Referring to FIG. 22A, as described above with reference to FIGS. 21A through 21O, the buffer layer 350 that covers top surfaces and side walls of the plurality of first mask patterns 320P and the low surface portion 310R is formed on the feature layer 310 in the high-density area A and the low-density area B on the substrate 302. Next, buffer spacers 350S are formed on side walls of the plurality of first mask patterns 320P that face the plurality of recesses 354 by performing an etch-back process on the buffer layer 350. A space between first mask patterns 320P having a relatively small distance therebetween among the plurality of first mask patterns 320P may be filled with a buffer buried layer 350B that is a remaining portion of the buffer layer 350.

Figure 22B:
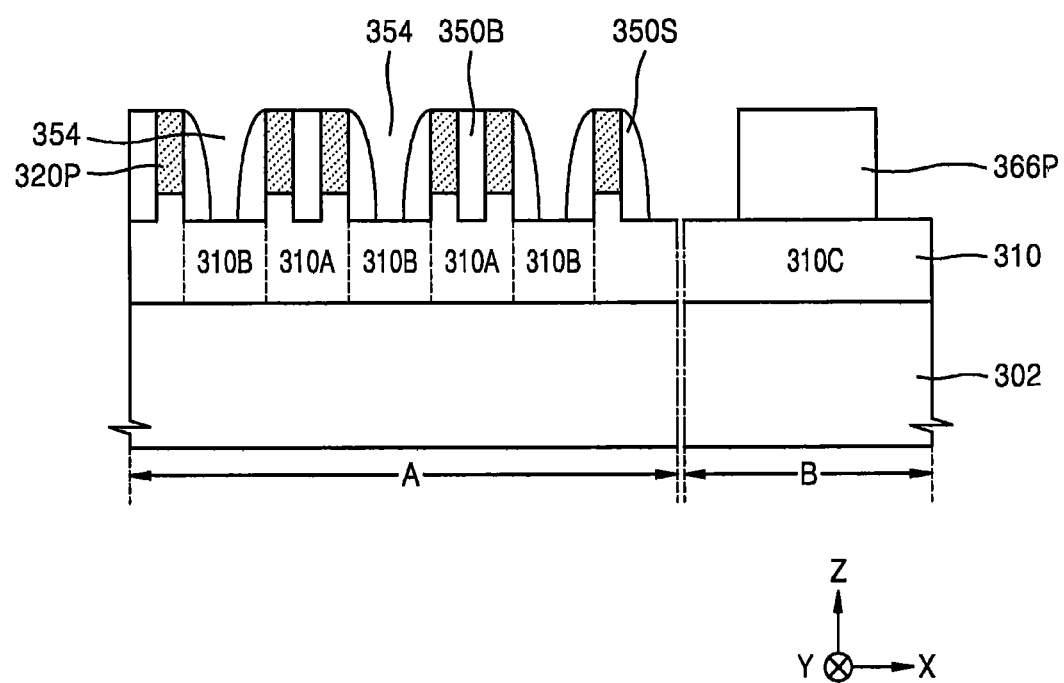

Referring to FIG. 22B, by using a process that is similar to that described with reference to FIGS. 21J and 21K, a third mask pattern 366P that covers the third region 310C of the feature layer 310 is formed.

Figure 22C:
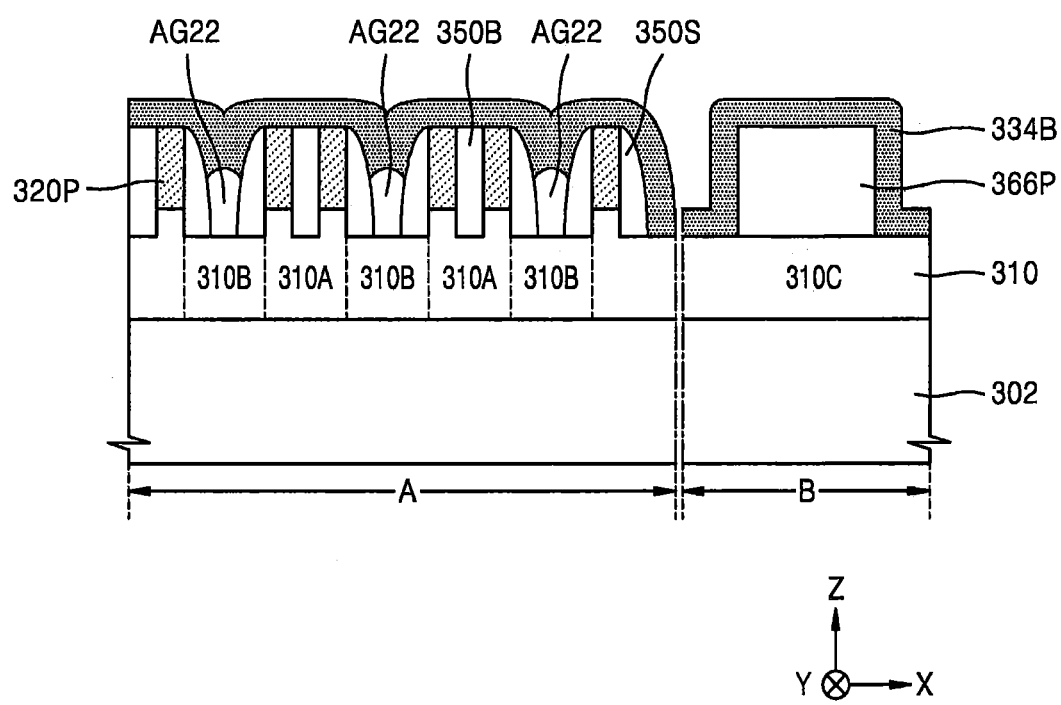

Referring to FIG. 22C, by using a process that is similar to a process of forming the additional spacer layer 334A of FIG. 21M, an additional spacer layer 334B that covers the plurality of first mask patterns 320P, the plurality of buffer spacers 350S, a plurality of the buffer buried layers 350B, and the third mask pattern 366P is formed in the high-density area A and the low-density area B.

The additional spacer layer 334B may be formed to have a non-uniform thickness.

A process of forming the additional spacer layer 134A that is substantially the same as the additional spacer layer 334B has already been explained with reference to FIGS. 4A and 4B, and thus a detailed explanation of the additional spacer layer 334B will not be given.

After the additional spacer layer 334B is formed, a plurality of air gaps AG22 each of which are defined by two adjacent buffer layer 350S and the additional spacer layer 334B may be formed in the high-density area A.

No air gap may be formed between the additional spacer layer 334B and the third mask pattern 366P in the low-density area B.

Figure 22D:
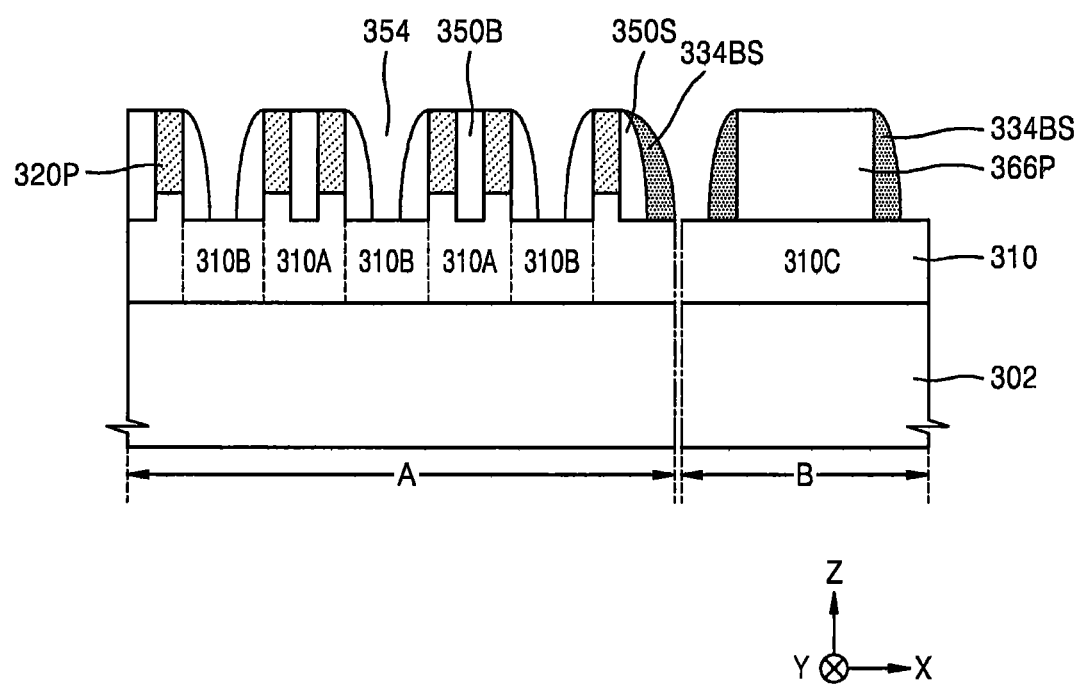

Referring to FIG. 22D, a plurality of additional spacers 334BS are formed by performing an etch-back process on the additional spacer layer 334B.

One among the additional spacers 334BS may be formed to cover the buffer spacer 350S that covers an outer side wall of an outermost first mask pattern 320P among the plurality of first mask patterns 320P in the high-density area A. Others among the additional spacer 334BS may be formed to cover exposed side surfaces of the third mask pattern 366P in the low-density area B.

Figure 22E:
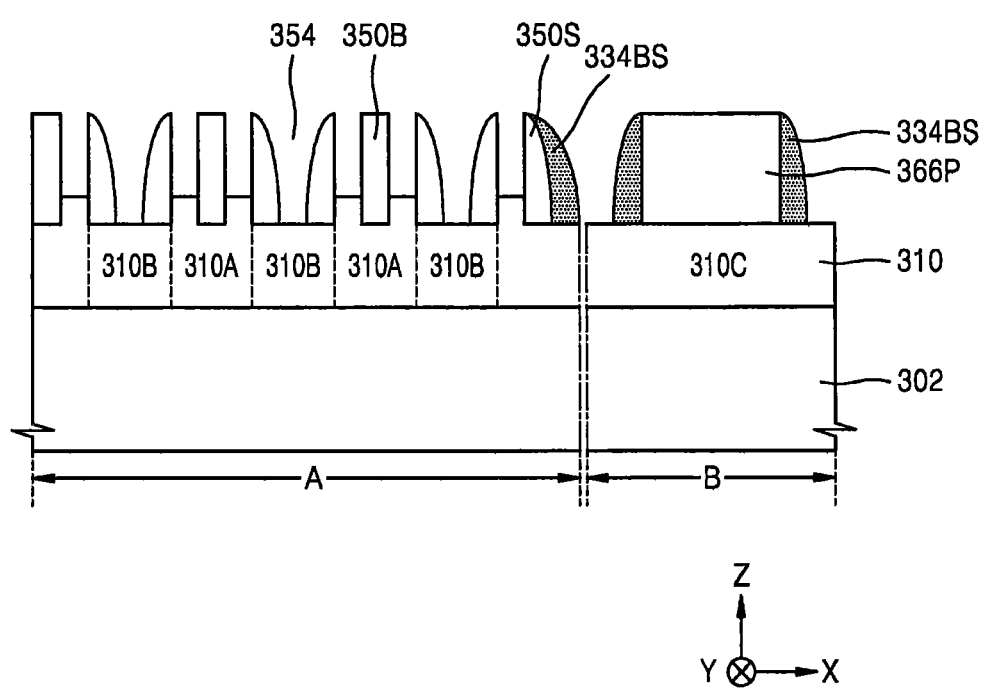

Referring to FIG. 22E, the plurality of first mask patterns 320P are removed from a resultant structure of FIG. 22D.

Figure 22F:
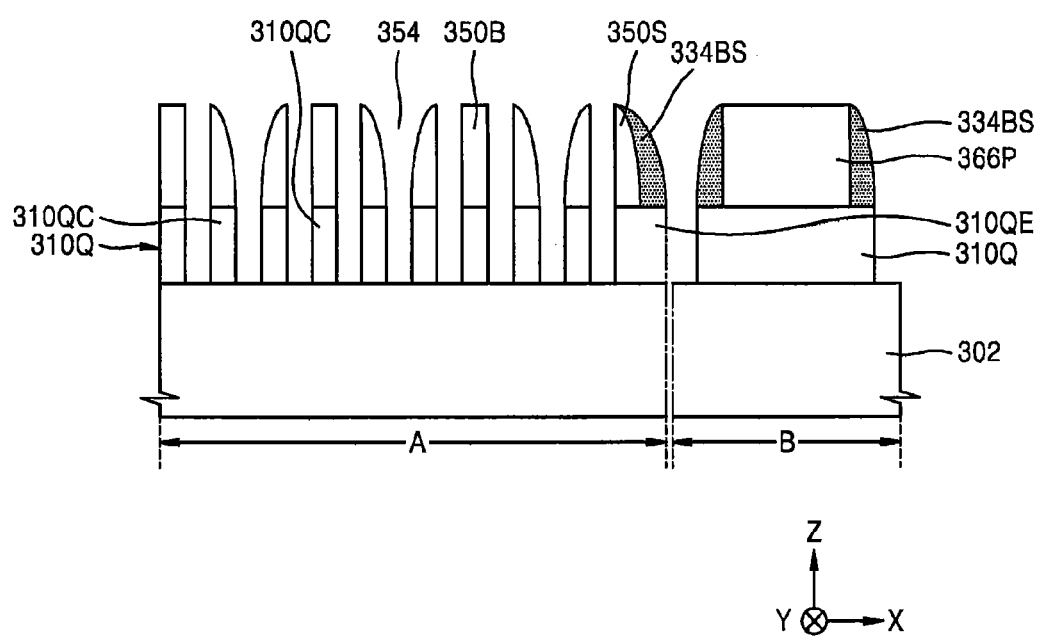

Referring to FIG. 22F, a plurality of feature patterns 310Q are formed in the low-density area B and the high-density area A by etching the feature layer 310 by using the plurality of buffer spacers 350S, the plurality of additional spacers 334BS, the plurality of buffer buried layers 350B, and the third mask pattern 366P as etching masks.

In the high-density area A, the plurality of feature patterns 310Q include an edge feature pattern 310QE that is an outermost feature pattern among the plurality of feature patterns 310Q and has a side wall that faces outside of the high-density area A, and a plurality of inner feature patterns 320QC that are formed inner than the edge feature pattern 310QE.

In the high-density area A, the plurality of inner feature patterns 320QC may be formed to have a width of 1 F with a gap of 1 F therebetween.

In the low-density area B, the plurality of feature patterns 310Q may be formed to have a width that is greater than 1 F.

Figure 22G:
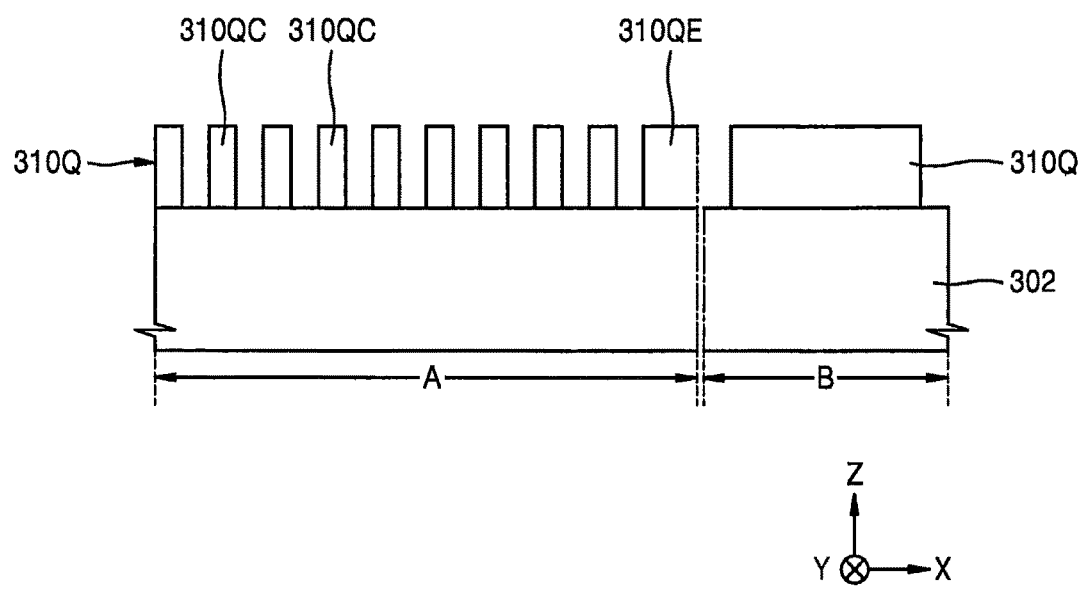

Referring to FIG. 22G, top surfaces of the plurality of feature patterns 310Q are exposed by removing residual materials remaining on the plurality of feature patterns 310Q.

Figure 23A:
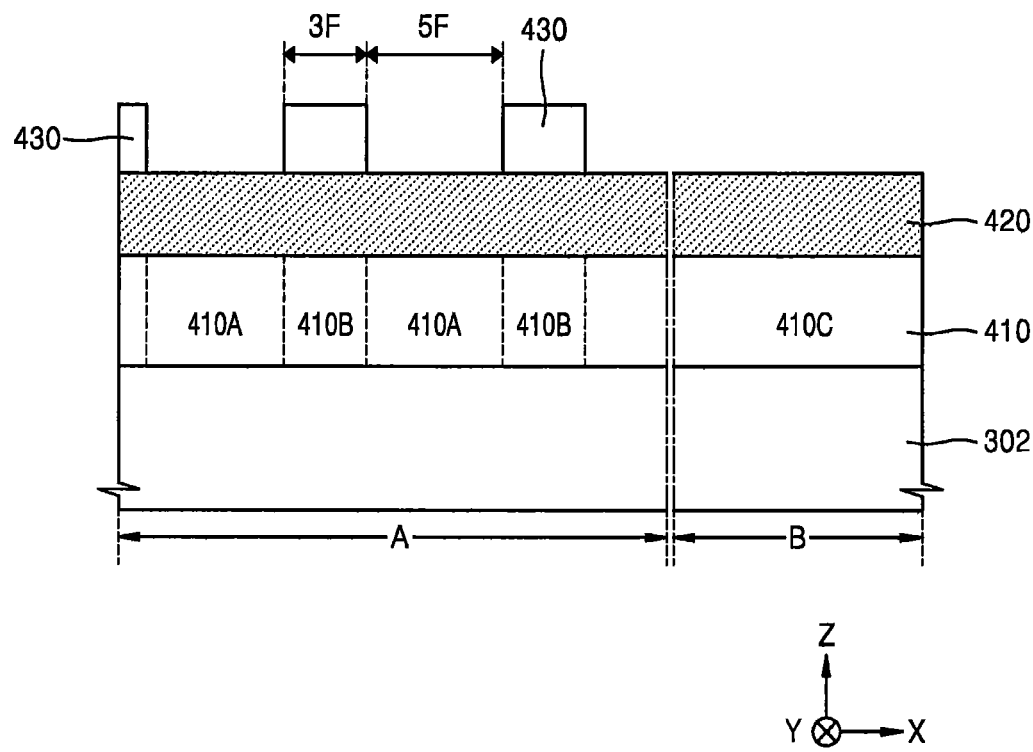
FIGS. 23A through 23N are cross-sectional views illustrating a method of manufacturing a semiconductor device according to some embodiments of the inventive concept.
Figure 23B:
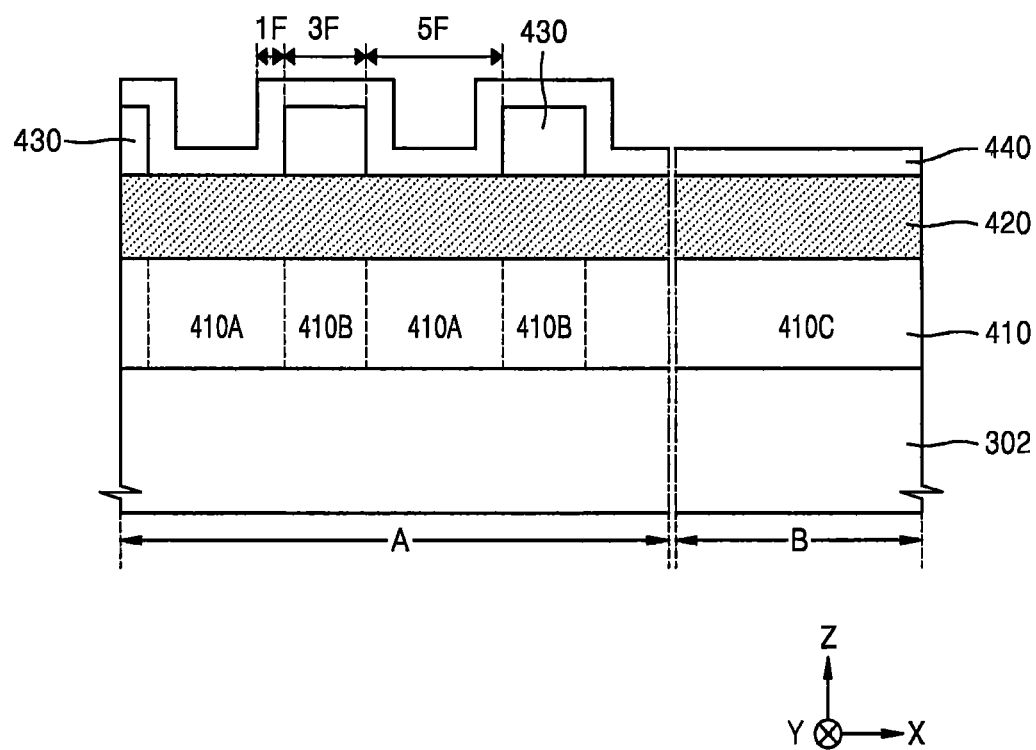
Figure 23C:
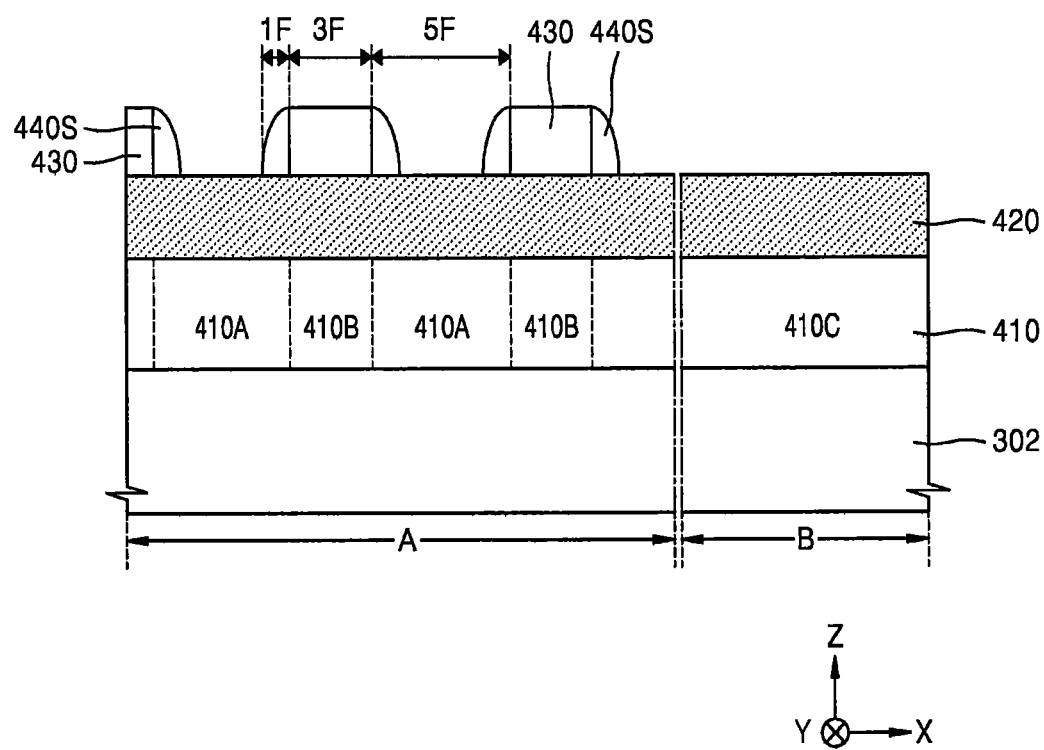
Figure 23D:
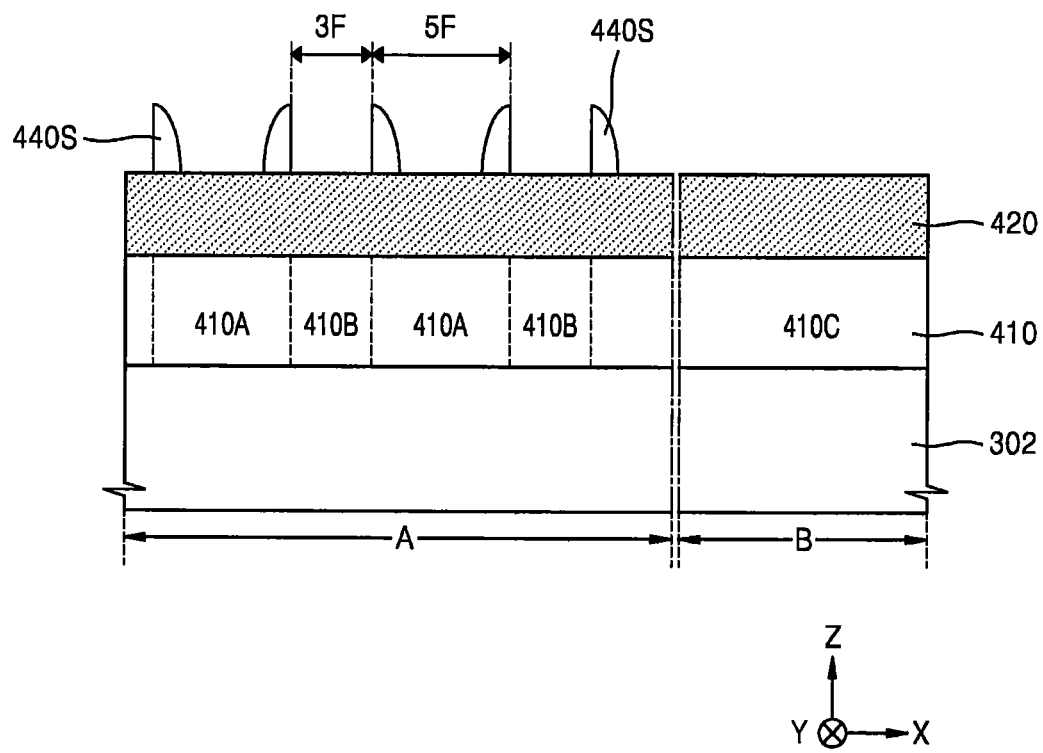
Figure 23E:
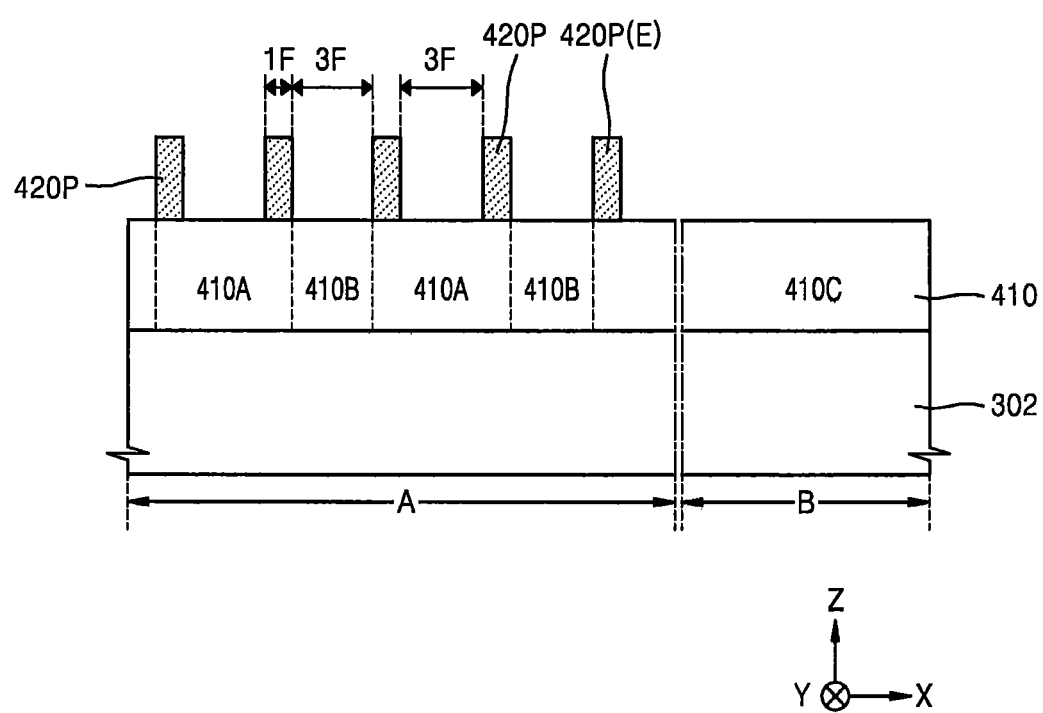
Figure 23F:
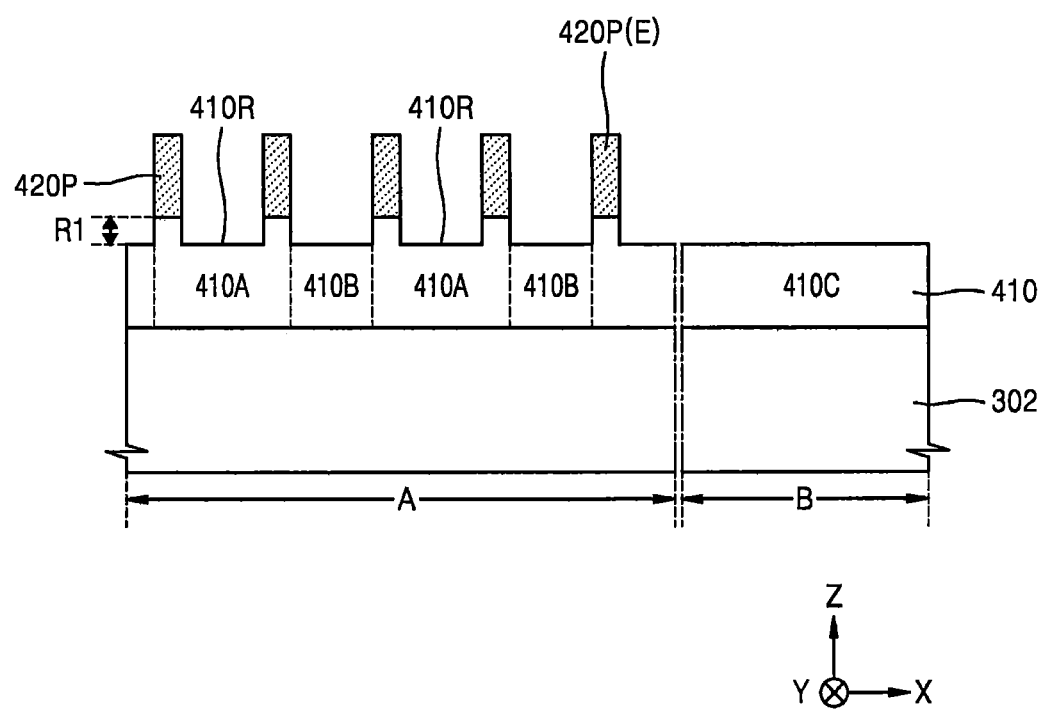
Figure 23G:
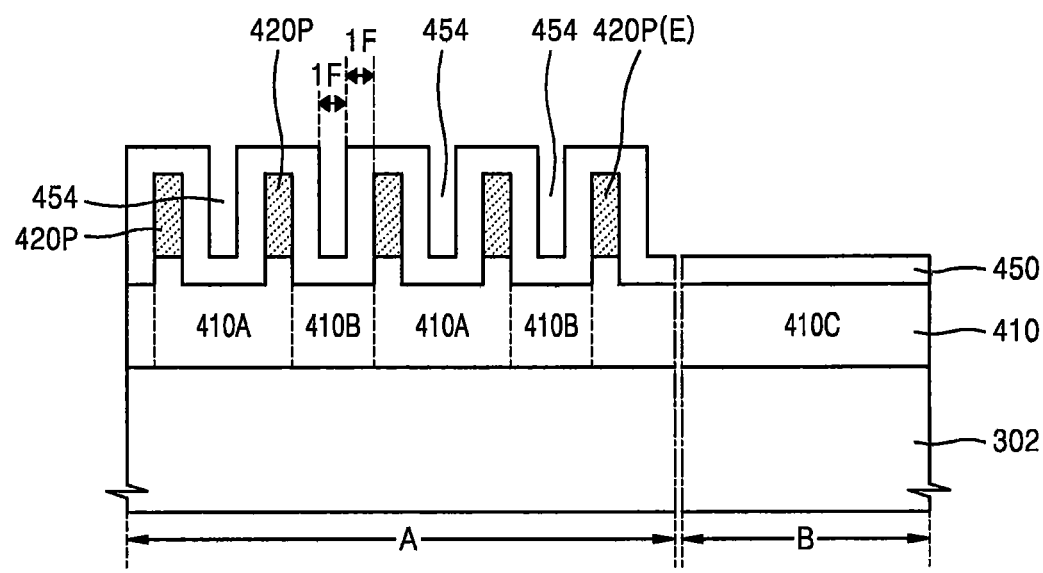
Figure 23H:
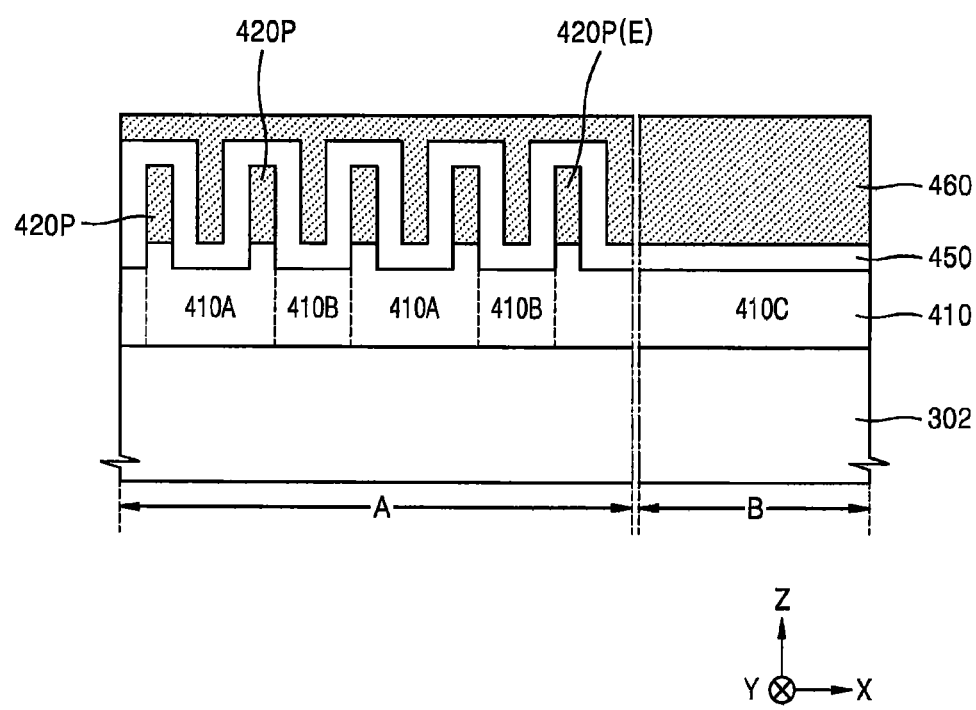
Figure 23I:
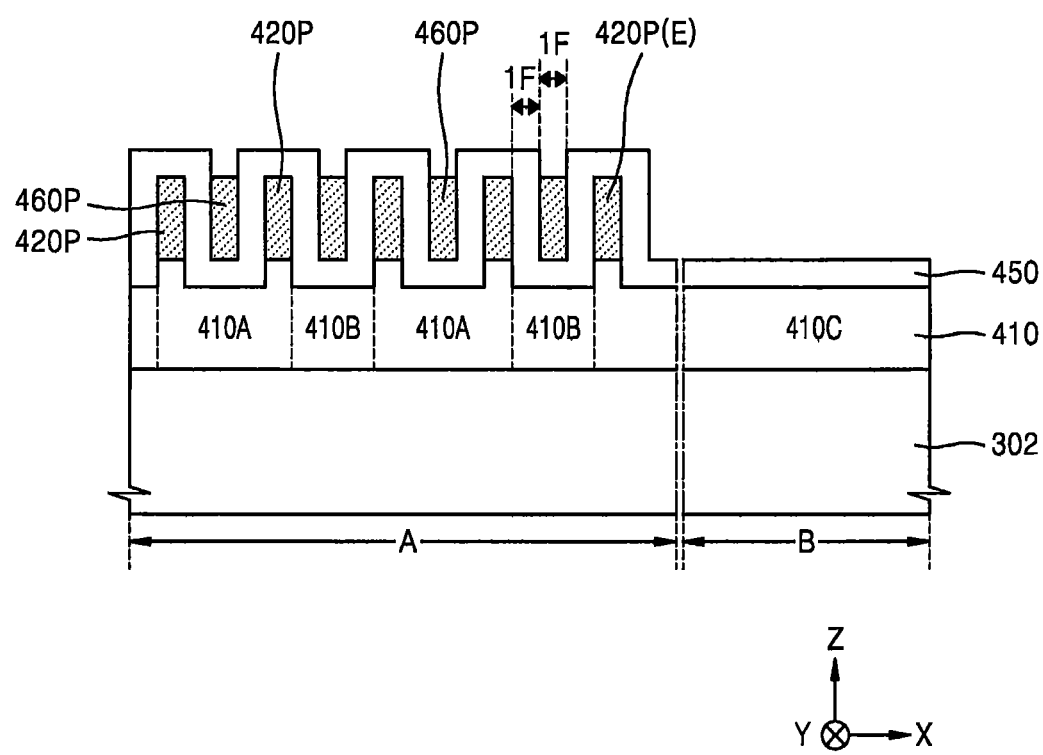
Figure 23J:
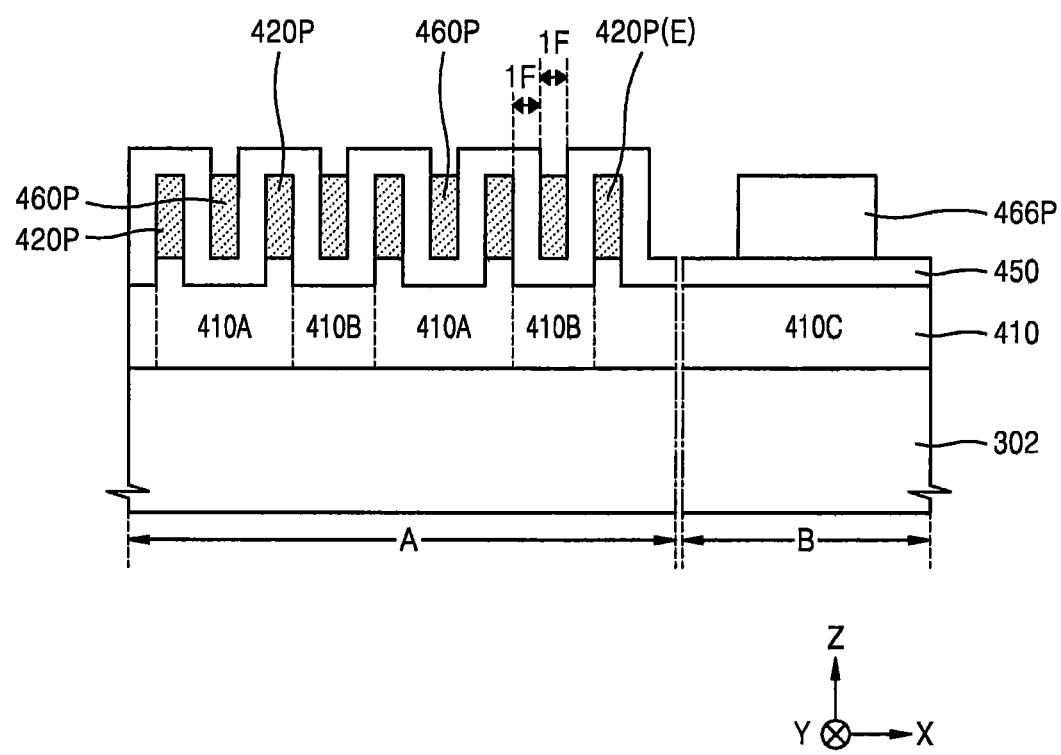
Figure 23K:
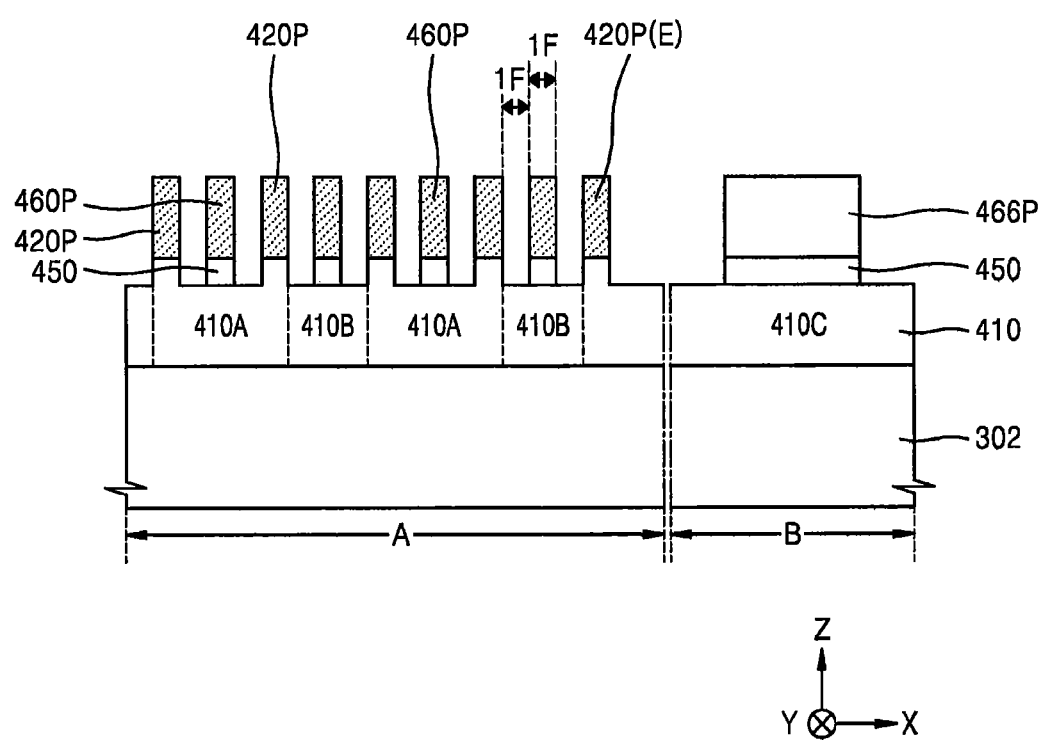
Figure 23L:
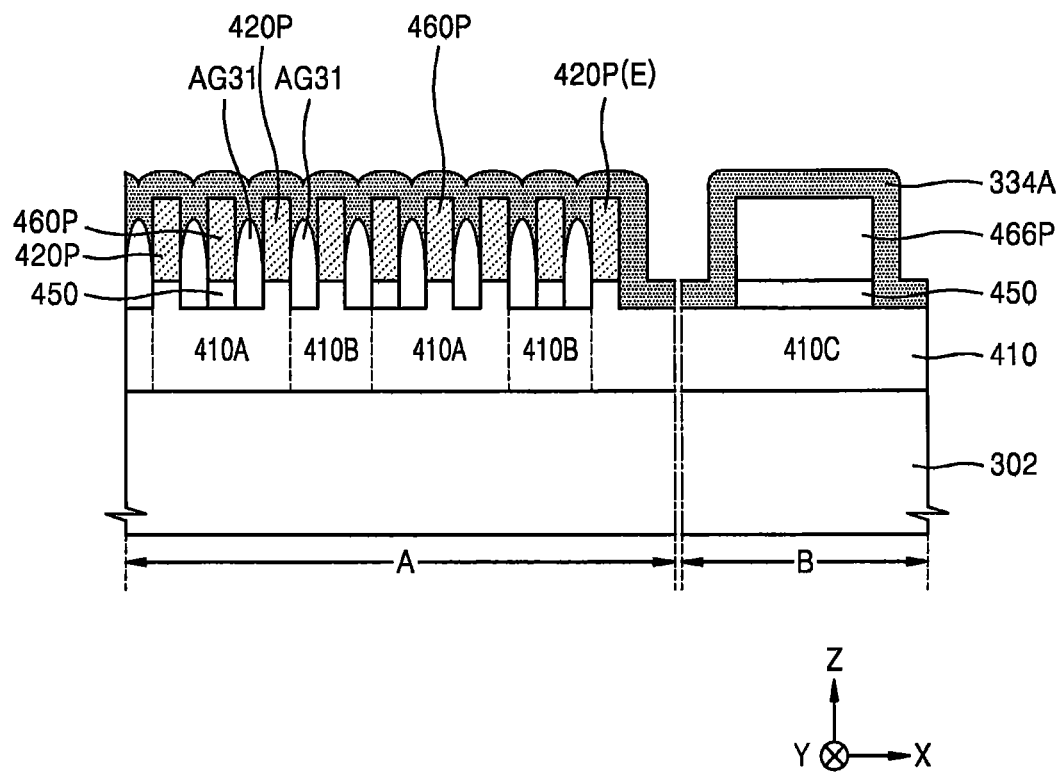
Figure 23M:
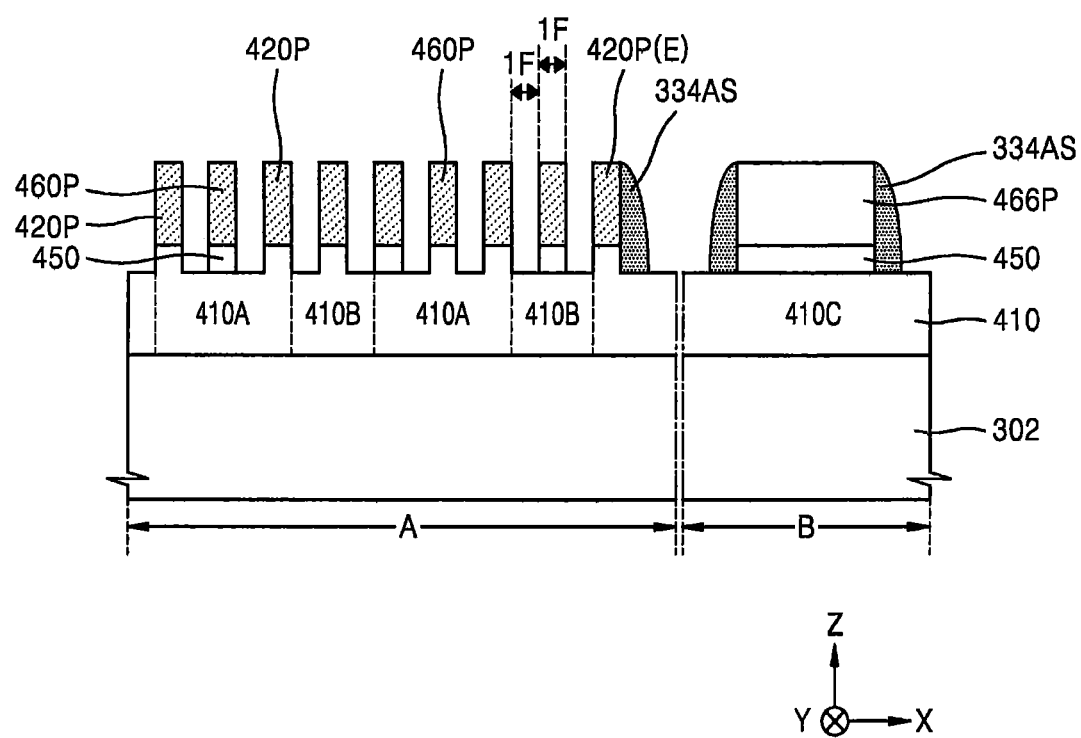
Figure 23N:
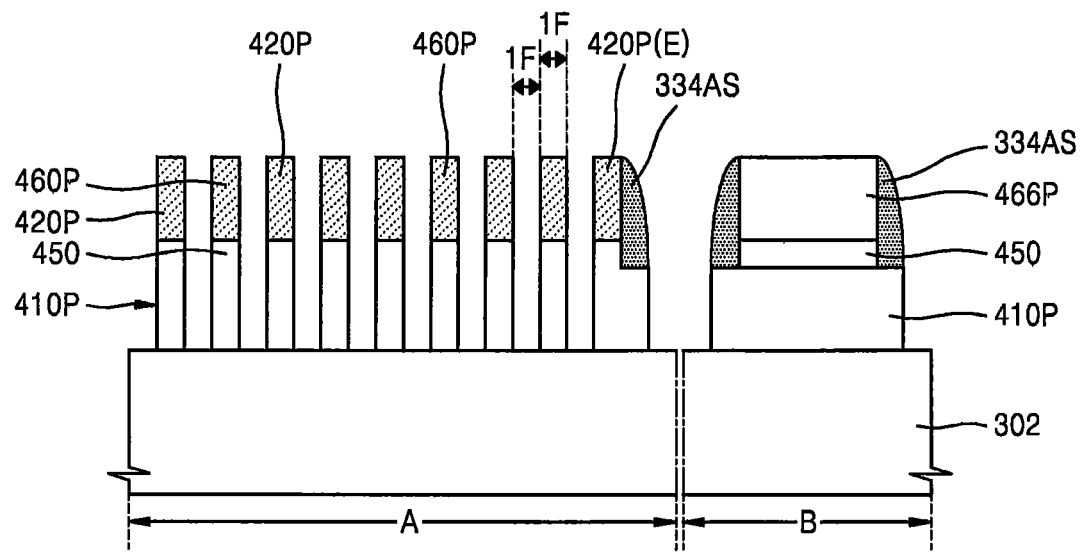

FIGS. 23A through 23N are cross-sectional views illustrating a method of manufacturing a semiconductor device 200A according to some embodiments of the inventive concept.

A method of manufacturing the semiconductor device 200A of FIG. 20 according to some embodiments will now be explained with reference to FIGS. 23A through 23N.

Referring to FIG. 23A, a feature layer 410 and a first mask layer 420 are sequentially formed on the substrate 302 in the high-density area A and the low-density area B, and a plurality of reference structures 430 are formed on the first mask layer 420.

The feature layer 310 and the first mask layer 320 that are respectively substantially the same as the feature layer 410 and the first mask layer 420 have already been explained with reference to FIG. 21A, and thus a detailed explanation of the feature layer 410 and the first mask layer 420 will not be given.

In the high-density area A, first regions 410A and second regions 410B of the feature layer 410 each having a width that is at least three times greater than a width of a fine pattern to be finally formed on the feature layer 410 may be alternately disposed on the substrate 302. In the low-density area B, the feature layer 410 includes a third region 410C that is spaced apart from the first regions 410A and the second regions 410B that are disposed in the high-density area A.

In some embodiments, each of the first regions 410A of the feature layer 410 may have a width of 5 F, and each of the second regions 410B may have a width of 3 F as illustrated in FIG. 23B.

The plurality of reference structures 430 may be formed on the first mask layer 420 only in the high-density area A, and may not be formed in the low-density area B. The plurality of reference structures 430 may be formed on the second regions 410B of the feature layer 410 to have substantially the same width (e.g., a width of 3 F) as a width of each of the second regions 410B and to cover the first mask layer 420. Spaces may be formed between the plurality of reference structures 430 to have substantially the same width (e.g., a width of 5 F) as a width of each of the first regions 410A and may be disposed to correspond to the first regions 410A of the feature layer 410. The first mask layer 420 may be exposed through each of the plurality of spaces between the plurality of reference structures 430, each of the plurality of spaces may have a width of 5 F.

The plurality of reference structures 330 that are substantially the same as the plurality of reference structures 430 have already been explained with reference to FIG. 21A, and thus a detailed explanation of the plurality of reference structures 430 will not be given.

Referring to FIG. 23B, a spacer layer 440 that covers exposed surfaces of the plurality of reference structures 430 and an exposed surface of the first mask layer 420 is formed in the high-density area A and the low-density area B. The spacer layer 440 may have a uniform thickness in the high-density area A and the low-density area B. The spacer layer 440 may have a thickness of 1 F. The spacer layer 340 that is substantially the same as the spacer layer 430 has already been explained with reference to FIG. 21B, and thus a detailed explanation of the spacer layer 430 will not be given.

Referring to FIG. 23C, a plurality of spacers 440S that cover both side walls of the plurality of reference structures 430 are formed in the high-density area A by performing an etch-back process on the spacer layer 440 until a top surface of the first mask layer 420 is exposed.

Each of the plurality of spacers 440S may be formed to cover both side walls of the plurality of reference structures 430 with a width of 1 F as illustrated in FIG. 23C.

Referring to FIG. 23D, the plurality of reference structures 430 are removed from a resultant structure of FIG. 23C.

Referring to FIG. 23E, a plurality of first mask patterns 420P are formed in the high-density area A by etching the first mask layer 420 in the high-density area A and the low-density area B by using the plurality of spacers 440S as etching masks.

In FIG. 23E, the plurality of first mask patterns 420P that are formed in the high-density area A include an outermost first mask pattern 420P(E).

Each of the plurality of first mask patterns 420P may have a width of 1 F. The first regions 410A and the second regions 410B of the feature layer 410 are alternately exposed through a plurality of spaces between the plurality of first mask patterns 420P. In some embodiments, each of the plurality of spaces between the plurality of first mask patterns 420P may have a width of 3 F as illustrated in FIG. 23E.

After the plurality of first mask patterns 420P are formed, the top surface of the feature layer 410 may be exposed in the low-density area B.

Referring to FIG. 23F, a low surface portion 410R is formed on the top surface of the feature layer 410 by removing the feature layer 410 that is exposed through the plurality of spaces between the plurality of first mask patterns 420P in the high-density area A and the feature layer 410 that is exposed in the low-density area B. The low surface portion 410R may have the first depth R1 from the top surface of the feature layer 410.

The low surface portion 410R may have the first depth R1 of 1 F.

In some embodiments, a process of forming the low surface portion 410R may be omitted.

Referring to FIG. 23G, a buffer layer 450 that covers top surfaces and side walls of the plurality of first mask patterns 420P and the low surface portion 410R is formed on the feature layer 410 in the high-density area A and the low-density area B on the substrate 302. The buffer layer 450 may have a uniform thickness.

The buffer layer 350 that is substantially the same as the buffer layer 450 has already been explained with reference to FIG. 21G, and thus a detailed explanation of the buffer layer 450 will not be given.

When the buffer layer 450 is formed to have a width of 1 F as shown in FIG. 23G, a space between two adjacent first mask patterns 420P on each of the first regions 410A and the second regions 410B of the feature layer 410 among the plurality of first mask patterns 420P is partially filled with the buffer layer 450, and recesses 454 remain on the buffer layer 450 so that one recess 454 is disposed between two adjacent first mask patterns 420P. When the buffer layer 450 is formed to have a width of 1 F, each of the plurality of recesses 454 may have a width of 1 F.

Referring to FIG. 23H, a second mask layer 460 is formed on the buffer layer 450 in the high-density area A and the low-density area B.

The second mask layer 460 may be formed on the first regions 410A and the second regions 410B of the feature layer 410 to completely fill the plurality of recesses 454 (see FIG. 23G) each of which is between two adjacent first mask patterns 420P on the buffer layer 450.

The second mask layer 360 that is substantially the same as the second mask layer 460 has already been explained with reference to FIG. 21H, and thus a detailed explanation of the second mask layer 460 will not be given.

Referring to FIG. 23I, a plurality of second mask patterns 460P are formed in the plurality of recesses 454 (see FIG. 23G) by performing an etch-back process on the second mask layer 460 to expose a top surface of the buffer layer 450 in the high-density area A.

During the etch-back process on the second mask layer 460, the amount of the second mask layer 460 that is removed may be adjusted so that top surfaces of the plurality of second mask patterns 460P that are obtained as a result are on substantially the same level as top surfaces of the plurality of first mask patterns 420P.

Referring to FIG. 23J, by using substantially the same process as that described with reference to FIGS. 21J and 21K, a third mask pattern 466P that covers the buffer layer 450 on the third region 410C of the feature layer 410 is formed. The third mask pattern 466P may be substantially the same as the third mask pattern 366P of FIG. 21K.

The third mask pattern 466P may have a width that is greater than 1 F.

Although not shown in FIG. 23J, before the third mask pattern 466P is formed, a trimming process for removing portions of the plurality of first mask patterns 420P and the plurality of second mask patterns 460P may be performed.

Referring to FIG. 23K, top surfaces and both side surfaces of the plurality of first mask patterns 420P, the plurality of second mask patterns 460P, and the third mask pattern 466P and a top surface of the feature layer 410 are exposed by etching the buffer layer 450 by using the plurality of first mask patterns 420P, the plurality of second mask patterns 460P, and the third mask pattern 466P as etching masks.

Referring to FIG. 23L, by using substantially the same process as that described with reference to FIG. 21M, the additional spacer layer 334A that covers the plurality of first mask patterns 420P, the plurality of second mask patterns 460P, and the third mask pattern 466P in the high-density area A and the low-density area B is formed.

After the additional spacer layer 334A is formed, a plurality of air gaps AG31 that are defined by the plurality of first mask patterns 420P, the plurality of second mask patterns 460P, and the additional spacer layer 334A in the high-density area A may be formed.

Referring to FIG. 23M, when the additional spacer 334AS is formed on an outer side wall that faces a relatively wide space, for example, an outer side wall of the outermost first mask pattern 420P(E) in FIG. 23M among the plurality of first mask patterns 420P and the plurality of second mask patterns 460P in the high-density area A, by performing an etch-back process on the additional spacer layer 334A, the additional spacer 334AS is formed on exposed side walls of the third mask pattern 466P in the low-density area B.

Referring to FIG. 23N, a plurality of feature patterns 410P are formed in the low-density area B and the high-density area A by etching the feature layer 410 by using the plurality of first mask patterns 420P, the plurality of second mask patterns 460P, the third mask pattern 466P, and the additional spacers 334AS that are formed on some side walls of the plurality of first mask patterns 420P, the plurality of second mask patterns 460P, and the third mask pattern 466P as etching masks, in the low-density area B and the high-density area A.

The plurality of feature patterns 410P may correspond to the plurality of feature patterns 310P of FIG. 21O.

Although the buffer layer 450, the plurality of first mask patterns 420P, the plurality of second mask patterns 460P, the third mask pattern 466P, and the plurality of additional spacers 334AS remain on the plurality of feature patterns 410P in FIG. 23N, the buffer layer 450, the plurality of first mask patterns 420P, the plurality of second mask patterns 460P, the third mask pattern 466P, and the plurality of additional spacers 334AS may be partially or entirely removed during or after a process of etching the feature layer 410.

Figure 24A:
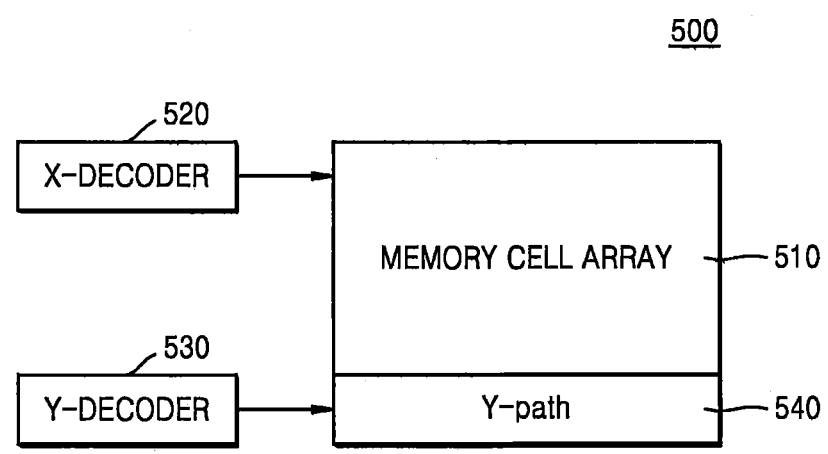
FIG. 24A is a block diagram illustrating a semiconductor device according to some embodiments of the inventive concept.

FIG. 24A is a block diagram illustrating a semiconductor device 500 according to some embodiments of the inventive concept.

Figure 24B:
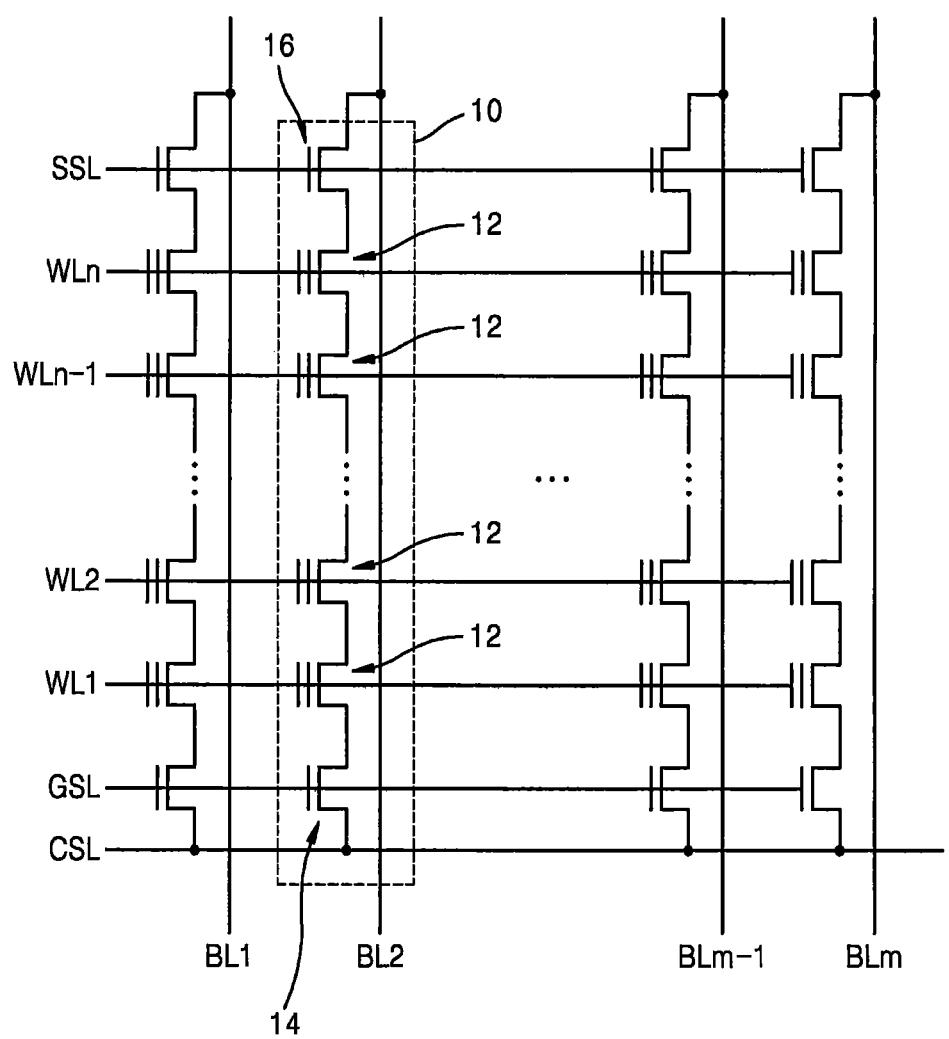
FIG. 24B is a circuit diagram illustrating a memory cell array that is included in the semiconductor device of FIG. 24A.

FIG. 24B is a circuit diagram illustrating a memory cell array 510 that is included in the semiconductor device 500 of FIG. 24A.

Referring to FIGS. 24A and 24B, the semiconductor device 500 may be a NAND flash memory device. The semiconductor device 500 includes the memory cell array 510 including an array of memory cells that are arranged at a high density. A peripheral circuit for accessing and driving the memory cell array 510 includes an X-decoder block 520 that selects any of word lines, for example, word lines WL1, WL2, ..., WLn−1, and WLn, of the memory cell array 510 to be accessed. A Y-decoder block 530 selects any of bit lines, for example, bit lines BL1, BL, . . . , BLm−1, and BLm, of the memory cell array 510 to be activated. A Y-path circuit 540 that is connected to the memory cell array 510 allocates a bit line path based on an output of the Y-decoder block 530.

Referring to FIG. 24B, a cell string 10 of the memory cell array 510 includes a plurality of memory cells 12 that are serially connected. Gate electrodes of the plurality of memory cells 12 that are included in one cell string 10 are connected to different word lines WL1, WL2, . . . , WLn−1, and WLn. A ground selection transistor 14 that is connected to a ground selection line GSL and a string selection transistor 16 that is connected to a string selection line SSL are disposed at both ends of the cell string 10. The ground selection transistor 14 and the string selection transistor 16 control electrical connection between the plurality of memory cells 12, the bit lines BL1, BL2, . . . , BLm−1, and BLm, and a common source line CSL. Memory cells that are connected to one word line WL1, WL2, . . . , WLn−1, or WLn across a plurality of the cell strings 10 form a page unit or a byte unit.

In order to perform a read operation or a write operation by selecting a predetermined memory cell in the semiconductor device 500 of FIG. 24A, the predetermined memory cell is selected by selecting any of the word lines WL1, WL2, . . . , WLn−1, and WLn and the bit lines BL1, BL2, . . . , BLm−1, and BLm by using the X-decoder block 520 and the Y-decoder block 530.

A NAND flash memory device has a relatively high degree of integration due to a structure in which a plurality of memory cells are serially connected. However, it is required to further reduce design rules for a NAND flash memory device in order to reduce a chip size. Also, as design rules have been reduced, a minimum pitch of patterns that are necessary to form a NAND flash memory device has also been greatly reduced. In order to form fine patterns according to reduced design rules, the inventive concept provides a semiconductor device having an arrangement structure that may secure a sufficient process margin while using patterns having sizes within a resolution limit of exposure equipment and exposure technology of lithography that has been developed so far and a method of manufacturing the semiconductor device.

Figure 24C:
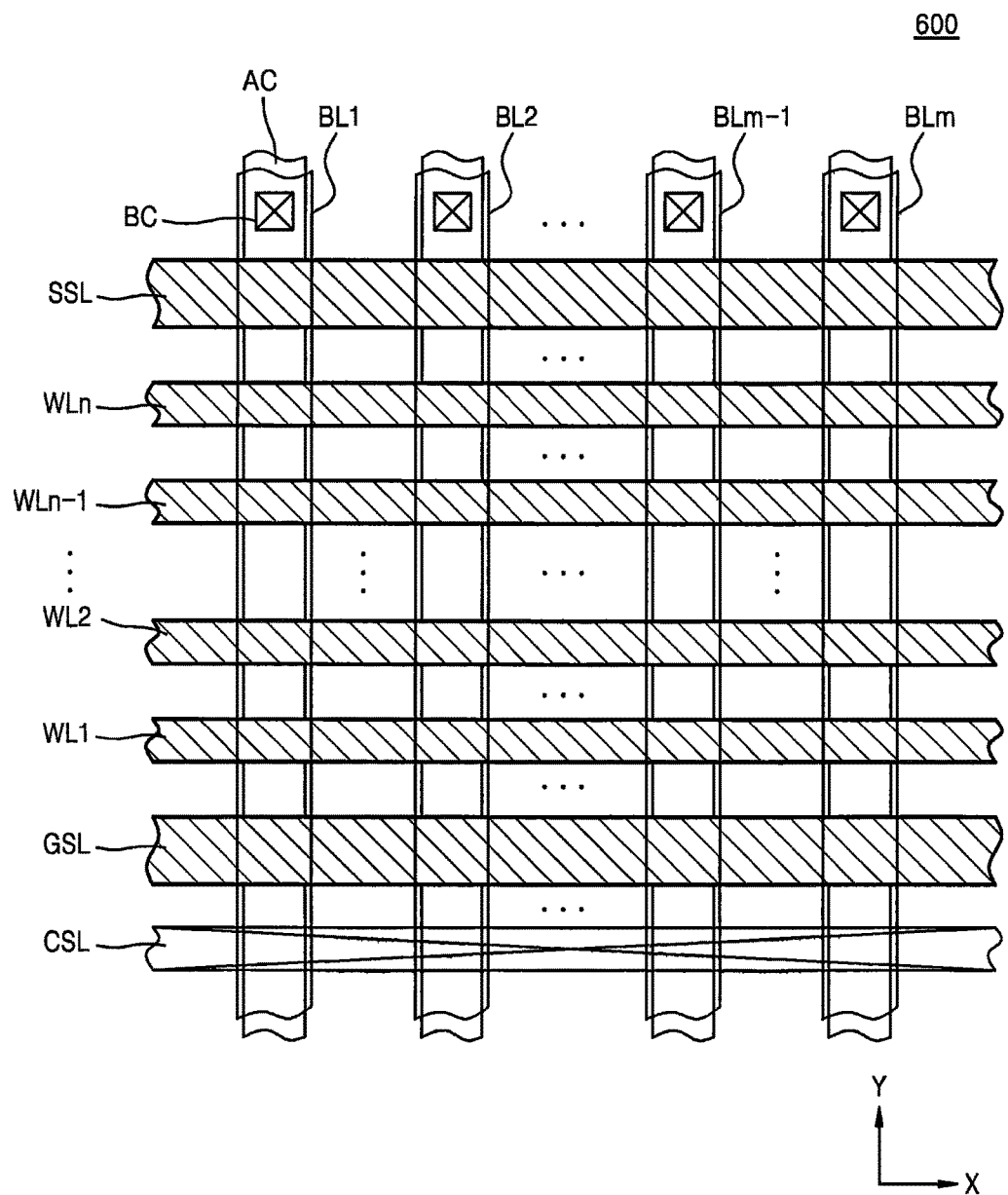
FIG. 24C is a layout of a memory cell array of a semiconductor device according to some embodiments of the inventive concept.
Figure 24D:
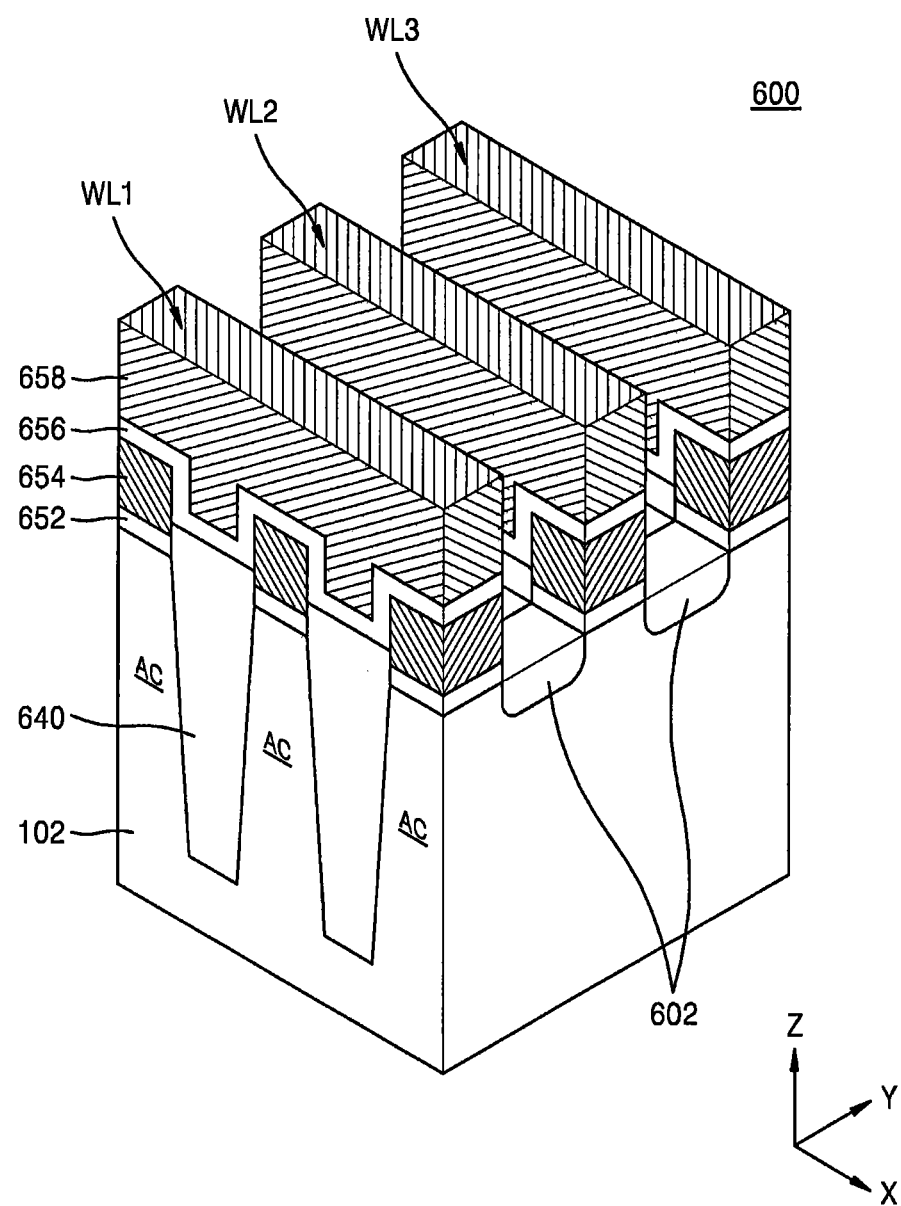
FIG. 24D is a perspective view illustrating a memory cell array of a semiconductor device according to some embodiments of the inventive concept.

FIG. 24C is a layout of a memory cell array of a semiconductor device 600 according to some embodiments of the inventive concept, and FIG. 24D is a perspective view illustrating a memory cell array of the semiconductor device 600.

FIGS. 24C and 24D illustrate a memory cell array of a NAND flash memory device that is a nonvolatile memory device. In FIG. 24D, some elements, for example, bit lines, of the semiconductor device 600 of the NAND flash memory device of FIG. 24C are not shown.

Referring to FIGS. 24C and 24D, the semiconductor device 600 may include a plurality of active regions AC that are defined by a plurality of device isolation regions 640 that are formed in the substrate 102. The plurality of active regions AC may include a plurality of line patterns that are parallel to one another.

The string selection line SSL and the ground selection line GSL that cross over the plurality of active regions AC may be disposed on the plurality of active regions AC. The plurality of word lines WL1, WL2, . . . , WLn−1, and WLn that cross over the plurality of active regions AC may be disposed between the string selection line SSL and the ground selection line GSL. The string selection line SSL, the ground selection line GSL, and the plurality of word lines WL1, WL2, . . . , WLn−1, and WLn may be parallel to one another.

A plurality of impurity regions 602 may be formed in the plurality of active regions AC that are adjacent to both sides of the plurality of word lines WL1, WL2, . . . , WLn−1, and WLn, the string selection line SSL, and the ground selection line GSL. Accordingly, a string selection transistor, memory cell transistors, and a ground selection transistor that are serially connected may be formed. The string selection transistor, the ground selection transistor, and the memory cell transistors that are disposed between the string selection transistor and the ground selection transistor may constitute one unit memory string.

The plurality of active regions AC that are adjacent to the string selection line SSL and are located opposite to the ground selection line GSL may be defined as a drain region of each string selection transistor. Also, the plurality of active regions AC that are adjacent to the ground selection line GSL and are located opposite to the string selection line SSL may be defined as a source region of each ground selection transistor.

The plurality of word lines WL1, WL2, . . . , WLn−1, and WLn may extend to intersect the plurality of active regions AC. Each of the plurality of word lines WL1, WL2, . . . , WLn−1, and WLn may include a tunneling insulating layer 652, a charge storage layer 654, a blocking insulating layer 656, and a gate electrode layer 658 that are sequentially stacked on the substrate 102.

The tunneling insulating layer 652 and the charge storage layer 654 may be included in each of memory cell transistors arranged in a direction in which the plurality of word lines WL1, WL2, . . . , WLn−1, and WLn extend.

The tunneling insulating layer 652 may be formed of silicon oxide, silicon oxynitride, silicon oxide doped with impurities, or a low-k material having a dielectric constant lower than that of silicon oxide. The charge storage layer 654 may be a charge trap layer or a conductive layer. The charge storage layer 654 may include a semiconductor doped with a dopant, for example, doped polysilicon. The charge storage layer 654 may be electrically insulated due to the tunneling insulating layer 652 and the blocking insulating layer 656.

The blocking insulating layer 656 may be shared by the memory cell transistors that are adjacent in the direction in which the plurality of word lines WL1, WL2, . . . , WLn−1, and WLn extend. The blocking insulating layer 656 may be formed of a silicon oxide film or a silicon nitride film, or may have a stacked structure formed of a combination of a silicon oxide film and a silicon nitride film. In some embodiments, the blocking insulating layer 656 may be formed of an oxide-nitride-oxide (ONO) film. Alternatively, the blocking insulating layer 656 may include a high-k material having a dielectric constant higher than that of silicon oxide.

The gate electrode layer 658 may be an electrode that controls a program operation and an erase operation. The gate electrode layer 658 may be formed to be connected between the memory cell transistors that are adjacent in the direction in which the plurality of word lines WL1, WL2, . . . , WLn−1, and WLn extend. In some embodiments, the gate electrode layer 658 may be a conductive film including a doped semiconductor, metal silicide, or a combination thereof. For example, the gate electrode layer 658 may include doped polysilicon.

At least one of the string selection line SSL and the ground selection line GSL may have substantially the same stacked structure as a stacked structure of the plurality of word lines WL1, WL2, ..., WLn-1, and WLn at intersections between the at least one of the string selection line SSL and the ground selection line GSL and the plurality of active regions AC. In some embodiments, the charge storage layer 654 and the gate electrode layer 658 may be electrically connected to each other. A width of each of the string selection line SSL and the ground selection line GSL may be greater than a width of each of the plurality of word lines WL1, WL2, ..., WLn-1, and WLn. However, embodiments are not limited thereto.

As shown in FIG. 24C, the semiconductor device 600 may include the plurality of bit lines BL1, BL2, ..., BLm-1, and BLm that cross over the plurality of word lines WL1, WL2, WLn-1, and WLn. The plurality of bit lines BL1, BL2, ..., BLm-1, and BLm may be connected to a drain region of the string selection line SSL through a bit line contact BC. The plurality of bit lines BL1, BL2, ..., BLm-1, and BLm may be disposed parallel to the plurality of active regions AC.

In some embodiments, the plurality of word lines WL1, WL2, ..., WLn-1, and WLn of FIGS. 24C and 24D may have an arrangement of the plurality of line patterns 104P of FIGS. 9A and 9B or a modification thereof without departing from the scope of the inventive concept.

In some embodiments, the plurality of active regions AC and/or the plurality of word lines WL1, WL2, ..., WLn-1, and WLn of FIGS. 24C and 24D may have an arrangement of the plurality of line patterns 210 of FIG. 20 or a modification thereof without departing from the scope of the inventive concept.

In some embodiments, the plurality of device isolation regions 640 of FIG. 24D may have an arrangement of the plurality of line patterns 210 of FIG. 20 and a modification thereof without departing from the scope of the inventive concept.

Figure 25:
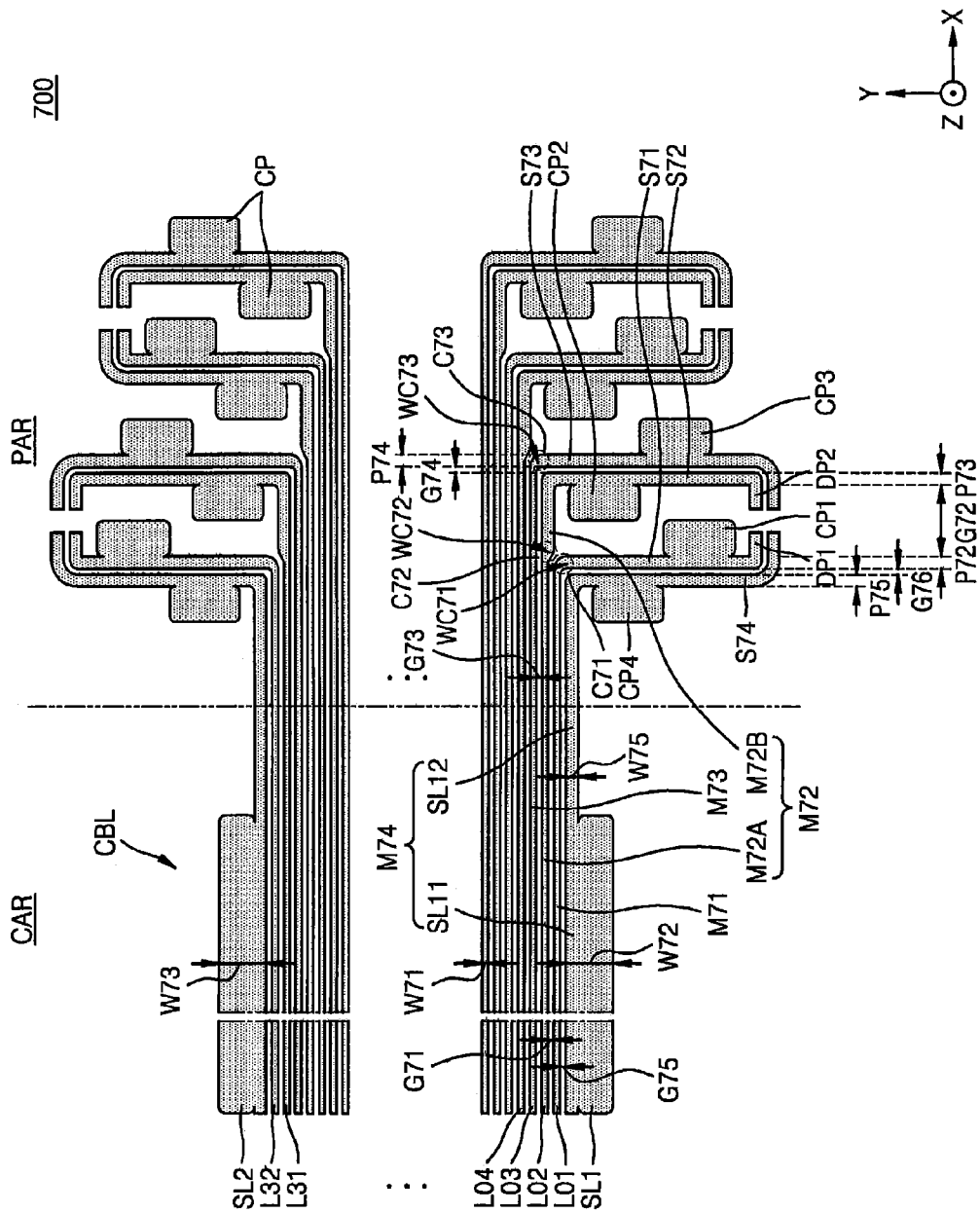
FIG. 25 is a plan view of a semiconductor device according to some embodiments of the inventive concept.

FIG. 25 is a plan view of a semiconductor device 700 according to some embodiments of the inventive concept.

FIG. 25 is a layout illustrating a part of a memory cell area CAR of a NAND flash memory device, and a part of a connection area PAR for connecting a plurality of conductive lines, for example, word lines or bit lines, constituting a cell array of the memory cell area CAR to an external circuit such as a decoder.

Referring to FIG. 25, a plurality of memory cell blocks CBL are formed in the memory cell area CAR. One memory cell block CBL is shown in FIG. 25. In the memory cell block CBL, a first selection line SL1, a second selection line SL2, and a plurality of conductive lines L01, L02, ..., and L32 that are necessary to constitute one cell string 10 (see FIG. 24B) between the first selection line SL1 and the second selection line SL2 extend parallel to one another in the first direction (X direction) may be formed. The plurality of conductive lines L01, L02, ..., and L32 extend across the memory cell area CAR and the connection area PAR.

In order to connect the plurality of conductive lines L01, L02, ..., and L32 to the external circuit such as a decoder, a plurality of contact pads CP are respectively integrally formed with the plurality of conductive lines L01, L02, ..., and L32 at one ends of the plurality of conductive lines L01, L02, ..., and L32 in the connection area PAR.

In the connection area PAR, end portions of the plurality of conductive lines L01, L02, ..., and L32 extend in the second direction (Y direction) that is perpendicular to the first direction. However, embodiments are not limited thereto. Configurations of the plurality of conductive lines L01, L02, ..., and L32 and the contact pads CP may be modified in various ways without departing from the scope of the inventive concept.

In FIG. 25, the plurality of conductive lines L01, L02, ..., and L32, the first selection line SL1, the second selection line SL2, and the contact pads CP may be formed of substantially the same material.

In some embodiments, the plurality of conductive lines L01, L02, ..., and L32 may be word lines constituting a plurality of memory cells in the memory cell area CAR. For example, the plurality of conductive lines L01, L02, ..., and L32 may constitute the plurality of word lines WL1, WL2, ..., WLn-1, and WLn of FIGS. 24B through 24D.

The first selection line SL1 and the second selection line SL2 may respectively have widths W72 and W73 that are greater than a first width W71 of each of the plurality of conductive lines L01, L02, ..., and L32. In some embodiments, the first selection line SL1 and the second selection line SL2 may constitute the string selection line SSL, and the ground selection line GSL of FIGS. 24B and 24C.

In some embodiments, the plurality of conductive lines L01, L02, ..., and L32 may be bit lines that constitute memory cells in the memory cell area CAR. In this case, the first selection line SL1 and the second selection line SL2 may be omitted.

Although the plurality of conductive lines L01, L02, ... and L32, that is, 32 conductive lines, are included in one memory cell block CBL in FIG. 25, one memory cell block CBL may include more or fewer conductive lines without departing from the scope of the inventive concept.

In the semiconductor device 700 of FIG. 25, a first conductive line L01 among the plurality of conductive lines L01, L02, ..., and L32 includes a first main line M71 that extends in the first direction (X direction) and has the first width W71, and a first subline S71 that extends in the second direction (Y direction) from one end of the first main line M71 and has a second width P72 that is greater than the first width W71.

Also, a second conductive line L02 among the plurality of conductive lines L01, L02, ..., and L32 includes a second main line M72 that is parallel to the first main line M71 and has the first width W71, and a second subline S72 that extends parallel to the first subline S71 from one end of the second main line M72 and has a third width P73 that is greater than the first width W71.

In some embodiments, the second width P72 may be substantially the same as the third width P73. In some embodiments, the second width P72 may be different from the third width P73.

The first conductive line L01 may include a first width changer WC71 that is disposed between the first main line M71 and the first subline S71 and whose width gradually increases from the first width W71 to the second width P72, as marked by a dashed circle C71 of FIG. 25.

The second conductive line L02 may include a second width changer WC72 that is included in the second main line M72 and whose width gradually increases from the first width W71 to the third width P73 in a longitudinal direction of the second main line M72, as marked by a dashed circle C72 of FIG. 25.

The first width changer WC71 and the second width changer WC72 may face each other as illustrated in FIG. 25.

The second main line M72 may include a first line portion M72A and a second line portion M72B that are spaced apart from each other with the second width changer WC72 therebetween. The first line portion M72A may have the first width W71 and the second line portion M72B may have the third width P73. The second subline S72 may extend in the second direction (Y direction) from one end of the second line portion M72B.

In some embodiments, a second gap G72 that is a shortest distance between the first subline S71 and the second subline S72 may be greater than a first gap G71 that is a shortest distance between the first main line M71 and the second main line M72.

In some embodiments, the first width W71 and the first gap G71 in the memory cell area CAR may be substantially the same. For example, the first width W71 and the first gap G71 may be a minimum feature size of the semiconductor device 700, that is, 1 F.

In the first line pattern L01, one end of the first subline S71 may be connected to the first main line M71 and the other end of the first subline S71 may be connected to a first dummy line DP1. The first dummy line DP1 may extend from the other end of the first subline S71 in the first direction (X direction) away from the first main line M71. The first dummy line DP1 may have the second width P72, like the first subline S71.

In the second line pattern L02, one end of the second subline S72 may be connected to the second main line M72 and the other end of the second subline S72 may be connected to a second dummy line DP2. The second dummy line DP2 may extend from the other end of the second subline S72 in the first direction (X direction) toward the first dummy line DP1. The second dummy line DP2 may have the third width P73, like the second subline S72.

The plurality of contact pads CP include a first contact pad CP1 that contacts the first subline S71 and extends toward the second subline S72, and a second contact pad CP2 that is spaced apart from the first contact pad CP1 to contact the second subline CP2 and extends toward the first subline S71.

The plurality of conductive lines L01, L02, . . . , and L32 include a third line pattern L03 that extends parallel to the second line pattern L02 in a state where the third line pattern L03 and the first line pattern L01 are on opposite sides of the second line pattern L02. The third line pattern L03 includes a third main line M73 that is parallel to the second main line M72 and has the first width W71 and a third subline S73 that is parallel to the second subline S72 and has a fourth width P74 that is greater than the first width W71.

A third gap G73 that is a shortest distance between the second main line M72 and the third main line M73 may be substantially the same as a fourth gap G74 that is a shortest distance between the second subline S72 and the third subline S73.

The third line pattern L03 may include a third width changer WC73 that is disposed between the third main line M73 and the third subline S73 and whose width gradually increases from the first width W71 to the fourth width P74, as marked by a dashed circle C73 of FIG. 25.

Also, the plurality of contact pads CP include a third contact pad CP3 that contacts the third subline S73 and extends from the third subline S73 in a direction away from the second subline S72 as illustrated in FIG. 25.

The first selection line SL1 that extends parallel to the first line pattern L01 in a state where the first selection line SL1 and the second line pattern L02 are on opposite sides of the first line pattern L01 is formed at one side of the plurality of conductive lines L01, L02, . . . , and L32.

The first selection line SL1 includes a fourth main line M74 that is parallel to the first main line M71. The fourth main line M74 includes a first selection line portion SL11 that has a width W72 that is greater than the first width W71 and a second selection line portion SL12 that has a fifth width W75 that is greater than the first width W71 and is less than the width W72 of the first selection line portion SL11. Also, the first selection line SL1 includes a fourth subline S74 that is parallel to the first subline S71 and has a width P75 that is greater than the first width W71.

In some embodiments, the fifth width W75 of the second selection line portion SL12 and the width P75 of the fourth subline S74 may be substantially the same. In some embodiments, the second width P72 of the second subline S72 and the width P75 of the fourth subline S74 may be substantially the same.

A fifth gap G75 that is a shortest distance between the first main line M71 and the fourth main line M74 and a sixth gap G76 that is a shortest distance between the first subline S71 and the fourth subline S74 may be substantially the same.

The plurality of contact pads CP include a fourth contact pad CP4 that contacts the fourth subline S74 and extends from the fourth subline S74 in a direction away from the first subline S71 as illustrated in FIG. 25.

FIGS. 26A, 27A, 28A, 29A, 30A, 31A, 32A, 33A, 34A, 35A, 36A and 37A are plan views illustrating a method of manufacturing the semiconductor device 700 according to some embodiments of the inventive concept, and FIGS. 26B, 27B, 28B, 29B, 30B, 31B, 32B, 33B, 34B, 35B, 36B and 37B are cross-sectional views taken along the lines X-X' and Y-Y' of FIGS. 26A, 27A, 28A, 29A, 30A, 31A, 32A, 33A, 34A, 35A, 36A and 37A.

Figure 26A:
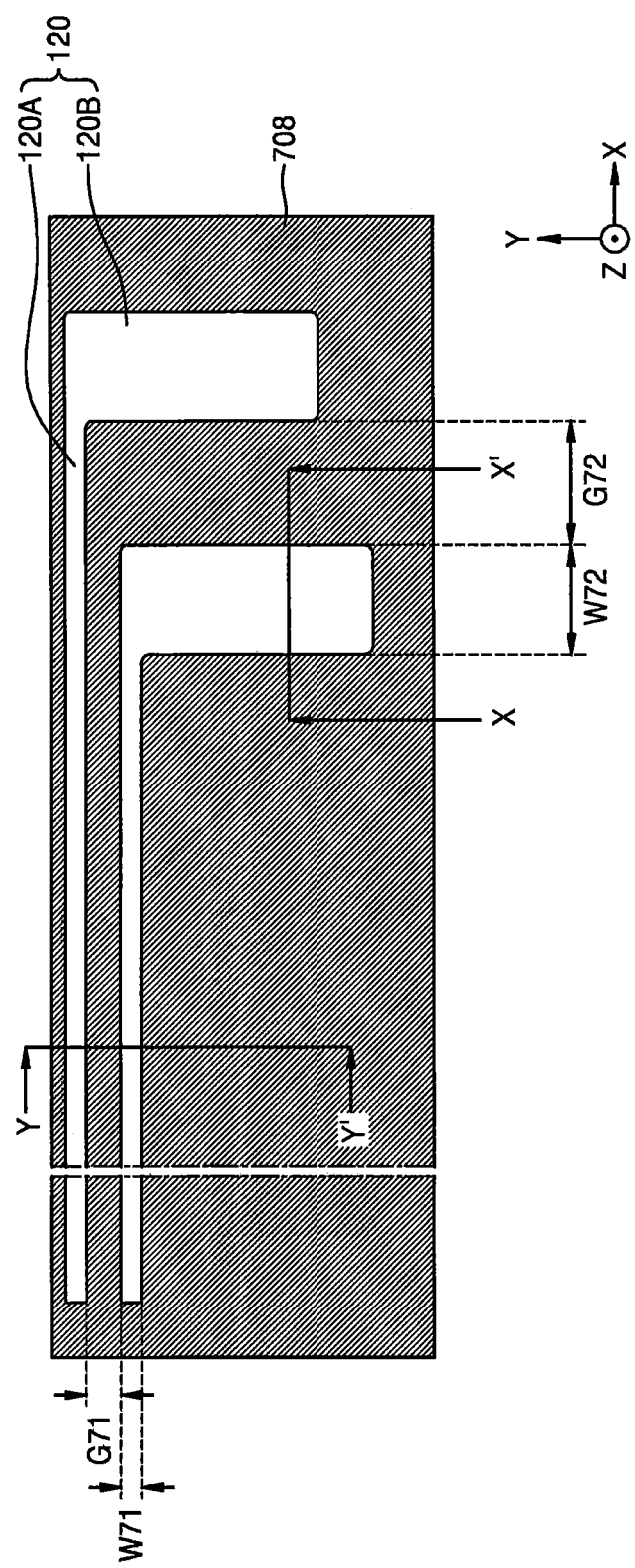
FIGS. 26A, 27A, 28A, 29A, 30A, 31A, 32A, 33A, 34A, 35A, 36A and 37A are plan views illustrating a method of manufacturing the semiconductor device of FIG. 25 according to some embodiments of the inventive concept.
Figure 26B:
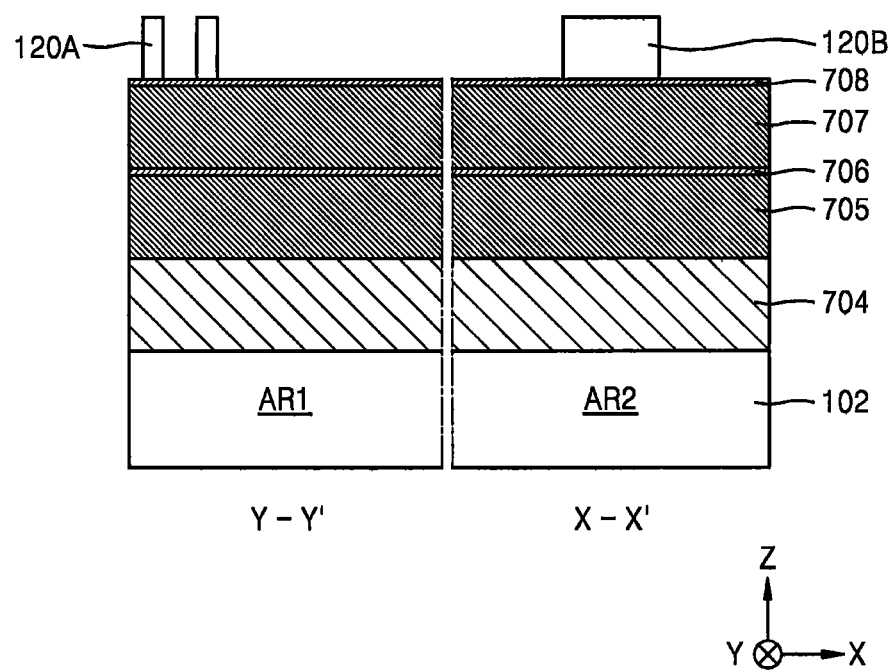
FIGS. 26B, 27B, 28B, 29B, 30B, 31B, 32B, 33B, 34B, 35B, 36B and 37B are cross-sectional views taken along the lines X-X' and Y-Y' of FIGS. 26A, 27A, 28A, 29A, 30A, 31A, 32A, 33A, 34A, 35A, 36A and 37A.

Referring to FIGS. 26A and 26B, a feature layer 704, a first hardmask layer 705, a second hardmask layer 706, a third hardmask layer 707, and a fourth hardmask layer 708 are sequentially formed on the substrate 102, and the plurality of mask patterns 120 are formed on the fourth hardmask layer 708.

The first area AR1 of the substrate 102 may be a part of the memory cell area CAR of FIG. 25 and the second area AR2 of the substrate 102 may be a part of the connection area PAR of FIG. 25.

In some embodiments, the feature layer 704 may be formed of a conductive film. In some embodiments, the feature layer 704 may have a stacked structure including films that are included in the tunneling insulating layer 652, the charge storage layer 654, the blocking insulating layer 656, and the gate electrode layer 658 of FIG. 24D.

The first hardmask layer 705, the second hardmask layer 706, the third hardmask layer 707, and the fourth hardmask layer 708 may be formed of materials having etch selectivities with respect to adjacent layers.

In some embodiments, the first hardmask layer 705 and the third hardmask layer 707 may be formed of an SOH material, and the second hardmask layer 706 and the fourth hardmask layer 708 may be formed of silicon oxynitride.

In some embodiments, the plurality of mask patterns 120 may be photoresist patterns.

Each of the plurality of mask patterns 120 may extend from the first area AR1 to the second area AR2 of the substrate 102. The plurality of mask patterns 120 extend parallel to one another and are spaced apart from one another. Each of the plurality of mask patterns 120 includes a first mask portion 120A that is disposed in the first area AR1 and extends in the first direction (X direction) and a second mask portion 120B that is integrally connected to the first mask portion 120A, is disposed in the second area AR2, and extends in the second direction (Y direction).

A distance between two directly adjacent ones of the plurality of mask patterns 120 may be the first gap G71 in the first area AR1 and may be the second gap G72 in the second area AR2. The second gap may be greater than the first gap G71.

The first mask portion 120A of each of the plurality of mask patterns 120 may be formed to have the first width W71 in a longitudinal direction thereof. The second mask portion 120B may be formed to have the second width W72 that is greater than the first width W71.

In some embodiments, when a minimum feature size of the semiconductor device 700 to be formed is 1 F, the first width W71 may be 3 F and the second width W72 may be greater than the minimum feature size. For example, the second width W72 may be at least 7 F.

Each of the first gap G71 between two directly adjacent ones of the plurality of first mask portions 120A and the second gap G72 between two directly adjacent ones the plurality of second mask portions 120B is greater than the first width W71. For example, the first gap G71 may be, but is not limited to, 5 F and the second gap G72 may be, but is not limited to, at least 7 F.

Figure 27A:
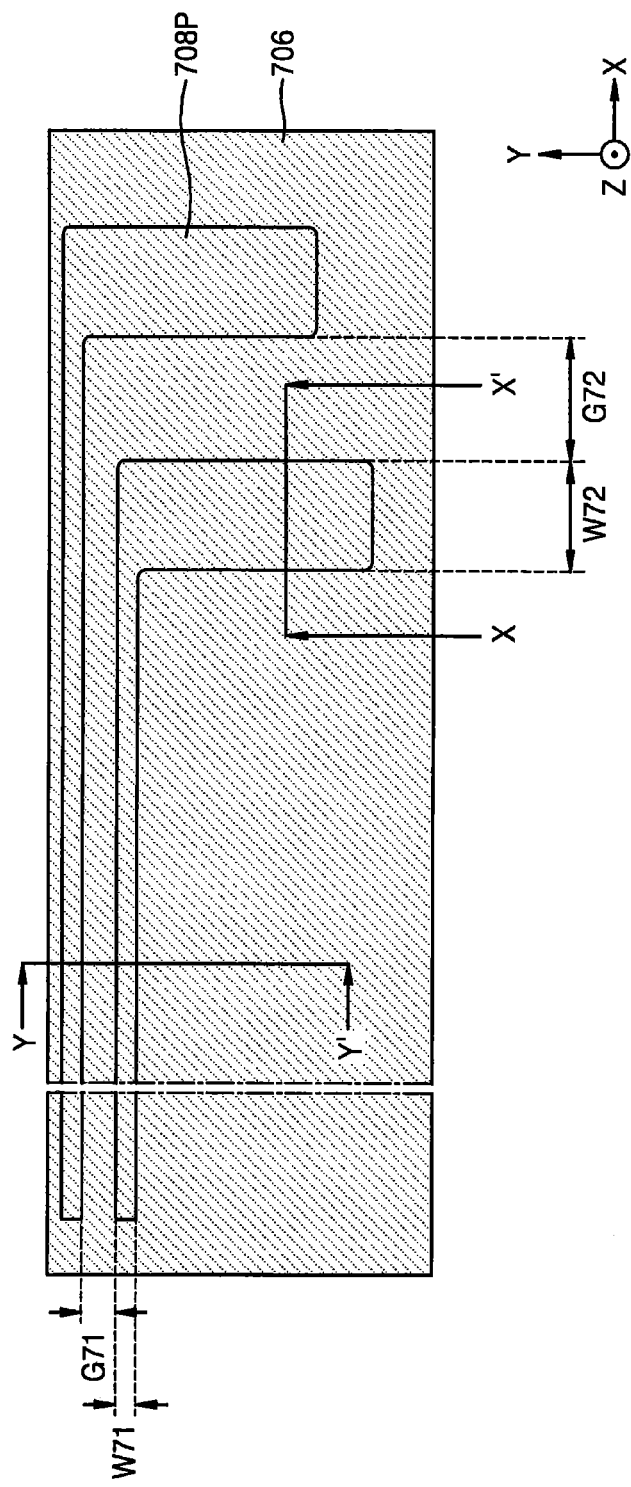
Figure 27B:
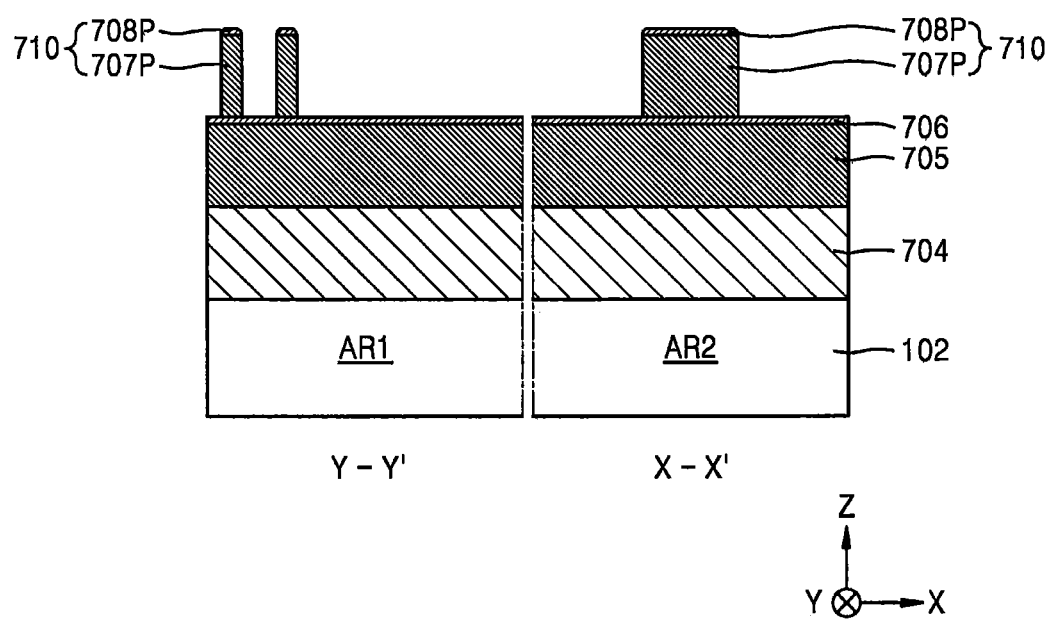

Referring to FIGS. 27A and 27B, a plurality of first structures 710 including a plurality of fourth hardmask patterns 708P and a plurality of third hardmask patterns 707P are formed by sequentially etching the fourth hardmask layer 708 and the third hardmask layer 707 by using the plurality of mask patterns 120 as etching masks. The plurality of first structures 710 may be used as reference structures for forming desired final patterns.

While or after the fourth hardmask layer 708 and the third hardmask layer 707 are sequentially etched, the plurality of mask patterns 120 may be consumed or removed. While the third hardmask layer 707 is etched, the plurality of fourth hardmask patterns 708P may be used as etching masks.

Figure 28A:
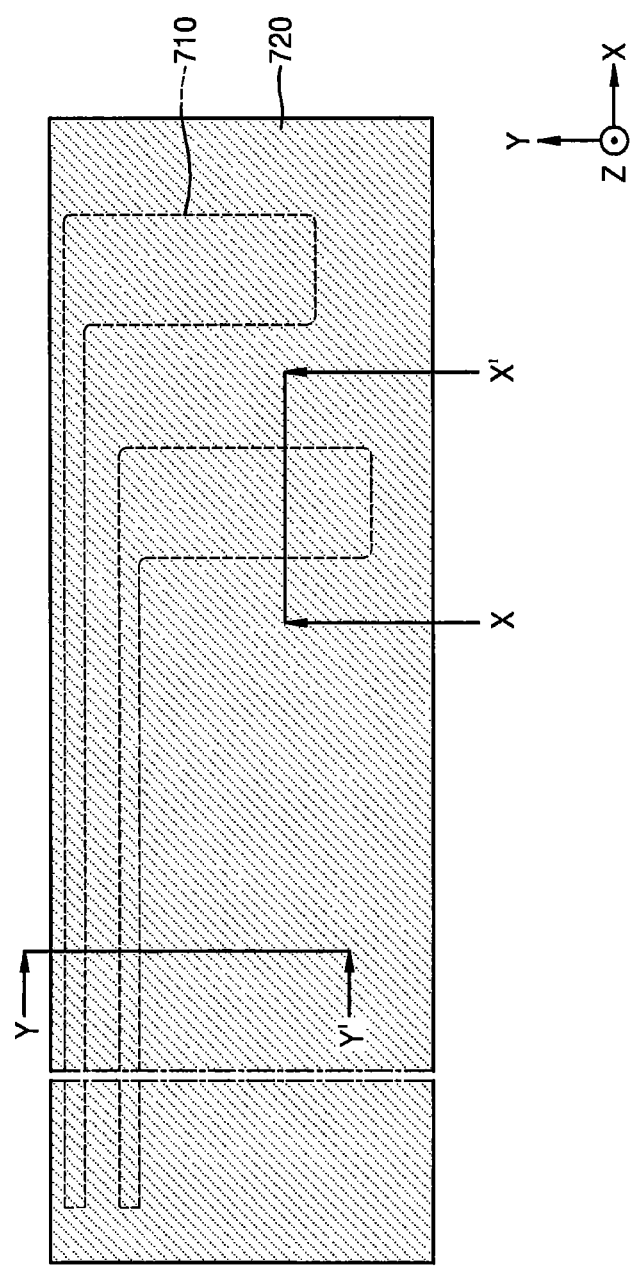
Figure 28B:
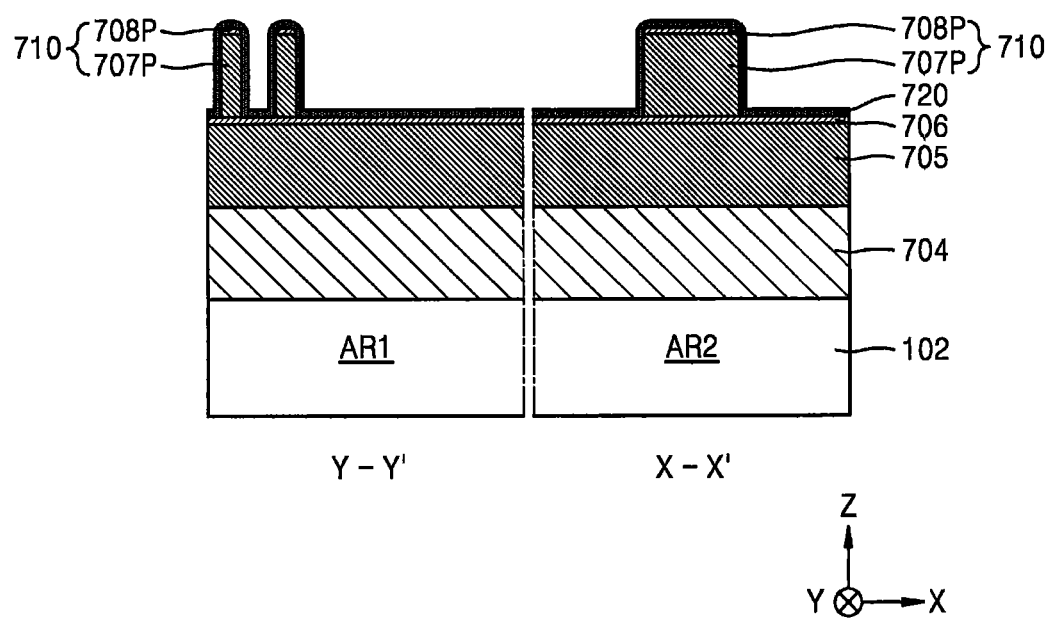

Referring to FIGS. 28A and 28B, a first spacer layer 720 that coves exposed surfaces of the plurality of first structures 710 and an exposed surface of the second hard layer 706 with a uniform thickness is formed.

The first spacer layer 720 may be formed of a silicon oxide film by using an ALD process. The first spacer layer 720 may be formed to cover both side walls of the plurality of first structures 710 with a thickness of about 1 F.

Figure 29A:
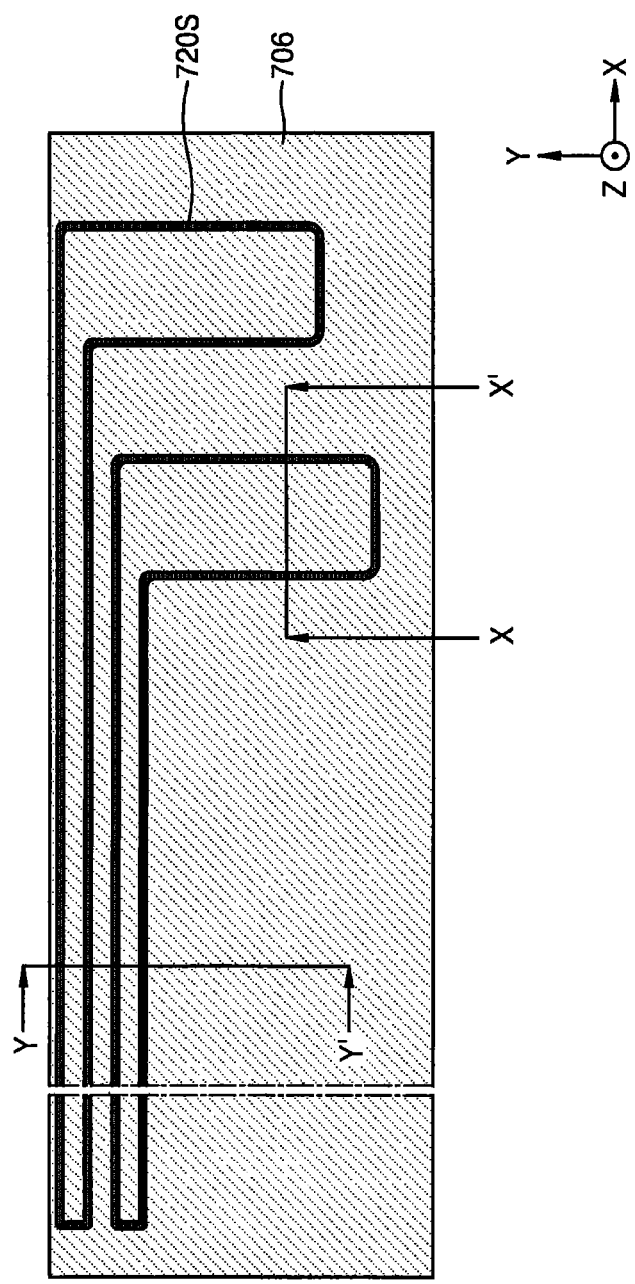
Figure 29B:
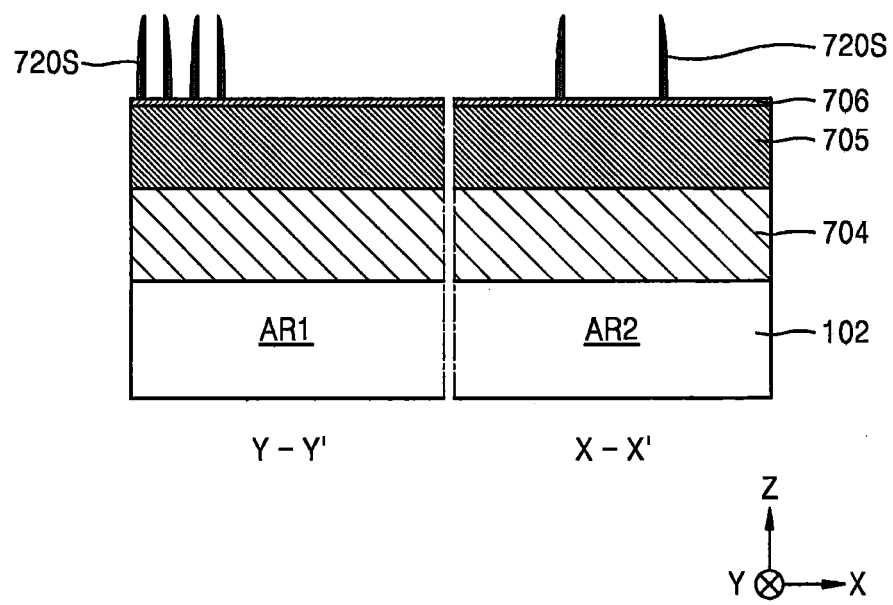

Referring to FIGS. 29A and 29B, after a plurality of first spacers 720S that cover both side walls of the plurality of first structures 710 are formed by performing an etch-back process on the first spacer layer 720, portions of a top surface of the second hardmask layer 706 that are covered by the plurality of first structures 710 are exposed by removing the plurality of first structures 710.

Figure 30A:
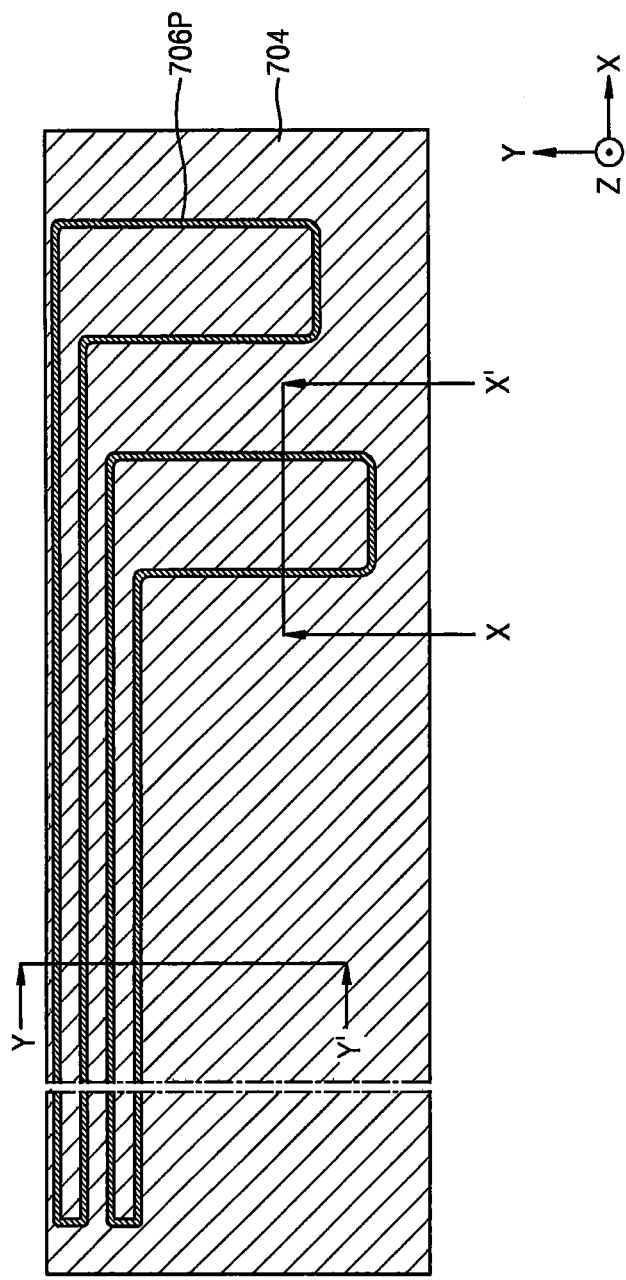
Figure 30B:
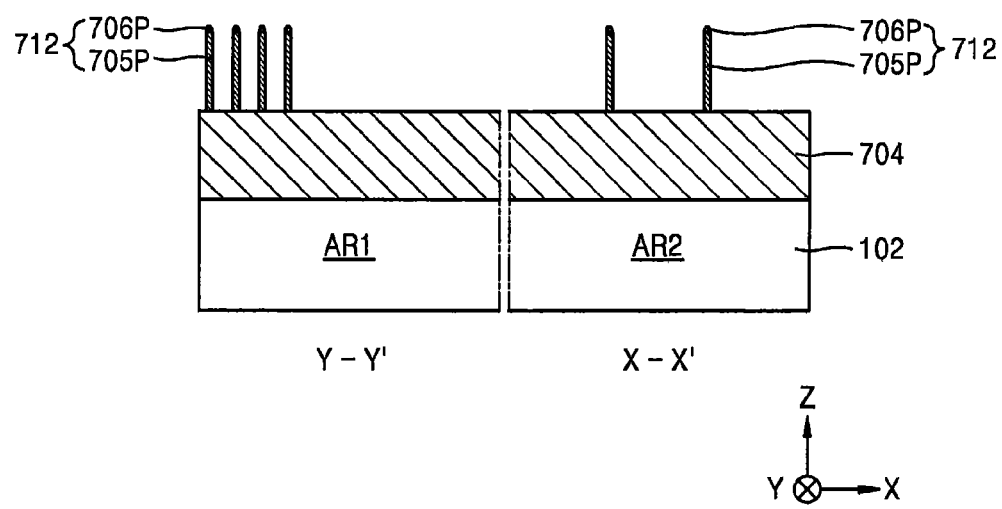

Referring to FIGS. 30A and 30B, a plurality of second structures 712 including a plurality of second hardmask patterns 706P and a plurality of first hardmask patterns 705P are formed by sequentially etching the second hardmask layer 706 and the first hardmask layer 705 by using the plurality of first spacers 720S of a resultant structure of FIGS. 29A and 29B as etching masks.

While or after the second hardmask layer 706 and the first hardmask layer 705 are sequentially etched, the plurality of first spacers 720S may be consumed or removed. While the first hardmask layer 705 is etched, the plurality of second hardmask patterns 706P may be used as etching masks.

Figure 31A:
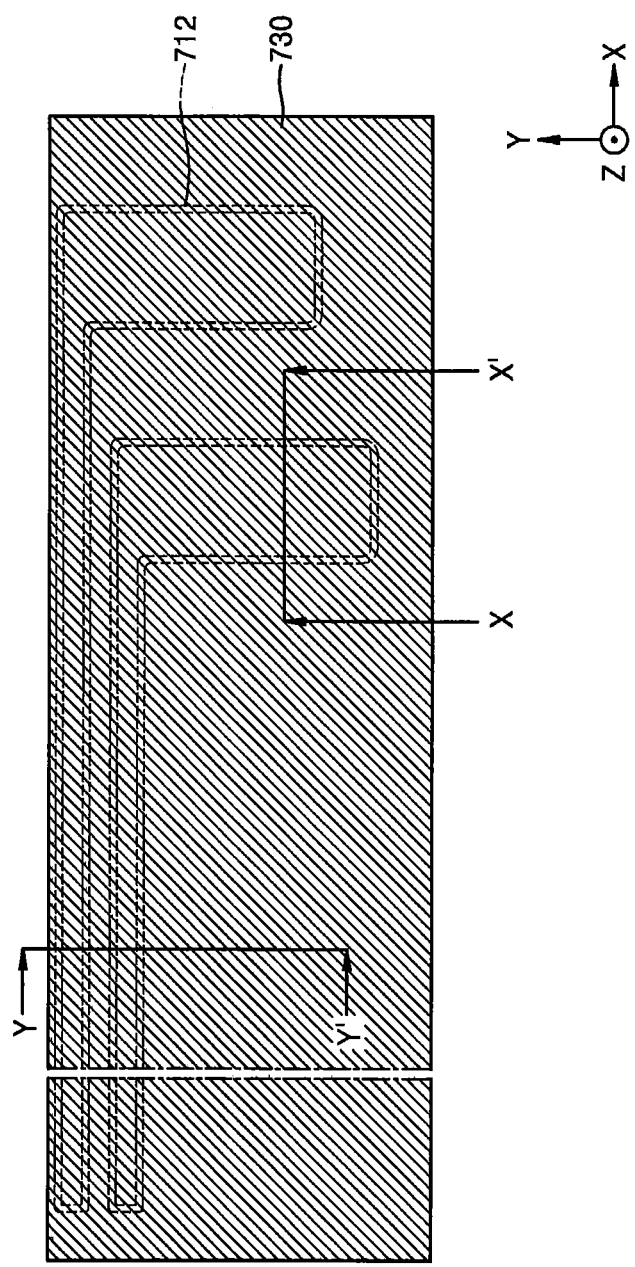
Figure 31B:
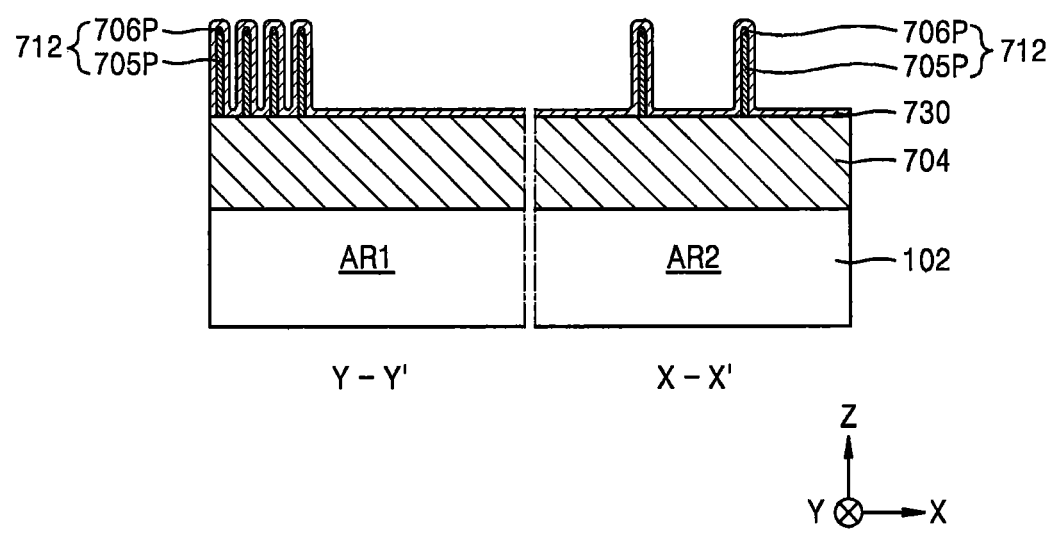

Referring to FIGS. 31A and 31B, a second spacer layer 730 that covers exposed surfaces of the plurality of second structures 712 and an exposed surface of the feature layer 704 with a uniform thickness is formed.

The second spacer layer 730 may be formed of a silicon oxide film by using an ALD process. The third spacer layer 730 may be formed to cover both side walls of the plurality of second structures 712 with a thickness of about 1 F.

Figure 32A:
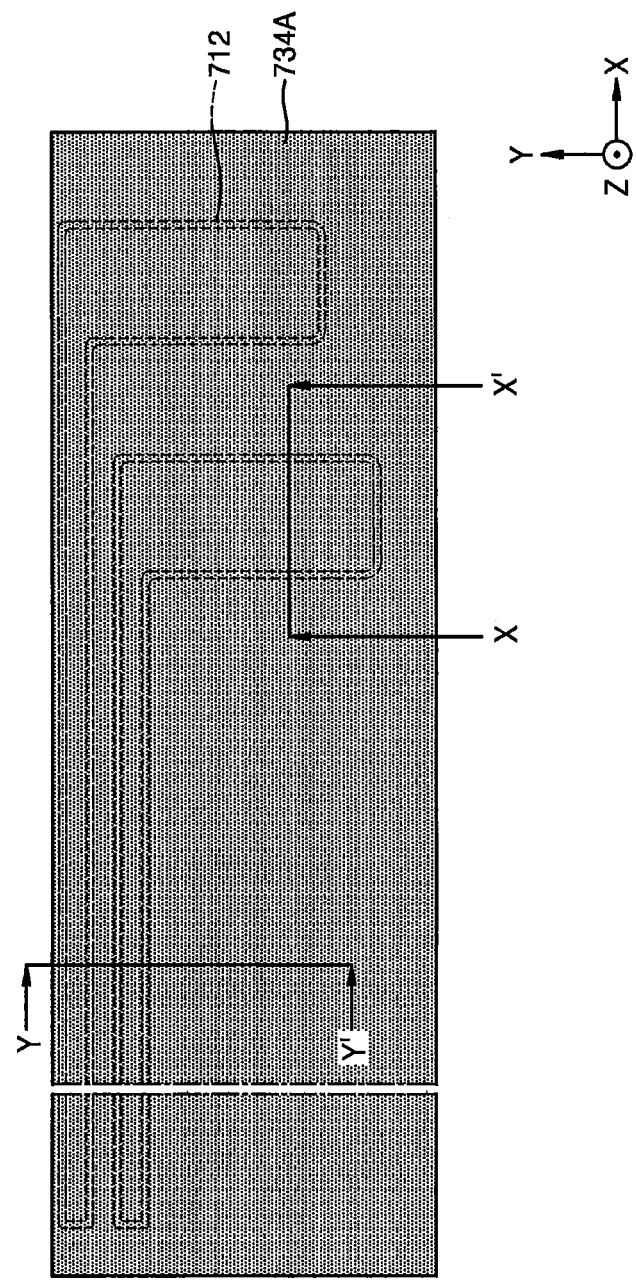
Figure 32B:
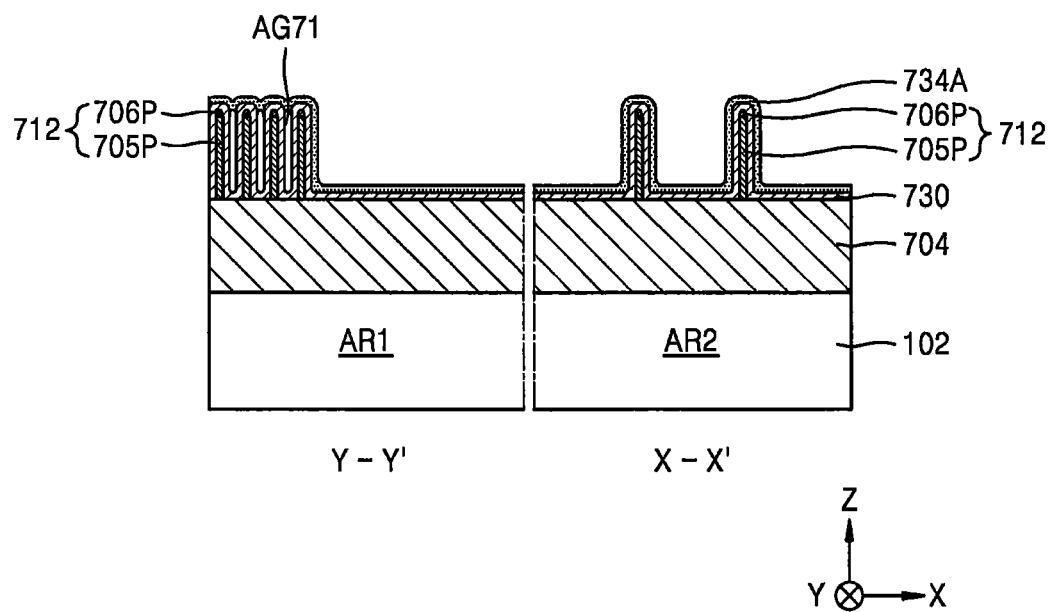

Referring to FIGS. 32A and 32B, an additional spacer layer 734A is formed on the second spacer layer 730 in the first area AR1 and the second area AR2.

The additional spacer layer 134A that is substantially the same as the additional spacer layer 734A has already been explained with reference to FIGS. 4A and 4B, and thus a detailed explanation of the additional spacer layer 734A will not be given.

After the additional spacer layer 734A is formed, a plurality of air gaps AG71 that are defined by the second spacer layer 730 and the additional spacer layer 734A may be formed between the plurality of second structures 712 in the first area AR1.

Figure 33A:
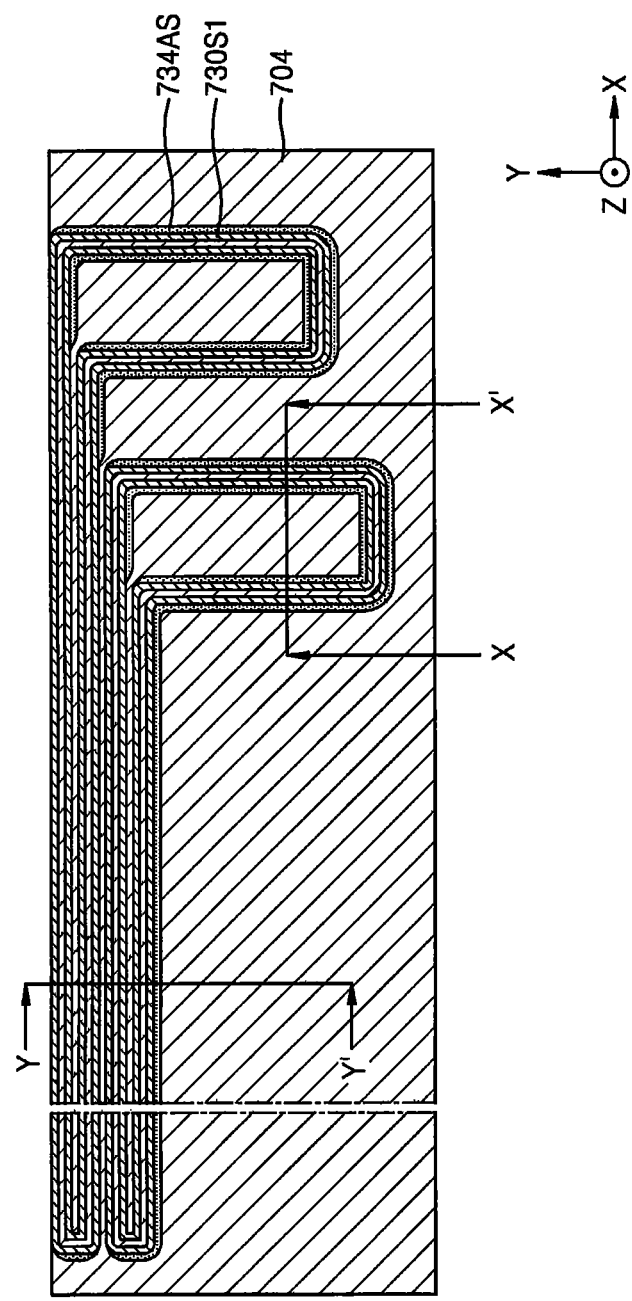
Figure 33B:
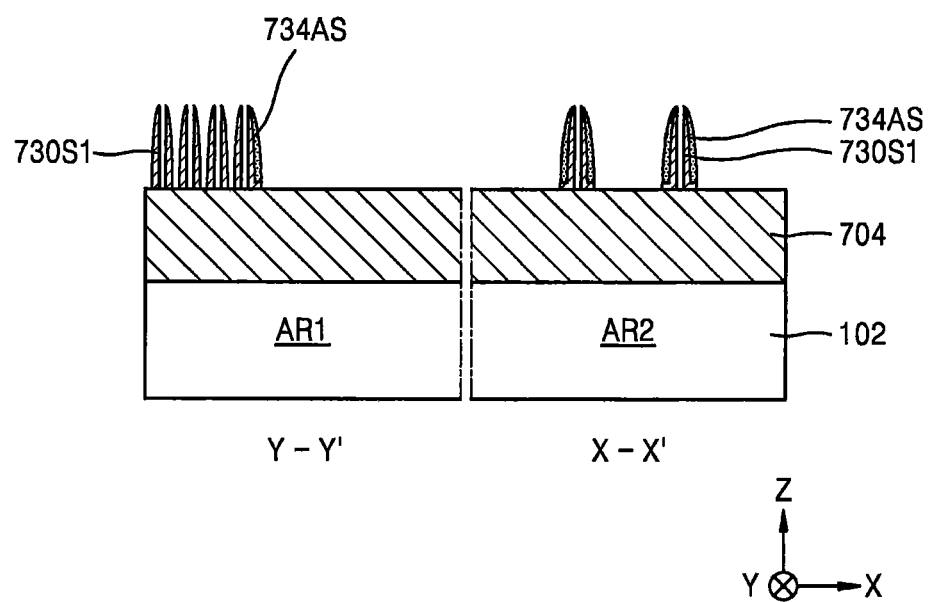

Referring to FIGS. 33A and 33B, by using a process that is similar to that described with reference to FIGS. 5A and 5B, a plurality of second spacers 730S1, and a plurality of additional spacers 734AS that cover portions of the plurality of second spacers 730S1 that cover a relatively wide space are formed by performing an etch-back process on the additional spacer layer 734A and the second spacer layer 730.

Next, portions of the top surface of the feature layer 704 that are covered by the plurality of second structures 712 are exposed by removing the plurality of second structures 712 (see FIGS. 32A and 32B) that are exposed between the plurality of second spacers 730S1 in the first area AR1 and the second area AR2.

Figure 34A:
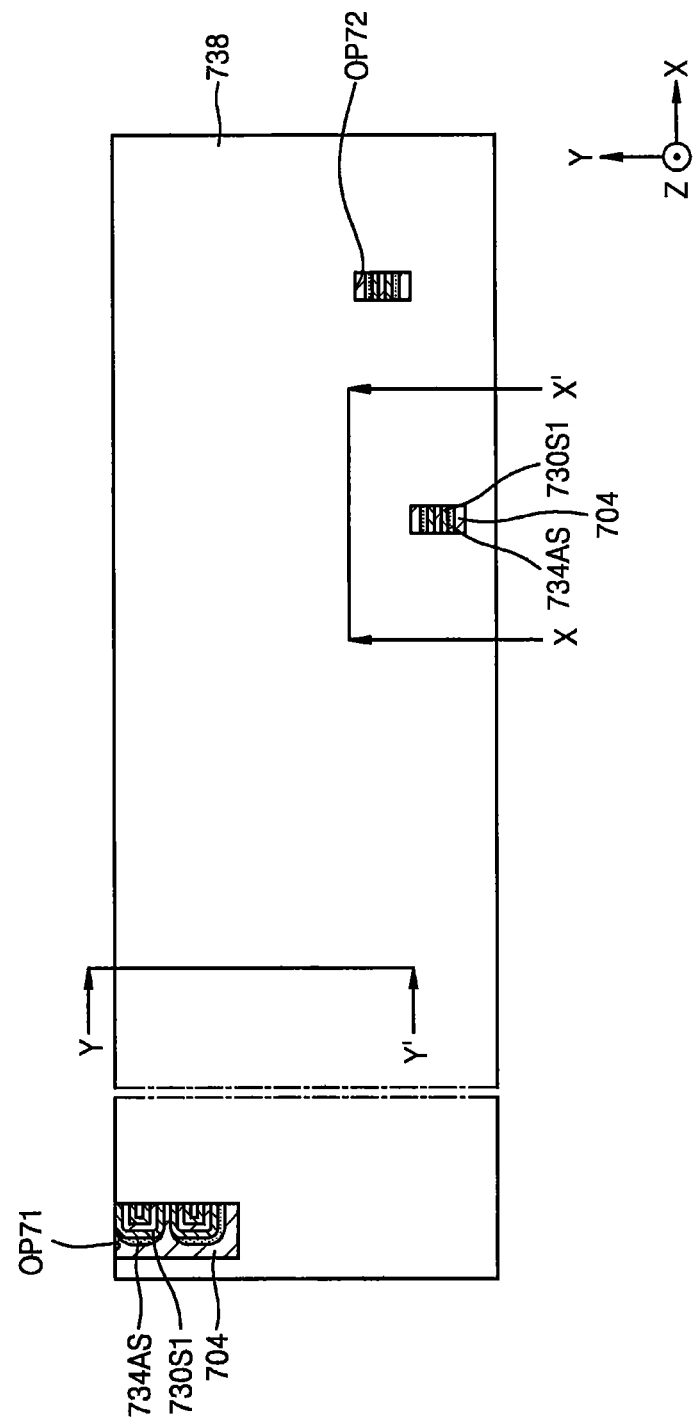
Figure 34B:
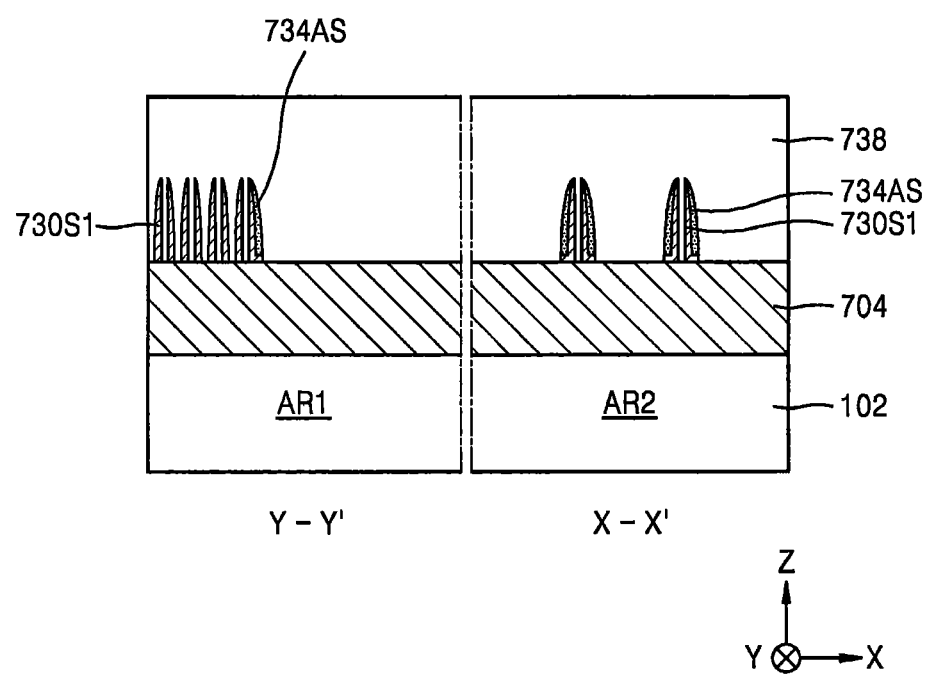

Referring to FIGS. 34A and 34B, a trimming mask pattern 738 including at least one first opening OP71 that is formed in the first area AR1 and at least one second opening OP72 that is formed in the second area AR2 is formed on the feature layer 704.

Parts of the second spacers 730S1, parts of the additional spacers 734AS, and a part of the feature layer 704 in the first area AR1 may be exposed through the at least one first opening OP71. Parts of the second spacers 730S1, parts of the additional spacers 734AS, and a part of the feature layer 704 in the second area AR2 may be exposed through the at least one second opening OP72.

In some embodiments, the trimming mask pattern 738 may be formed of a photoresist.

Figure 35A:
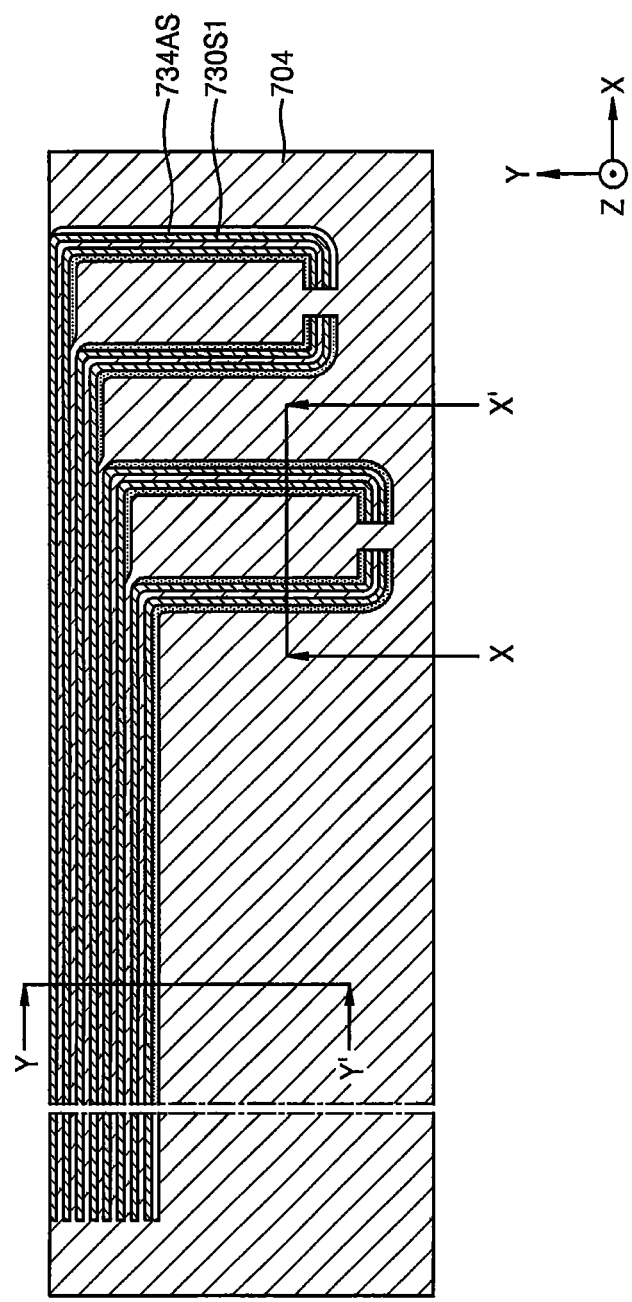
Figure 35B:
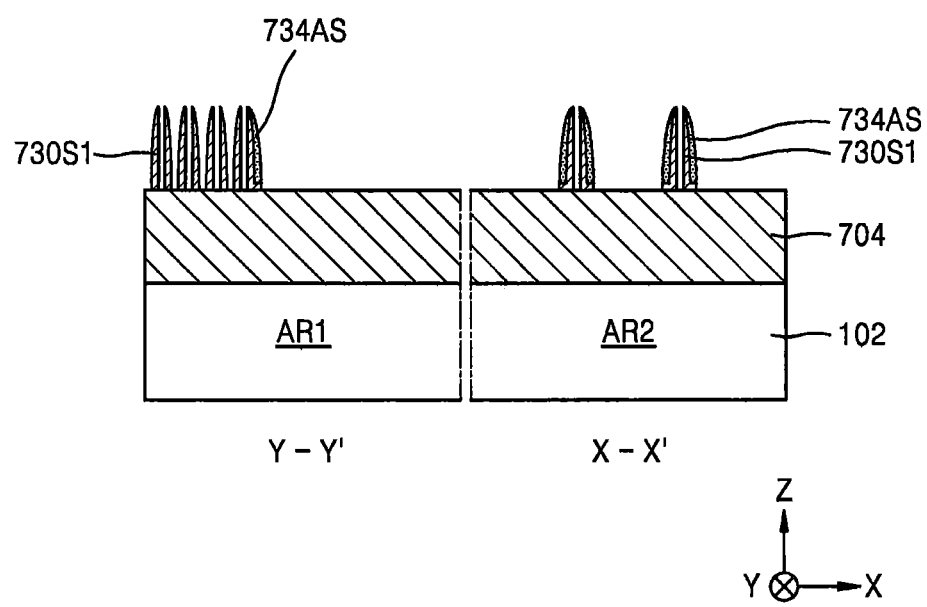

Referring to FIGS. 35A and 35B, by using a process that is similar to that described with reference to FIGS. 8A and 8B, after a trimming process for removing parts of the second spacers 730S1 and parts of the additional spacers 734AS that are exposed through the at least one first opening OP71 and the at least one second opening OP72 from a resultant structure of FIGS. 34A and 34B is performed, the trimming mask pattern 738 is removed.

As a result, each of the plurality of second spacers 730S1 having ring shapes may be divided into two.

Figure 36A:
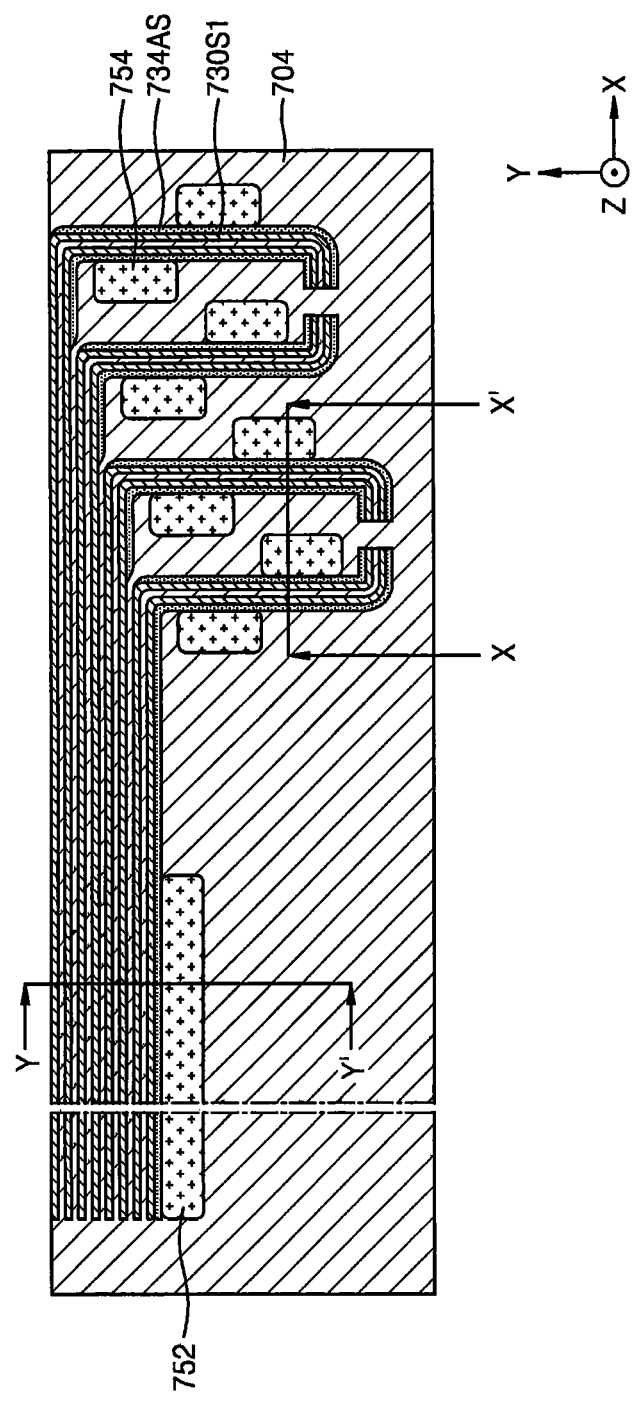
Figure 36B:
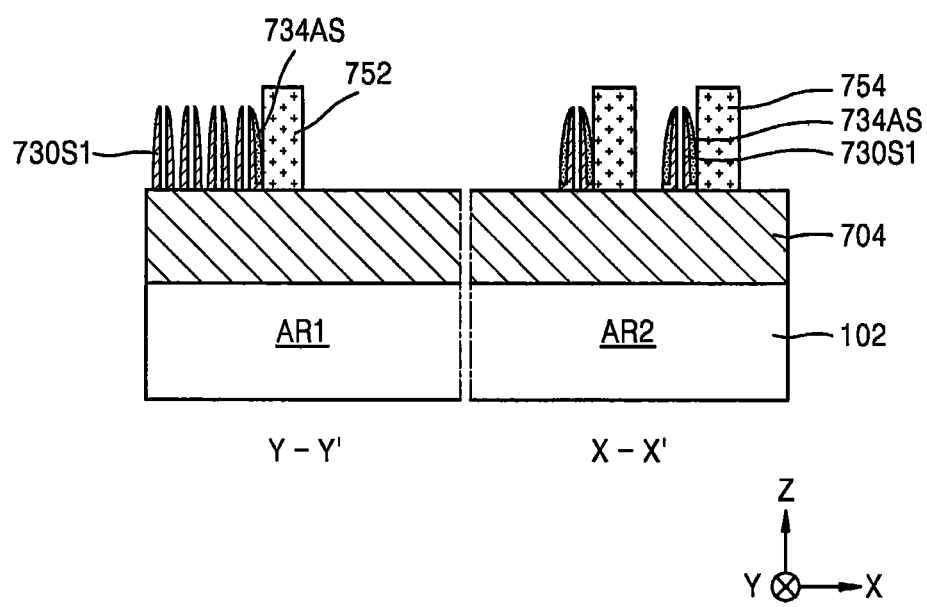

Referring to FIGS. 36A and 36B, a plurality of local mask patterns 752 and 754 are formed in the first area AR1 and the second area AR2.

The plurality of local mask patterns 752 and 754 may include at least one first local mask pattern 752 that is formed to contact the additional spacers 734AS in the first area AR1 and a plurality of second local mask patterns 754 that are formed to contact the additional spacers 734AS in the second area AR2.

The at least one first local mask pattern 752 may be used to form the first selection line SL1 and/or the second selection line SL2 in the memory cell area CAR of FIG. 25. A width of the at least one first local mask pattern 752 may be determined in consideration of a desired width of the first selection line SL1 and/or the second selection line SL2 of FIG. 25. The plurality of second local mask patterns 754 may be used to form the plurality of contact pads CP in the connection area PAR of FIG. 25.

The first and second local mask patterns 752 and 754 may be photoresist patterns formed by using a photolithography process. Alternatively, each of the first and second local mask patterns 752 and 754 may have a stacked structure including a carbon-containing film pattern, a SiON pattern, and a photoresist pattern.

Figure 37A:
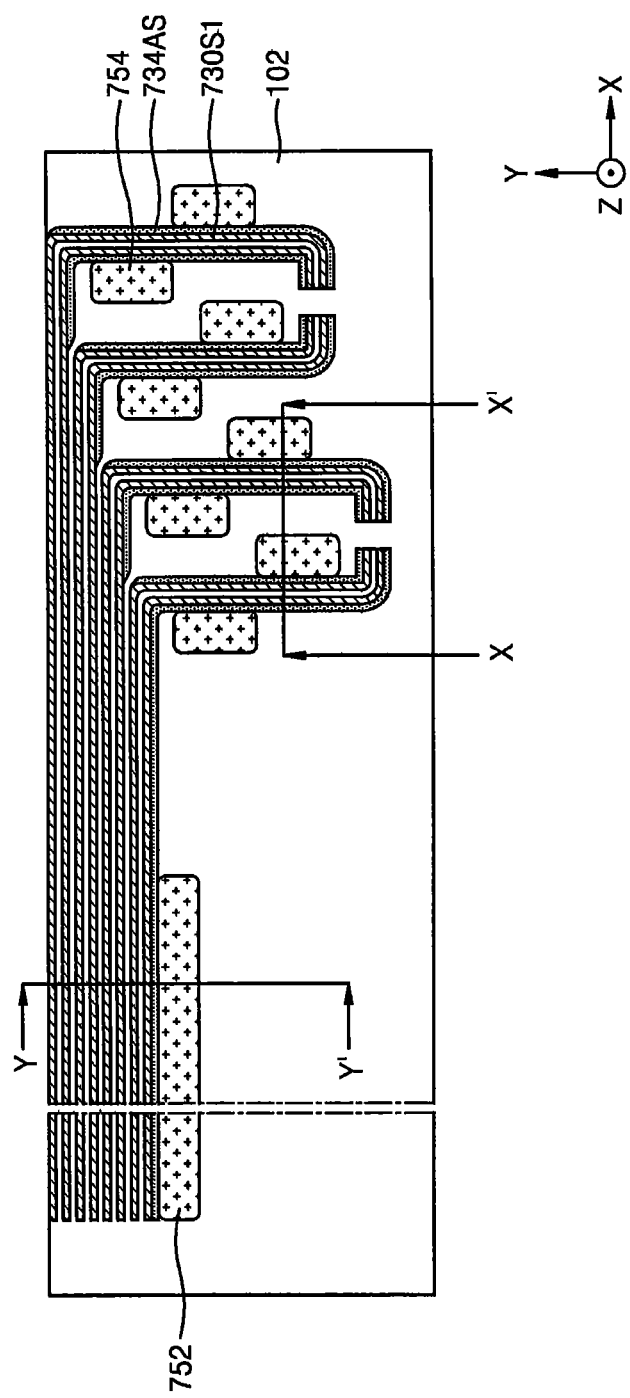
Figure 37B:
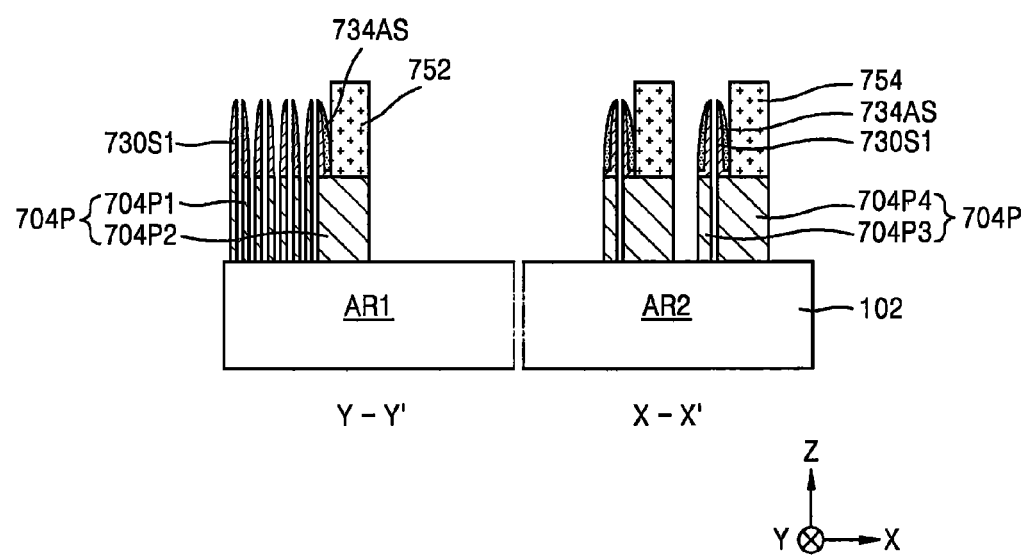

Referring to FIGS. 37A and 37B, a plurality of line patterns 704P that are spaced apart from one another are formed by etching the feature layer 704 by using the plurality of second spacers 730S1, the plurality of additional spacers 734AS, and the first and second local mask patterns 752 and 754 in the first area AR1 and the second area AR2 as etching masks.

In the first area AR1, the plurality of line patterns 704P include a plurality of inner line patterns 704P1 each having a width of about 1 F and an outer line pattern 704P2 having a width that is greater than the width of each of the plurality of inner line patterns 704P1 and facing a relatively wide space. In the second area AR2, the plurality of line patterns 704P include a plurality of branch line patterns 704P3 each having a width greater than 1 F and a plurality of connection line patterns 704P4 each having a width greater than the width of each of the plurality of branch line patterns 704P3.

The plurality of line patterns 704P may constitute the plurality of conductive lines L01, L02, . . . , and L32, the first selection line SL1, and the second selection line SL2 of FIG. 5.

Although the method of manufacturing the semiconductor device 700 has been described with reference to FIGS. 26A through 37B, the inventive concept is not limited thereto and various modifications and changes may be made therein. For example, when the additional spacer layer 734A of FIGS. 32A and 32B is to be formed, the additional spacer layer 734A may be formed after the etch-back process is performed on the second spacer layer 730, like in a process of forming the additional spacer layer 134B as illustrated in FIGS. 10A through 11B.

In the method of manufacturing the semiconductor device 700 of FIGS. 26A through 37B, the plurality of line patterns 704P having widths that vary according to positions may be formed in the first area AR1 in which a pattern having a relatively small width is formed and in the second area AR2 in which a pattern having a relatively large width is formed. Accordingly, when a plurality of fine patterns that are repeatedly formed at fine pitches beyond a resolution limit of photolithography and have fine widths are to be formed, a plurality of fine patterns having varying widths may be easily formed.

Figure 38A:
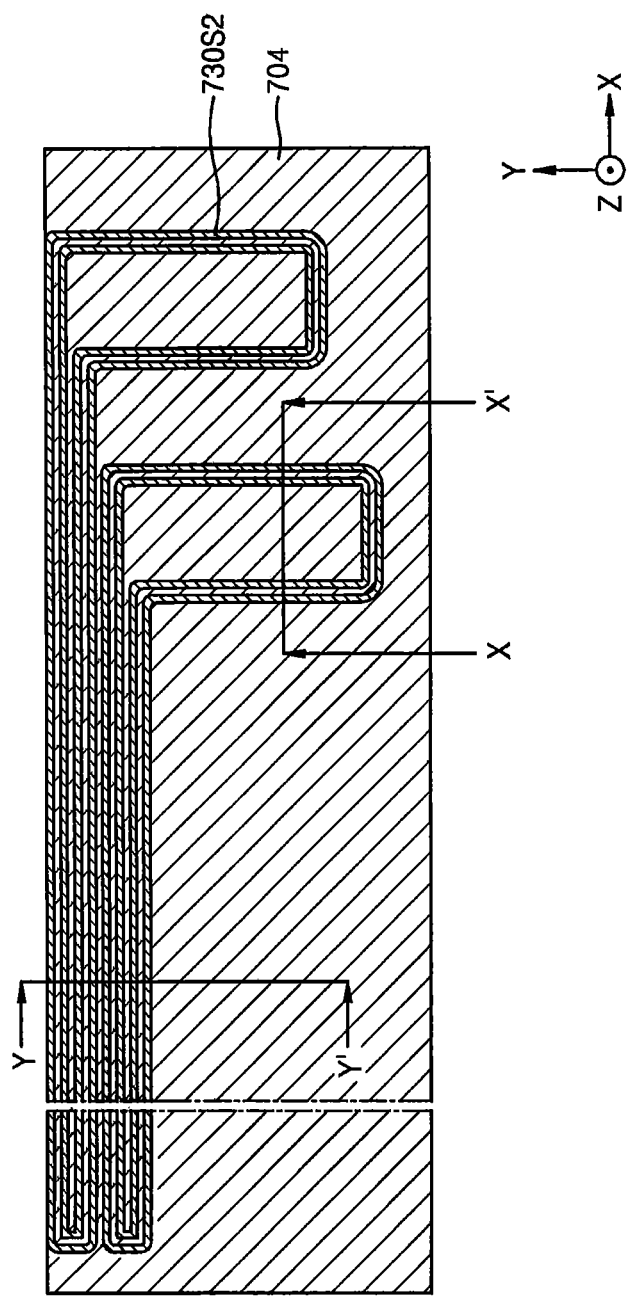
FIGS. 38A, 39A and 40A are plan views illustrating a method of manufacturing the semiconductor device of FIG. 25 according to some embodiments of the inventive concept.
Figure 38B:
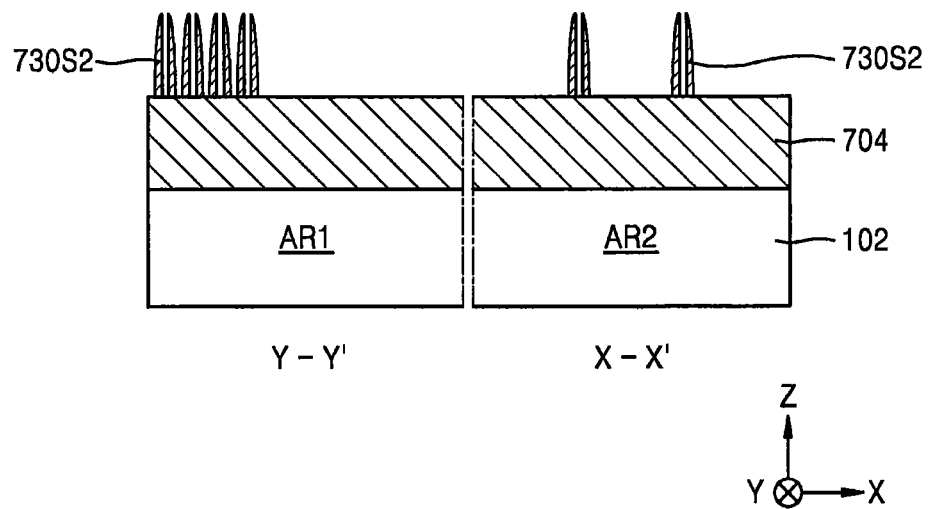
FIGS. 38B, 39B and 40B are cross-sectional views taken along the lines X-X' and Y-Y' of FIGS. 38A, 39A and 40A.
Figure 39A:
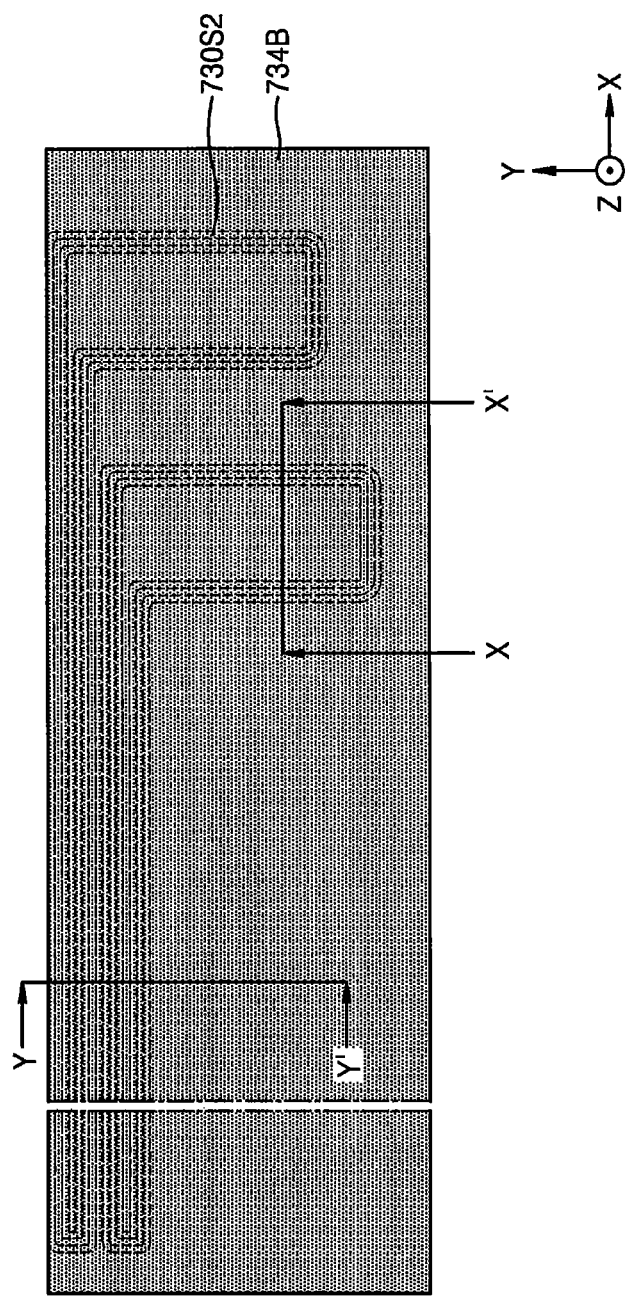
Figure 39B:
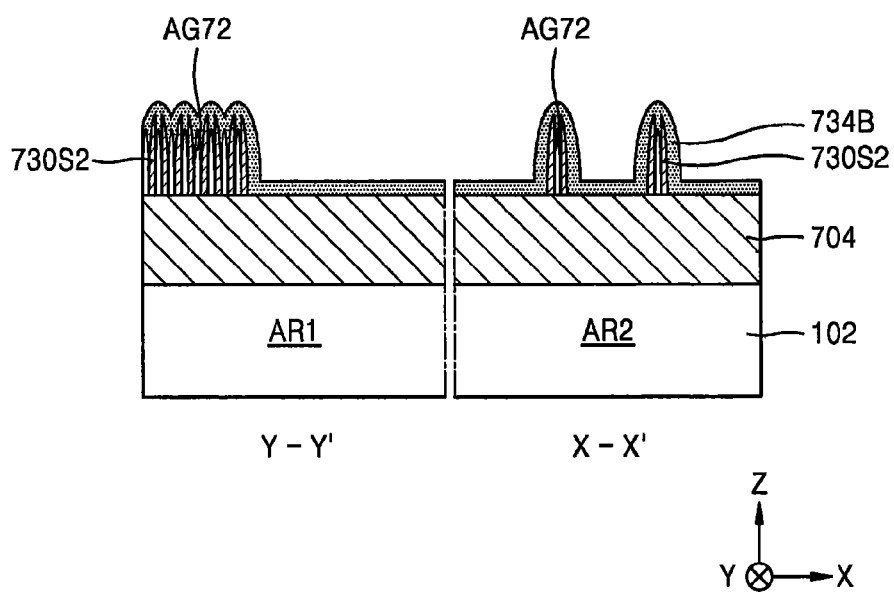
Figure 40A:
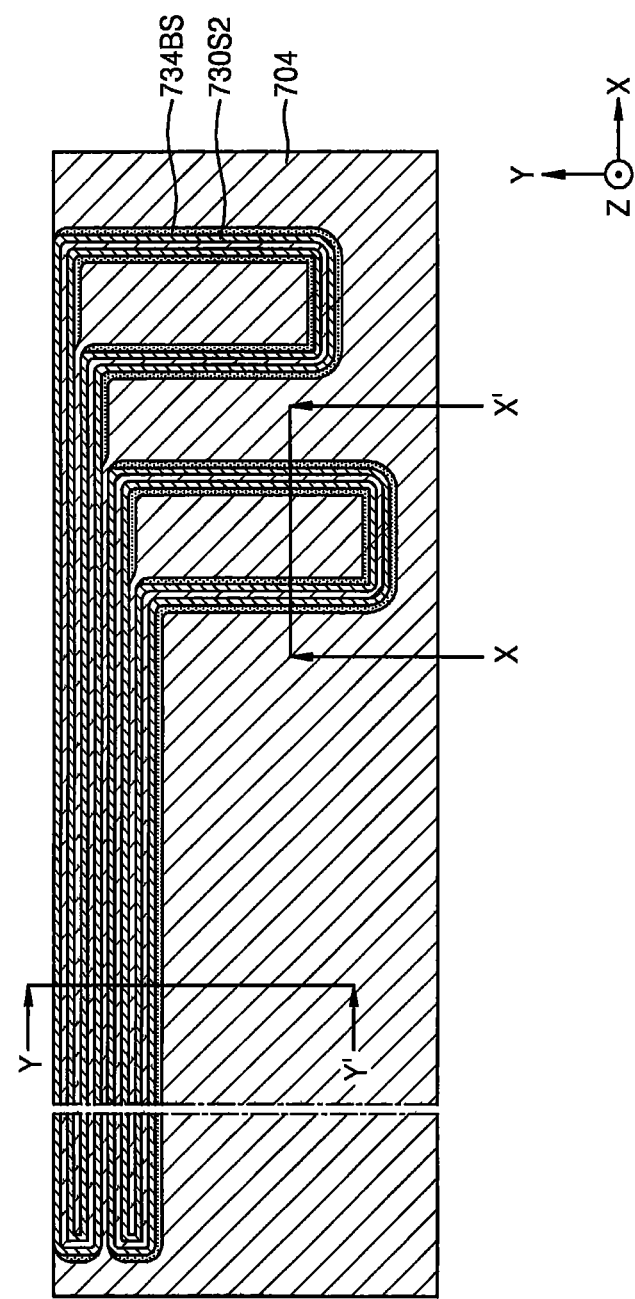
Figure 40B:
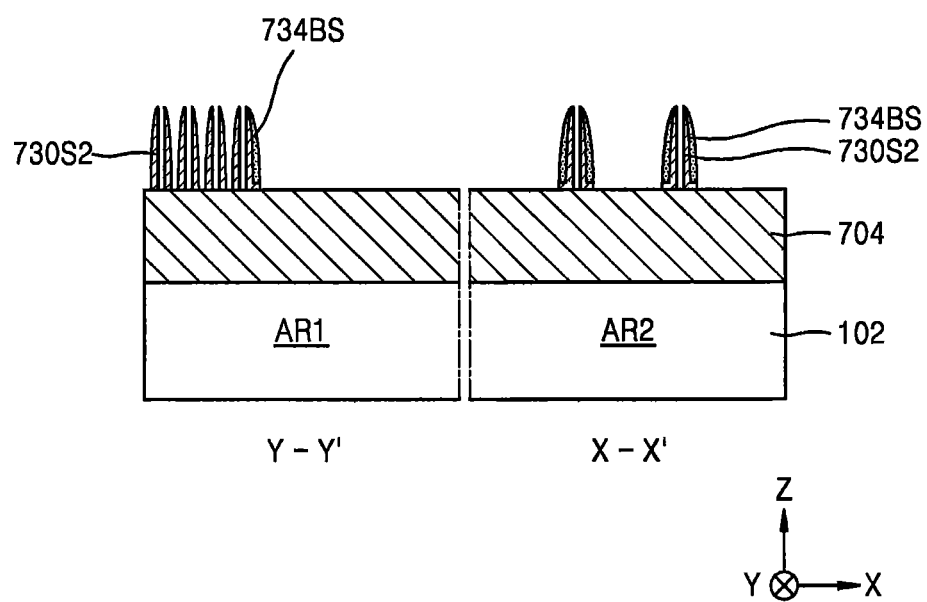

FIGS. 38A, 39A and 40A are plan views illustrating a method of manufacturing the semiconductor device 700 according to some embodiments of the inventive concept, and FIGS. 38B, 39B and 40B are cross-sectional views taken along the lines X-X' and Y-Y' of FIGS. 38A, 39A and 40A.

Referring to FIGS. 38A and 38B, after the second spacer layer 730 that covers exposed surfaces of the plurality of second structures 712 and an exposed surface of the feature layer 704 with a uniform thickness is formed by using substantially the same process as that described with reference to FIGS. 26A through 31B, a plurality of second spacers 730S2 that cover both side walls of the plurality of second structures 712 are formed by performing an etch-back process on the second spacer layer 730 until top surfaces of the plurality of second structures 712 are exposed.

Next, portions of the top surface of the feature layer 704 that are covered by the plurality of second structures 712 are exposed by removing the plurality of second structures 712.

Referring to FIGS. 39A and 39B, an additional spacer layer 734B is formed on the plurality of second spacers 730S2 in the first area AR1 and the second area AR2 by using a process that is similar to a process of forming the additional spacer layer 134C of FIGS. 15A and 15B.

After the additional spacer layer 734B is formed, a plurality of air gaps AG72 that are defined by the plurality of second spacers 730S2 and the additional spacer layer 734B may be formed in the first area AR1 and the second area AR2. In the first area AR1, the plurality of air gaps AG72 may be formed so that two air gaps AG72 are disposed on both sides of one second spacer 730S2. In the first area AR1 and the second area AR2, side walls of the second spacers 730S2 that face a relatively wide space may be covered by the additional spacer layer 734B.

Referring to FIGS. 40A and 40B, a single spacer formed of a single film of each of the second spacers 730S2, and a double spacer having a double-layer structure including the second spacer 730S2 and the additional spacer 734BS that covers only one side wall of the second spacer 730S2 are formed in the first area AR1, and a double spacer having a double-layer structure including the second spacer 730S2 and the additional spacer 734BS that covers only one side wall of the second spacer 730S2 is formed in the second area AR2, by performing etch-back of the additional spacer layer 734B.

Next, a plurality of line patterns corresponding to combined planar shapes of the plurality of second spacers 730S2 and the plurality of additional spacers 734BS may be formed by etching the feature layer 704 by using the plurality of second spacers 730S2 and the plurality of additional spacers 734BS as etching masks.

Methods of manufacturing the semiconductor devices according to example embodiments that are illustrated in FIGS. 1A through 40B, a plurality of fine patterns having widths that vary according to positions may be formed in the first area AR1 in which a pattern has a relatively small width and the second area AR2 in which a pattern has a relatively large width, or in the high-density area A and the low-density area B. Accordingly, when a plurality of fine patterns that are repeatedly formed at fine pitches beyond a resolution limit of photolithography and have fine widths are to be formed, a plurality of fine patterns having widths that vary according to positions may be easily formed.

FIGS. 41A through 41F are cross-sectional views illustrating a method of manufacturing the semiconductor device 700 according to some embodiments of the inventive concept.

The method of manufacturing the semiconductor device 700 according to some embodiments will now be explained with reference to FIGS. 41A through 41F.

Figure 41A:
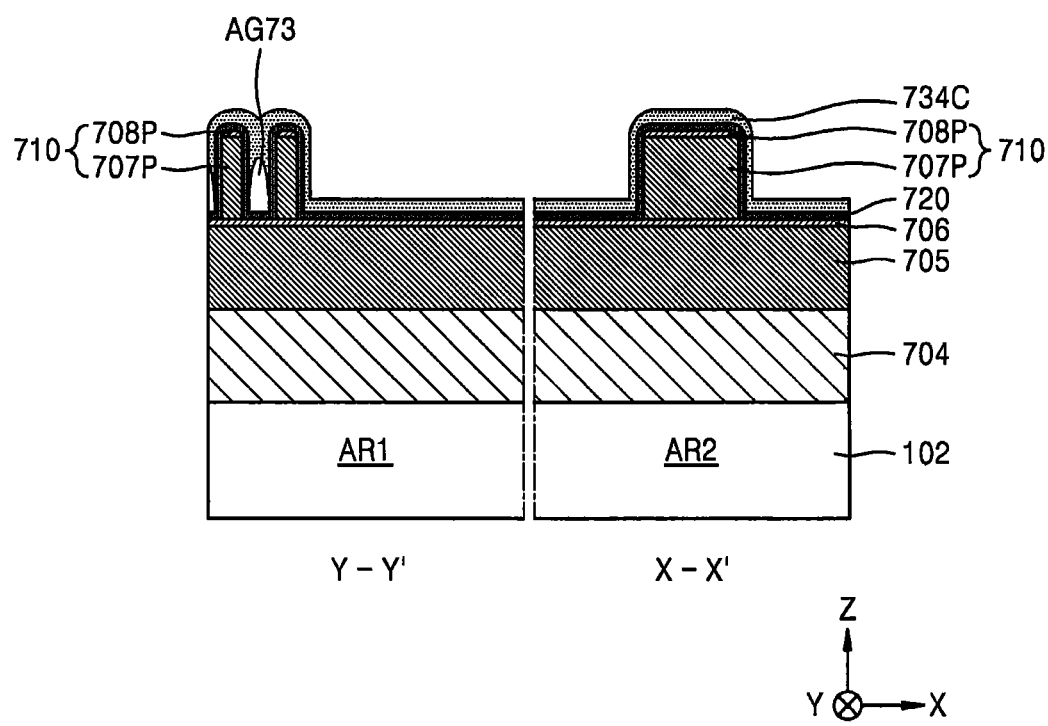
FIGS. 41A through 41F are cross-sectional views illustrating a method of manufacturing a semiconductor device according to some embodiments of the inventive concept.

Referring to FIG. 41A, after the first spacer layer 720 that covers exposed surfaces of the plurality of first structures 710 and an exposed surface of the second hardmask layer 706 with a uniform thickness is formed by using substantially the same process as a process of forming the additional spacer layer 734A of FIGS. 26A through 28B, an additional spacer layer 734C is formed on the first spacer layer 720 by using a process that is similar to that described with reference to FIGS. 32A and 32B.

After the additional spacer layer 734C is formed, a plurality of air gaps AG73 that are defined by the first space layer 720 and the additional spacer layer 734C may be formed between the plurality of first structures 710 in the first area AR1.

Figure 41B:
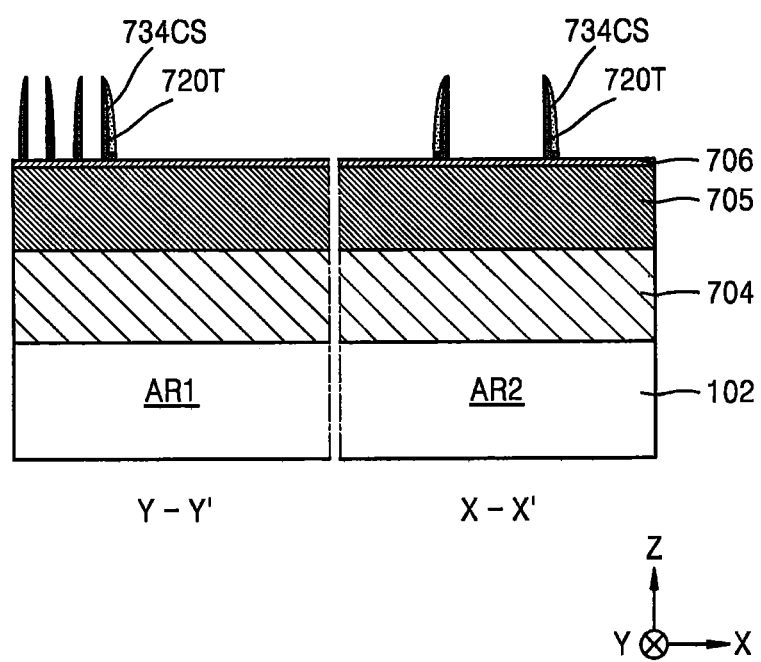

Referring to FIG. 41B, by using a process that is similar to that described with reference to FIGS. 33A and 33B, a plurality of first spacers 720T, and a plurality of additional spacers 734CS that cover side walls of the plurality of first spacers 720T that face a relatively wide space are formed by performing an etch-back process on the additional spacer layer 734C and the first spacer layer 720 of a resultant structure of FIG. 41A.

Next, portions of a top surface of the second hardmask layer 706 that are covered by the plurality of first structures 710 are exposed by removing the plurality of first structures 710 that are exposed between the plurality of first spacers 720T in the first area AR1 and the second area AR2.

Figure 41C:
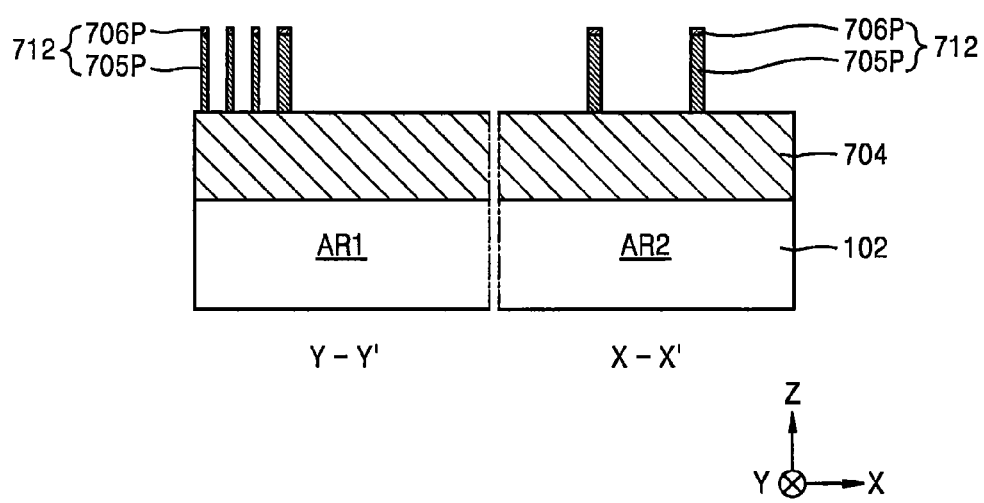

Referring to FIG. 41C, the plurality of second structures 712 including the plurality of second hardmask patterns 706P and the plurality of first hardmask patterns 705P are formed by sequentially etching the second hardmask layer 706 and the first hardmask layer 705 by using the plurality of first spacers 720T and the plurality of additional spacers 734CS in the first area AR1 and the second area AR2 as etching masks.

While and after the second hardmask layer 706 and the first hardmask layer 705 are sequentially etched, the plurality of first spacers 720T may be consumed or removed. While the first hardmask layer 705 is etched, the plurality of second hardmask patterns 706P may be used as etching masks.

Figure 41D:
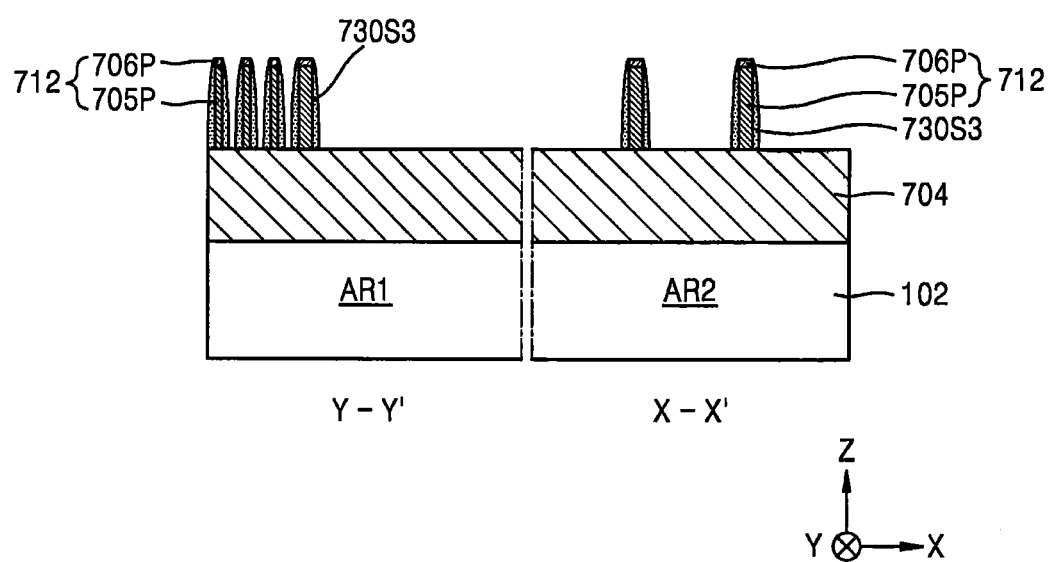

Referring to FIG. 41D, after the second spacer layer 730 that covers exposed surfaces of the plurality of second structures 712 and an exposed surface of the feature layer 704 with a uniform thickness is formed by using substantially the same process as that described with reference to FIGS. 31A and 31B, a plurality of second spacers 730S3 that cover both side walls of the plurality of second structures 712 are formed by performing an etch-back process on the second spacer layer 730 until top surfaces of the plurality of second structures 712 are exposed.

The plurality of second spacers 730S3 may be formed to cover the both side walls of the plurality of second structures 712 with a thickness of about 1 F.

Figure 41E:
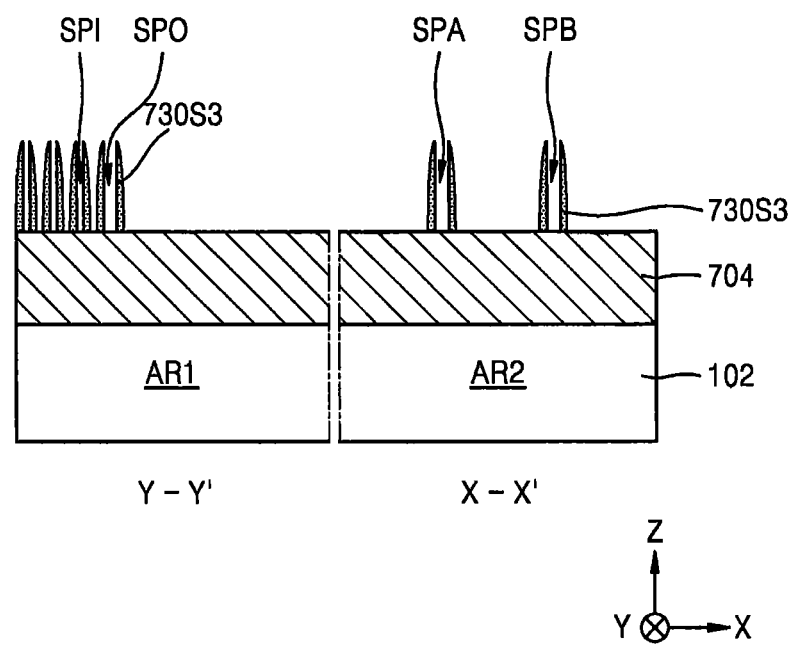

Referring to FIG. 41E, portions of a top surface of the feature layer 704 that are covered by the plurality of second structures 712 are exposed by removing the plurality of second structures 712 from a resultant structure of FIG. 41D.

After the plurality of second structures 712 are removed, an outermost gap SPO that is a first outer gap among gaps between the plurality of second spacers 730S3 in the first area AR1 may be greater in the first direction (X direction) than inner gaps SPI that are inner than the outermost gap SPO. Also, in the second area AR2, gaps SPA and SPB between the plurality of second spacers 730S3 may be greater in the first direction (X direction) than the inner gaps SPI that are in the first area AR1.

Figure 41F:
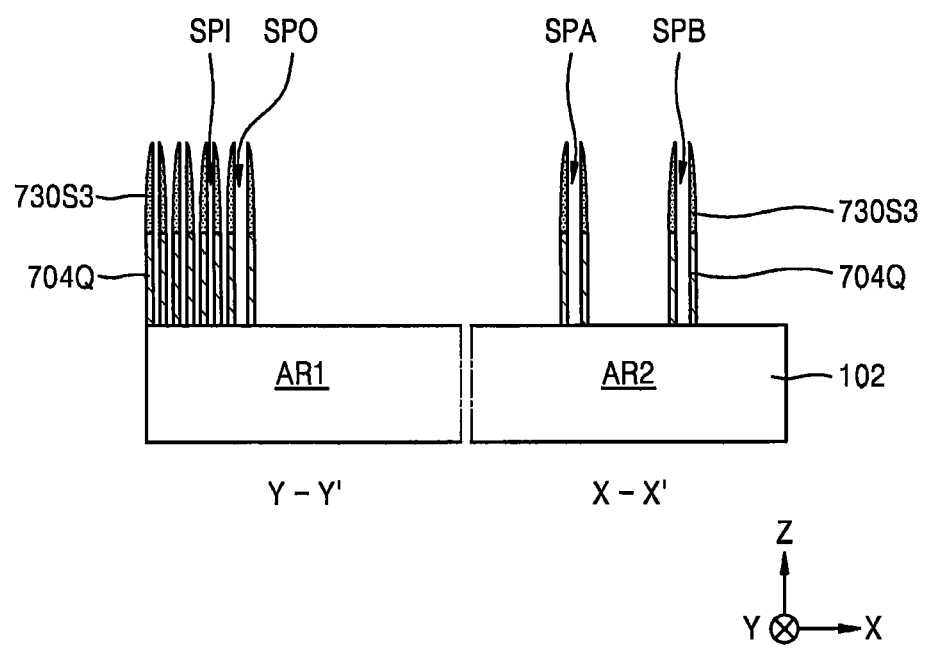

Referring to FIG. 41F, a plurality of line patterns 704Q that are spaced apart from one another are formed by etching the feature layer 704 by using the plurality of second spacers 730S3 as etching masks.

In the first area AR1, gaps between the plurality of line patterns 704Q may vary according to positions. For example, like the plurality of second spacers 730S3 of FIG. 41F, an outermost gap that is a first outer gap among gaps between the plurality of line patterns 704Q may be greater in the first direction (X direction) than inner gaps. Also, in the second area AR2, gaps between the plurality of line patterns 704Q may be greater in the first direction (X direction) than the inner gaps that are in the first area AR1.

In the method of manufacturing the semiconductor device 700 of FIGS. 41A through 41F, a plurality of fine patterns that are spaced apart from one another with gaps having widths that vary according to positions therebetween are formed in the first area AR1 in which a pattern has a relatively small width and in the second area AR2 in which a pattern has a relatively large width. Accordingly, when a plurality of fine patterns that are repeatedly formed at fine pitches beyond a resolution limit of photolithography and have fine widths are to be formed, a plurality of fine patterns that are spaced apart from one another with gaps that vary according to positions therebetween may be easily formed.

FIGS. 42A through 42D are cross-sectional views illustrating a method of manufacturing the semiconductor device 700 according to some embodiments of the inventive concept.

Figure 42A:
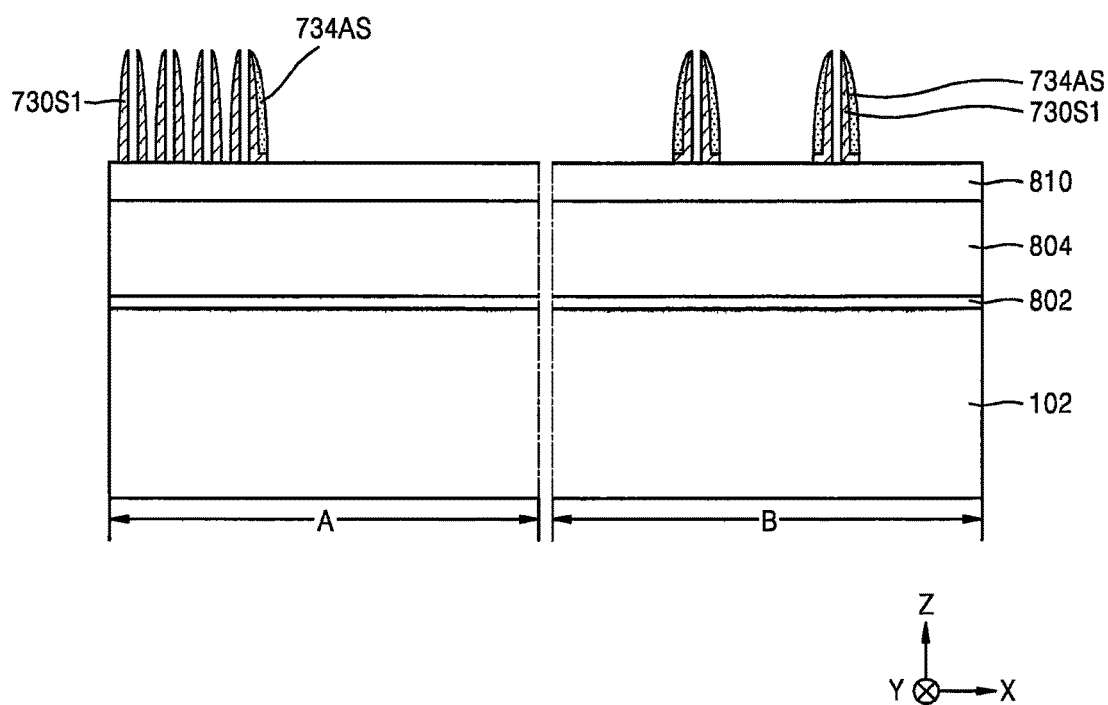
FIGS. 42A through 42D are cross-sectional views illustrating a method of manufacturing a semiconductor device according to some embodiments of the inventive concept.

Referring to FIG. 42A, a pad oxide film 802 is formed on the first area A and the second area B of the substrate 102.

The first area A may be a cell array region in which unit memory devices are formed. For example, the memory cell area CAR of FIG. 25 may be formed in the first area A. The second area B may be a peripheral circuit region or a core region in which peripheral circuits for driving the unit memory devices formed in the first area A are formed. Alternatively, the second area B may be a part of the cell array region in which a pattern having a relatively large width is formed.

Next, a hardmask layer 804 and a buffer mask layer 810 are sequentially formed on the pad oxide film 802.

The hardmask layer 804 may be a single layer. In some embodiments, the hardmask layer 804 may have a multi-layer structure in which two or more hardmask layers having different etching characteristics under a predetermined etching condition are stacked. For example, the hardmask layer 804 may be formed of a silicon oxide film.

The buffer mask layer 810 may be formed of, but is not limited to, a polysilicon film. The hardmask layer 804 and the buffer mask layer 810 may be formed of materials having etch selectivities under a predetermined etching condition. In some embodiments, the buffer mask layer 810 may be omitted.

Next, by using a process that is similar to that described with reference to FIGS. 26A through 35B, the plurality of second spacers 730S1 and the plurality of additional spacers 734AS are formed on the buffer mask layer 810.

Figure 42B:
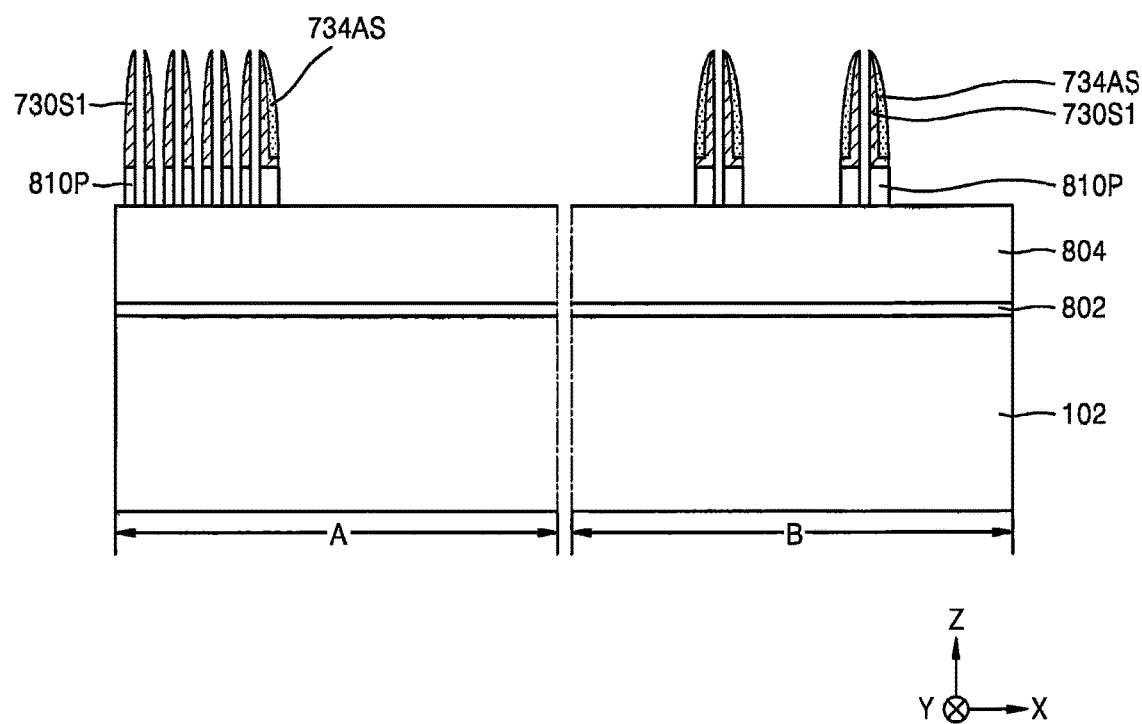

Referring to FIG. 42B, in the first area A and the second area B, a plurality of buffer mask patterns 810P through which the hardmask layer 804 is exposed are formed by etching the buffer mask layer 810 by using the plurality of second spacers 730S1 and the plurality of additional spacers 734AS as etching masks.

Although the plurality of second spacers 730S1 and the plurality of additional spacers 734AS remain on the plurality of buffer mask patterns 810P in FIG. 42B, after the plurality of buffer mask patterns 810P are formed, the plurality of second spacers 730S1 and the plurality of additional spacers 734AS may be partially or entirely consumed or removed.

Figure 42C:
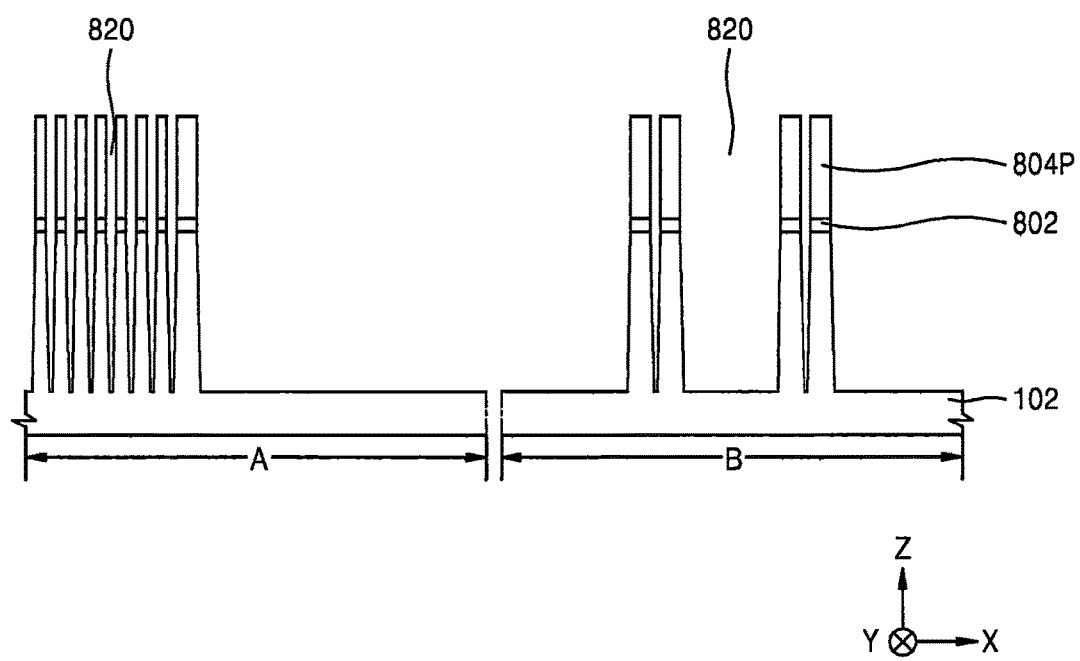

Referring to FIG. 42C, a plurality of hardmask patterns 804P are formed by etching the hardmask layer 804 by using the plurality of buffer mask patterns 810P as etching masks in the first area A and the second area B.

Although not shown in FIG. 42C, after the plurality of hardmask patterns 804P are formed, residual layers of the plurality of buffer mask patterns 810P may remain on the plurality of hardmask patterns 804P.

Next, a plurality of trenches 820 are formed in the substrate 102 by etching the pad oxide film 802 and the substrate 102 by using the plurality of hardmask patterns 804P as etching masks in the first area A and the second area B.

Figure 42D:
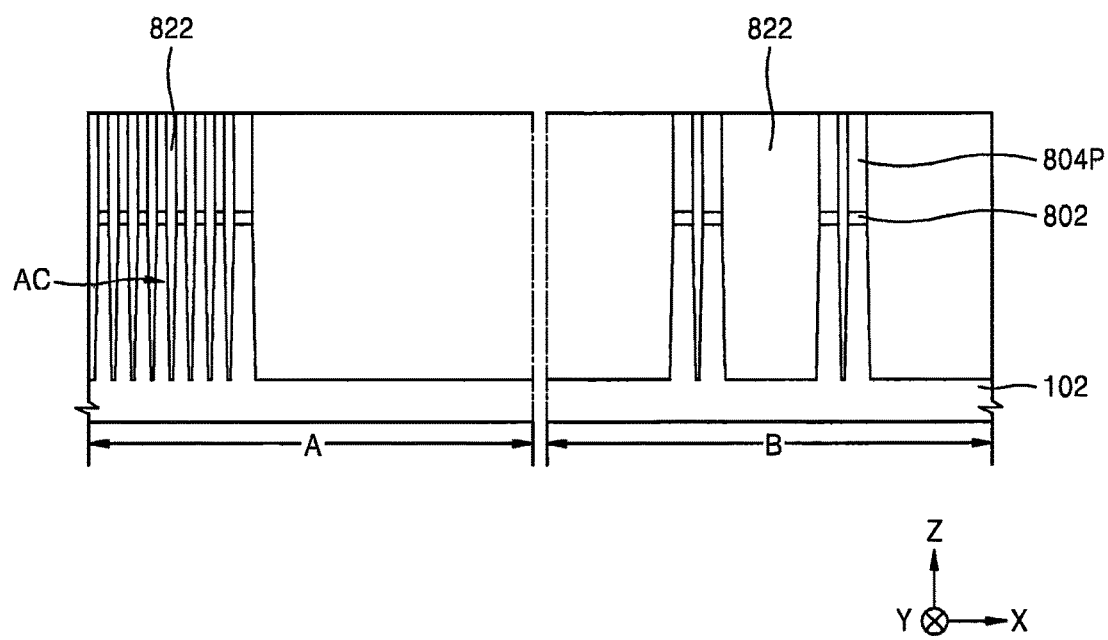

Referring to FIG. 42D, after an insulating material is deposited in the plurality of trenches 820 and on the plurality of hardmask patterns 804P, a plurality of device isolation films 822 are formed by filling an insulating film in the trenches 820 by using a planarization process such as chemical mechanical polishing (CMP) until the plurality of hardmask patterns 804P are exposed.

The plurality of active regions AC are defined on the substrate 102 by the plurality of device isolation films 822.

In some embodiments, the plurality of active regions AC that are defined by the plurality of device isolation films 822 may be the plurality of active regions AC that are included in the semiconductor device 600 of FIG. 24D.

In the method of manufacturing the semiconductor device 700 of FIGS. 42A through 42D, a plurality of active regions having widths that vary according to positions may be defined in the first area A in which a pattern has a relatively small width and in the second area B in which a pattern has a relatively large width. Accordingly, when a plurality of active regions that are repeatedly formed at fine pitches beyond a resolution limit of photolithography and have fine widths are to be formed, a plurality of active regions having widths that vary according to positions may be easily formed.

In FIGS. 42A through 42D, although the active regions AC are defined by using substantially the same process that described with reference to FIGS. 26A through 35B, embodiments are not limited thereto and various modifications and changes may be made therein without departing from the scope of the inventive concept.

Figure 43:
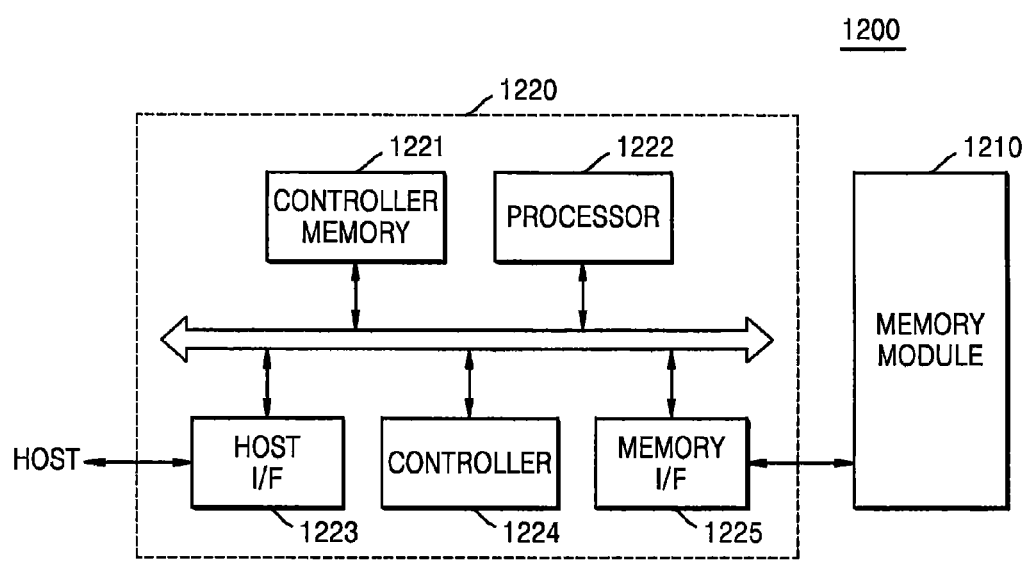
FIG. 43 is a block diagram illustrating a memory card including a semiconductor device according to some embodiments of the inventive concept.

FIG. 43 is a block diagram illustrating a memory card 1200 including a semiconductor device according to some embodiments of the inventive concept.

The memory card 1200 includes a memory controller 1220 that generates a command and an address signal, a memory module 1210, and a flash memory including, for example, one or a plurality of flash memory devices. The memory controller 1220 includes a host interface 1223 that transmits a command and an address signal to a host and receives such signals from the host, and a memory interface 1225 that transmits a command and an address signal back to the memory module 1210 or receives such signals from the memory module 1210. The host interface 1223, a controller 1224, and the memory interface 1225 communicate with a controller memory 1221 such as a static random-access memory (SRAM) and a processor 1222 such as a central processing unit (CPU) via a common bus.

The memory module 1210 receives a command and an address signal from the memory controller 1220, stores data in at least one of memory devices of the memory module 1210 as a response, and searches for the data in the at least one of the memory devices. Each memory device includes a plurality of addressable memory cells, and a decoder that receives a command and an address signal and generates a row signal and a column signal in order to access at least one of the addressable memory cells during a program operation and a read operation.

At least one of elements of the memory card 1200 including the memory controller 1220, that is, electronic devices (e.g., 1221, 1222, 1223, 1224, and 1225) included in the memory controller 1220 and the memory module 1210, may be formed by using a method of manufacturing a semiconductor device according to some embodiments of the inventive concept or a modification thereof without departing the scope of the inventive concept.

Figure 44:
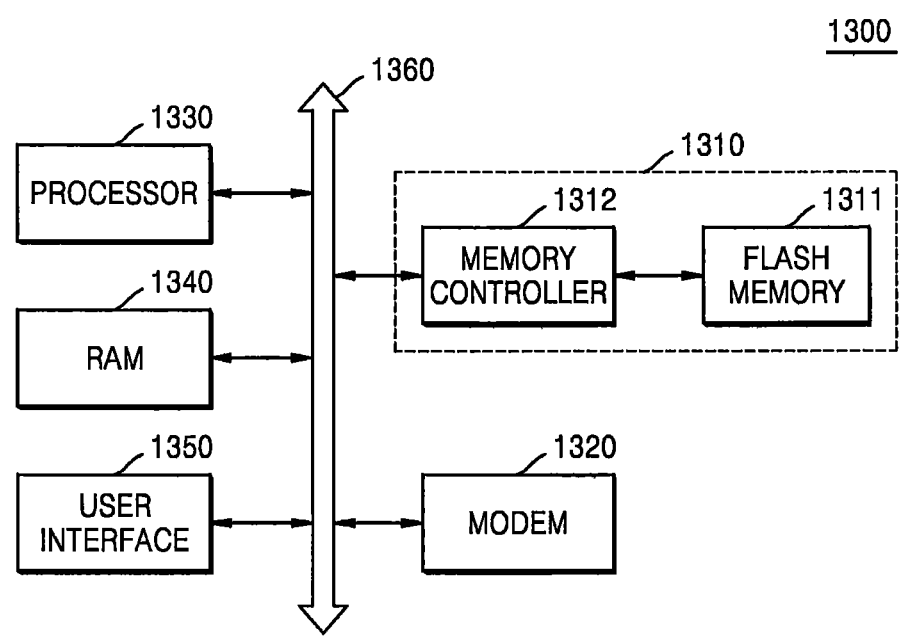
FIG. 44 is a block diagram illustrating a memory system including a memory card including a semiconductor device according some embodiments of the inventive concept.

FIG. 44 is a block diagram illustrating a memory system 1300 including a memory card 1310 including a semiconductor device according to some embodiments of the inventive concept.

The memory system 1300 may include a processor 1330 such as a CPU, a random-access memory 1340, a user interface 1350, and a modem 1320 which communicate with one another via a common bus 1360. Each device transmits a signal to the memory card 1310 and receives a signal from the memory card 1310 via the common bus 1360. The memory card 1310 may include a memory controller 1312 and a flash memory 1311. At least one of elements of the memory system 1300 including the memory card 1310, that is, the processor 1330, the random-access memory 1340, the user interface 1350, and the modem 1320, may be formed by using a method of manufacturing a semiconductor device according to some embodiments of the inventive concept or a modification thereof without departing from the scope of the inventive concept.

The memory system 1300 may be applied to various electronic products. For example, the memory system 1300 may be applied to a solid-state drive (SSD), a CMOS image sensor (CIS), and a computer application chipset.

Memory systems and devices disclosed herein may be packaged in various forms by using, but not limited to, ball grid arrays (BGA), chip scale packages (CSP), plastic leaded chip carrier (PLCC), plastic dual in-line package (PDIP), multi-chip package (MCP), wafer-level fabricated package (WFP), and wafer-level processed stock package (WSP).

Using methods of manufacturing a semiconductor device according to example embodiments of the inventive concept, a plurality of fine patterns having widths or gaps that vary according to positions may be easily formed in an area where a pattern having a relatively small width is formed and an area where a pattern having a relatively large width is formed. Accordingly, when a plurality of fine patterns that are repeatedly formed at fine pitches beyond a resolution limit of photolithography and have fine widths are to be formed, a plurality of fine patterns having widths or gaps that vary according to positions may be easily formed.

While the inventive concept has been particularly shown and described with reference to some embodiments thereof, it will be understood that various changes in form and details may be made therein without departing from the spirit and scope of the inventive concept.

What is claimed is:

1. A semiconductor device comprising:
    a first line pattern comprising a first main line that extends in a first direction and has a first width and a first subline that extends in a second direction from one end of the first main line and has a second width that is greater than the first width; and
    a second line pattern comprising a second main line that is parallel to the first main line and has the first width and a second subline that extends parallel to the first subline from one end of the second main line and has a third width that is greater than the first width,
    wherein the first line pattern comprises a first width changer that is disposed between the first main line and the first subline and whose width increases from the first width to the second width, and the second line pattern comprises a second width changer that is included in the second main line and whose width increases from the first width to the third width in a longitudinal direction of the second main line.

2. The semiconductor device of claim 1, wherein the second width and the third width are substantially equal.

3. The semiconductor device of claim 1, wherein the first width changer and the second width changer face each other.

4. The semiconductor device of claim 1, wherein the second main line comprises a first line portion and a second line portion that are spaced apart from each other with the second width changer therebetween, and the first line portion has the first width and the second line portion has the third width.

5. The semiconductor device of claim 4, wherein the second subline extends from one end of the second line portion in the second direction.

6. The semiconductor device of claim 1, wherein a shortest distance between the first main line and the second main line is smaller than a shortest distance between the first subline and the second subline.

7. The semiconductor device of claim 1, wherein the first line pattern further comprises a first dummy line that extends from one end of the first subline in the first direction away from the first main line and has the second width, and
the second line pattern further comprises a second dummy line that extends from one end of the second subline in the first direction toward the first dummy line and has the third width.

8. The semiconductor device of claim 1, further comprising a third line pattern that extends parallel to the second line pattern and comprises a third main line that is parallel to the second main line and has the first width and a third subline that is parallel to the second subline and has a fourth width that is greater than the first width, wherein the second line pattern is between the third line pattern and the first line pattern, and
wherein a shortest distance between the second main line and the third main line and a shortest distance between the second subline and the third subline are substantially equal.

9. The semiconductor device of claim 8, wherein the third line pattern comprises a third width changer that is disposed between the third main line and the third subline and whose width increases from the first width to the fourth width.

10. A semiconductor device comprising:
a plurality of line patterns that are spaced apart from one another,
wherein each of the plurality of line patterns comprises a main line that extends in a first direction and a subline that extends in a second direction from one end of the main line,
wherein the plurality of line patterns comprise a plurality of sets of line patterns, and each of the plurality of sets of line patterns comprises four line patterns of the plurality of line patterns that are disposed directly adjacent one another,
wherein at least one set of the plurality of sets of line patterns comprises:
a first line pattern comprising a first main line that extends in the first direction and has a first width and a first subline that extends in the second direction from one end of the first main line and has a second width that is greater than the first width; and
a second line pattern comprising a second main line that is parallel to the first main line and has the first width and a second subline that is parallel to the first subline and has a third width that is greater than the first width,
wherein the first line pattern comprises a first width changer that is disposed between the first main line and the first subline and whose width increases from the first width to the second width, and the second line pattern comprises a second width changer that is included in the second main line and whose width increases from the first width to the third width in a longitudinal direction of the second main line.

11. The semiconductor device of claim 10, wherein the at least one set of the plurality of sets of line patterns further comprises:
a third line pattern that extends parallel to the second line pattern and comprises a third main line that is parallel to the second main line and has the first width and a third subline that is parallel to the second subline and has a fourth width that is greater than the first width, wherein the second line pattern is between the third line pattern and the first line pattern; and
a fourth line pattern that extends parallel to the first line pattern and comprises a fourth main line that is parallel to the first main line and has the first width and a fourth subline that is parallel to the first subline and has a fifth width that is greater than the first width, wherein the first line pattern is between the fourth line pattern and the second line pattern.

12. The semiconductor device of claim 11, wherein the third line pattern comprises a third width changer that is disposed between the third main line and the third subline and whose width increases from the first width to the fourth width, and
the fourth main line comprises a fourth width changer that is included in the fourth main line and whose width increases from the first width to the fifth width in a longitudinal direction of the fourth main line.

13. The semiconductor device of claim 10, wherein the at least one set of the plurality of sets of line patterns further comprises:
a third line pattern that extends parallel to the second line pattern and comprises a third main line that is parallel to the second main line and has the first width and a third subline that is parallel to the second subline and has a fourth width that is greater than the first width, wherein the second line pattern is between the third line pattern and the first line pattern; and
a fourth line pattern that extends parallel to the first line pattern and comprises a fourth main line that is parallel to the first main line and has a fifth width that is greater than the first width and a fourth subline that is parallel to the first subline and has a sixth width that is greater than the first width, wherein the first line pattern is between the fourth line pattern and the second line pattern.

14. The semiconductor device of claim 13, wherein the third line pattern comprises a third width changer that is disposed between the third main line and the third subline and whose width increases from the first width to the fourth width, and
wherein the fifth width and the sixth width are substantially equal.

15. A semiconductor device comprising:
a first line pattern comprising a first portion extending in a first direction and a second portion extending in a second direction that is different from the first direction, the first portion having a first width and the second portion having a second width that is greater than the first width; and a second line pattern comprising a third portion extending in the first direction with the first width, a fourth portion extending in the second direction with a third width that is greater than the first width and a fifth portion between the third portion and the fourth portion, the fifth portion having a change in width from the first width to the third width and an interface between the third portion and the fifth portion being at a location where the first line pattern terminates in the first direction, wherein the first line pattern comprises a sixth portion that is between the first portion and the second portion and has a change in width from the first width to the second width.

16. The semiconductor device of claim 15, wherein the second line pattern comprises an inner sidewall facing the first line pattern and an outer sidewall opposite the inner sidewall, and wherein a portion of the outer sidewall of the second line pattern that extends in the first direction is substantially straight.

17. The semiconductor device of claim 16, wherein a sidewall of the fifth portion comprising the inner sidewall of the second line pattern protrudes from a sidewall of the third portion comprising the inner sidewall of the second line pattern in the second direction.

18. The semiconductor device of claim 15, wherein the first and second line patterns comprise a plurality of line patterns, and wherein the first and second line patterns are disposed directly adjacent each other.

19. The semiconductor device of claim 18, wherein the first line pattern comprises an inner sidewall facing the second line pattern and an outer sidewall opposite the inner sidewall, and wherein a portion of the inner sidewall of the first line pattern that extends in the first direction is straight.

20. The semiconductor device of claim 15, wherein the second width and the third width are substantially equal.

* * * * *